(12) United States Patent
Shibuya et al.

(10) Patent No.: US 10,526,448 B2
(45) Date of Patent: *Jan. 7, 2020

(54) PRECURSOR COMPOSITION, PHOTOSENSITIVE RESIN COMPOSITION, METHOD FOR PRODUCING PRECURSOR COMPOSITION, CURED FILM, METHOD FOR PRODUCING CURED FILM, AND SEMICONDUCTOR DEVICE

(71) Applicant: FUJIFILM Corporation, Tokyo (JP)

(72) Inventors: Akinori Shibuya, Haibara-gun (JP); Yu Iwai, Haibara-gun (JP); Takeshi Kawabata, Haibara-gun (JP); Ichiro Koyama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/852,992

(22) Filed: Dec. 22, 2017

(65) Prior Publication Data
US 2018/0118887 A1 May 3, 2018

Related U.S. Application Data

(63) Continuation of application No. PCT/JP2016/069274, filed on Jun. 29, 2016.

(30) Foreign Application Priority Data

Jun. 30, 2015 (JP) .................. 2015-132079

(51) Int. Cl.
*C08G 73/10* (2006.01)
*C08G 73/22* (2006.01)
(Continued)

(52) U.S. Cl.
CPC ............ *C08G 73/10* (2013.01); *C08F 110/02* (2013.01); *C08F 136/00* (2013.01);
(Continued)

(58) Field of Classification Search
CPC .... C08G 73/10; C08G 73/22; C08G 73/1071; C08G 73/1032; C08F 110/02;
(Continued)

(56) References Cited

U.S. PATENT DOCUMENTS

2004/0041129 A1* 3/2004 Itatani ................ C08L 79/08
252/500

FOREIGN PATENT DOCUMENTS

JP H09-59379 A 3/1997
JP H11-310769 A 11/1999
(Continued)

OTHER PUBLICATIONS

Office Action dated Nov. 29, 2018 from the Korean Intellectual Property Office in counterpart KR Application No. 10-2017-7037212.
(Continued)

*Primary Examiner* — Shane Fang
(74) *Attorney, Agent, or Firm* — Sughrue Mion, PLLC

(57) ABSTRACT

Provided are photosensitive resin compositions having a wide exposure latitude, a precursor composition for providing such a photosensitive resin composition, a method for producing a precursor composition, a cured film, a method for producing a cured film; and a semiconductor device. The precursor composition is a precursor composition containing at least one kind of heterocycle-containing polymer precursor, in which the heterocycle-containing polymer precursor is selected from a polyimide precursor and a polybenzoxazole precursor; and the dispersity which is a weight-average molecular weight/a number-average molecular weight of the heterocycle-containing polymer precursor is 2.5 or more.

17 Claims, 1 Drawing Sheet

(51) Int. Cl.
*C08F 110/02* (2006.01)
*C08F 136/00* (2006.01)
*C08F 290/14* (2006.01)
*G03F 7/031* (2006.01)
*G03F 7/038* (2006.01)
*H01L 21/02* (2006.01)
*G03F 7/023* (2006.01)
*G03F 7/037* (2006.01)
*C08G 73/14* (2006.01)

(52) U.S. Cl.
CPC ........ *C08F 290/145* (2013.01); *C08G 73/105* (2013.01); *C08G 73/1007* (2013.01); *C08G 73/1042* (2013.01); *C08G 73/14* (2013.01); *C08G 73/22* (2013.01); *G03F 7/0233* (2013.01); *G03F 7/031* (2013.01); *G03F 7/037* (2013.01); *G03F 7/0387* (2013.01); *G03F 7/0388* (2013.01); *H01L 21/02118* (2013.01); *C08F 2500/06* (2013.01)

(58) Field of Classification Search
CPC ................ C08F 136/00; C08F 290/145; C08F 2500/06; G03F 7/031; G03F 7/0387; H01L 21/02118
See application file for complete search history.

(56) References Cited

FOREIGN PATENT DOCUMENTS

| | | |
|---|---|---|
| JP | 2002-122991 A | 4/2002 |
| JP | 2004-155911 A | 6/2004 |
| JP | 2007-206423 A | 8/2007 |
| JP | 2009-175358 A | 8/2009 |
| JP | 2009-258433 A | 11/2009 |
| WO | 2014/097992 A1 | 6/2014 |

OTHER PUBLICATIONS

Office Action dated Dec. 11, 2018 from the Japanese Patent Office in counterpart JP Application No. 2017-526399.
Written Opinion of the International Searching Authority dated Aug. 23, 2016, in counterpart International Application No. PCT/JP2016/069274.
International Preliminary Report on Patentability dated Jan. 2, 2018, in counterpart International Application No. PCT/JP2016/069274.
International Search Report for PCT/JP2016/069274 dated Aug. 23, 2016 [PCT/ISA/210].
Office Action dated Jul. 26, 2019, from The State Intellectual Property Office of the P.R. of China in counterpart Chinese Application No. 201680037218.1.

* cited by examiner

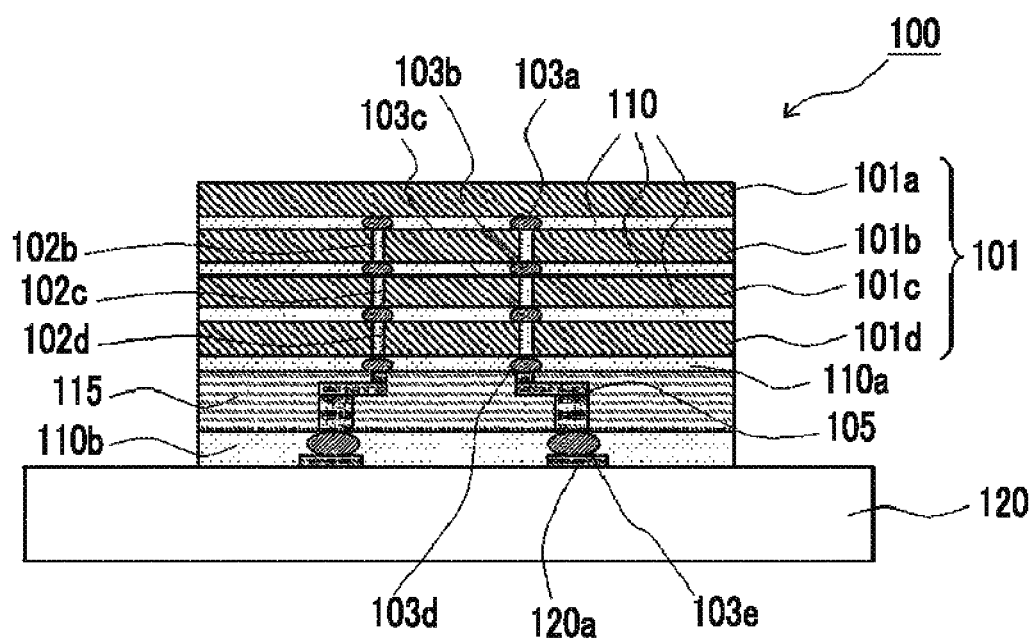

PRECURSOR COMPOSITION, PHOTOSENSITIVE RESIN COMPOSITION, METHOD FOR PRODUCING PRECURSOR COMPOSITION, CURED FILM, METHOD FOR PRODUCING CURED FILM, AND SEMICONDUCTOR DEVICE

CROSS-REFERENCE TO RELATED APPLICATIONS

This application is a Continuation of PCT International Application No. PCT/JP2016/069274 filed on Jun. 29, 2016, which claims priority under 35 U.S.C § 119(a) to Japanese Patent Application No. 2015-132079 filed on Jun. 30, 2015. Each of the above application(s) is hereby expressly incorporated by reference, in its entirety, into the present application

BACKGROUND OF THE INVENTION

The present invention relates to a precursor composition, a photosensitive resin composition, a method for producing a precursor composition, a cured film, a method for producing a cured film, and a semiconductor device. In particular, the present invention relates to a precursor composition including a heterocycle-containing polymer precursor selected from a polyimide precursor and a polybenzoxazole precursor, and the like.

DESCRIPTION OF THE RELATED ART

Thermosetting resins which are cyclized and cured, such as a polyimide and a polybenzoxazole, have excellent heat resistance and insulating properties, and are therefore used for an insulating layer or the like of semiconductor devices.

Furthermore, a polyimide and the like have low solubility in a solvent, and are therefore used in a precursor state (heterocycle-containing polymer precursor) before being subjected to a cyclization reaction, applied onto a substrate or the like, and then heated to cyclize the heterocycle-containing polymer precursor, thereby forming a cured film.

As a photosensitive resin composition formed using such the heterocycle-containing polymer precursor, a photosensitive resin composition including 100 parts by mass of (a) a polyamidic ester having a repeating unit represented by General Formula (1), 1 to 20 parts by mass of (b) a photopolymerization initiator, and 30 to 600 parts by mass of (c) an organic solvent, in which the content of N-ethyl-2-pyrrolidone and/or 1,3-dimethyl-2-imidazolidinone included in the organic solvent is 50% by mass or more with respect to the total amount of (c) the organic solvent is disclosed in JP2007-206423A.

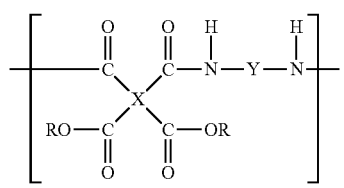

(1)

(In General Formula (1), X represents at least one group selected from the group consisting of a tetravalent organic group having 6 to 32 carbon atoms, Y represents a divalent aromatic group having 4 to 30 carbon atoms, an aliphatic group, and a divalent silicon-containing group having 2 to 50 silicon atoms, and R represents a monovalent group having an olefinic double bond.)

In addition, WO2014/097992A discloses a photosensitive resin composition including (a1) an aromatic amide resin which is soluble in propylene glycol monomethyl ether acetate, and has an amido group, a trifluoromethyl group, and an aromatic ring, (b) a photoconductive agent, and (c) a solvent, in which the viscosity at a concentration of the solid content is 20% by weight, and the viscosity at 25° C. is 1 to 15 cp. 1 cp is equal to $1\times10^{-3}$ Pa·s.

SUMMARY OF THE INVENTION

Here, in a case of a use in an interlayer insulting film for a re-wiring layer of a semiconductor, and the like, there is a demand of a photosensitive resin composition having a wide proper exposure range of the resolution of the photosensitive resin composition, that is a photosensitive resin composition having a wide exposure latitude. However, both of the photosensitive resin compositions described in JP2007-206423A and WO2014/097992A have narrow exposure latitudes.

The present invention aims to solve such the problems, and thus, has an object to provide a photosensitive resin composition having a wide exposure latitude. In particular, the present invention relates to a precursor composition for providing a photosensitive resin composition having a wide exposure latitude. The present invention also relates to a method for producing a precursor composition, a cured film, a method for producing a cured film, and a semiconductor device.

Regarding the problems, the present inventors have conducted extensive studies, and as a result, have found that an exposure latitude can be widened by adopting and using a heterocycle-containing polymer precursor having a high dispersity as the photosensitive resin composition, thereby completing the present invention. Specifically, the problems have been solved by the following mean <1>, and preferably <2> to <19>.

<1> A precursor composition comprising:

at least one kind of heterocycle-containing polymer precursor, in which the heterocycle-containing polymer precursor is selected from a polyimide precursor and a polybenzoxazole precursor, and the dispersity, which is a weight-average molecular weight/a number-average molecular weight, of the heterocycle-containing polymer precursor is 2.5 or more.

<2> The precursor composition as described in <1>, in which the heterocycle-containing polymer precursor has a polymerizable unsaturated group.

<3> The precursor composition as described in <1> or <2>, in which the dispersity is 2.8 or more.

<4> The precursor composition as described in any one of <1> to <3>, wherein the heterocycle-containing polymer precursor contains two or more kinds of heterocycle-containing polymer precursors which are different in weight-average molecular weight and at least one kind of repeating units constituting the heterocycle-containing polymer precursor to each other.

<5> The precursor composition as described in any one of <1> to <4>,
in which the at least one kind of heterocycle-containing polymer precursor is a precursor having a repeating unit represented by General Formula (1-1),

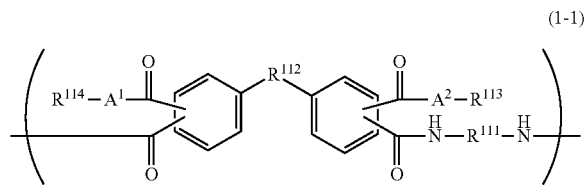

(1-1)

in General Formula (1-1), $A^1$ and $A^2$ each independently represent an oxygen atom or NH, $R^{111}$ represents a divalent organic group, $R^{112}$ represents a single bond or a divalent group, and $R^{113}$ and $R^{114}$ each independently represent a hydrogen atom or a monovalent organic group.

<6> The precursor composition as described in <5>,
in which at least one of $A^1$ or $A^2$ is an oxygen atom.

<7> The precursor composition as described in <5> or <6>,
in which $R^{112}$ is a single bond, or a group selected from a hydrocarbon group having 1 to 10 carbon atoms, which may be substituted with a fluorine atom, —O—, —C(=O)—, —S—, —SO$_2$—, —NHCO—, and a combination thereof.

<8> A photosensitive resin composition comprising:
the precursor composition as described in any one of <1> to <7>; and
a photoradical polymerization initiator.

<9> A photosensitive resin composition comprising:
the precursor composition as described in any one of <1> to <7>; and
a photoacid generator.

<10> The photosensitive resin composition as described in <8> or <9>, further comprising:
a curable compound.

<11> The photosensitive resin composition as described in <10>,
in which the curable compound includes a compound having an ethylenically unsaturated bond.

<12> The photosensitive resin composition as described in <10>,
in which the curable compound is a compound having two or more ethylenically unsaturated groups.

<13> The photosensitive resin composition as described in any one of <8> to <12>, which is used for forming an interlayer insulating film for a re-wiring layer.

<14> A method for producing the precursor composition as described in any one of <1> to <7>, comprising:
using two or more kinds of heterocycle-containing polymer precursors having different weight-average molecular weights as the heterocycle-containing polymer precursor,
in which the heterocycle-containing polymer precursor is selected from a polyimide precursor and a polybenzoxazole precursor.

<15> A cured film formed by curing the precursor composition as described in any one of <1> to <7> or the photosensitive resin composition as described in any one of <8> to <13>.

<16> The cured film as described in <15>, which is an interlayer insulating film for a re-wiring layer.

<17> A method for producing a cured film, comprising:
using the precursor composition as described in any one of <1> to <7> or the photosensitive resin composition as described in any one of <8> to <13>.

<18> The method for producing a cured film as described in <17>, comprising:
a step of applying the precursor composition or the photosensitive resin composition onto a substrate; and
a step of curing the precursor composition or the photosensitive resin composition applied onto the substrate.

<19> A semiconductor device comprising:
the cured film as described in <15> or <16> or a cured film produced by the production method as described in <17> or <18>.

According to the present invention, it is possible to provide a photosensitive resin composition having a wide exposure latitude, a precursor composition for providing such the photosensitive resin composition, a method for producing a precursor composition, a cured film, a method for producing a cured film, and a semiconductor device.

BRIEF DESCRIPTION OF THE DRAWINGS

The FIGURE is a schematic diagram showing the configuration of an embodiment of a semiconductor device.

DESCRIPTION OF THE PREFERRED EMBODIMENTS

Description of the constitutive components in the present invention which will be described below has been made on the basis of representative embodiments of the present invention in some cases, but the present invention is not limited to such embodiments.

Regarding the expressions of a group (atomic group) in the present specification, the expression with no indication of substitution or unsubstitution includes both a substituted group (atomic group) and an unsubstituted group (atomic group). For example, an "alkyl group" includes not only an alkyl group not having a substituent (unsubstituted alkyl group) but also an alkyl group having a substituent (substituted alkyl group).

In the present specification, "actinic rays" mean, for example, a bright line spectrum of a mercury lamp, far ultraviolet rays typified by excimer laser, extreme ultraviolet rays (EUV light), X-rays, electron beams, or the like. Further, in the present invention, "light" means actinic rays or radiation. Unless otherwise indicated, "exposure" includes not only exposure to a mercury lamp, far ultraviolet rays typified by excimer laser, X-rays, EUV light, or the like but also lithography with particle beams such as electron beams and ion beams.

In the present specification, the numerical value range expressed by using "to" means a range including the numerical values described before and after "to" as a lower limit value and an upper limit value, respectively.

In the present specification, "(meth)acrylate" refers to both or any one of "acrylate" and "methacrylate"; "(meth)allyl" refers to both or any one of "allyl" and "methallyl"; "(meth)acrylic" refers to both or any one of "acrylic" and "methacrylic"; and "(meth)acryloyl" refers to both or any one of "acryloyl" and "methacryloyl".

In the present specification, the term "step" means not only an independent step, but also a step which may not be clearly separated from another step as long as an expected effect of the step can be attained.

In the present specification, the concentration of solid contents refers to a mass percentage of the mass of other components except for a solvent, with respect to the total mass of the composition. Further, the concentration of solid contents is a concentration at 25° C. unless otherwise specifically stated.

In the present specification, the weight-average molecular weight (Mw) and number-average molecular weight (Mn) is defined as a value in terms of polystyrene by gel permeation chromatography (GPC) measurement unless otherwise specifically stated. In the present specification, the weight-average molecular weight (Mw) and the number-average molecular weight (Mn) can be determined, for example, using HLC-8220 (manufactured by Tosoh Corporation), and guard columns HZ-L, TSKgel Super HZM-M, TSKgel Super HZ4000, TSKgel Super HZ3000, and TSKgel Super HZ2000 (manufactured by Tosoh Corporation) as columns in the device. They are measured using tetrahydrofuran (THF) as an eluent. Further, the detection results are obtained using a detection machine with ultraviolet rays (UV) at 254 nm unless otherwise specifically stated.

Precursor Composition

The precursor composition of the present invention includes at least one kind of heterocycle-containing polymer precursor, the heterocycle-containing polymer precursor is selected from a polyimide precursor and a polybenzoxazole precursor, and the dispersity which is the weight-average molecular weight/the number-average molecular weight of the heterocycle-containing polymer precursor is 2.5 or more.

It is possible to widen the exposure latitude of the photosensitive resin composition by using such the precursor composition in the photosensitive resin composition. The photosensitive resin composition performs negative tone or positive tone development, but if the heterocycle-containing polymer has a narrow dispersity and a small weight-average molecular weight, the photosensitive resin composition is easily dissolved in a solvent included in a developer or the like, and the film reduction of the obtained cured film is increased. On the other hand, if the dispersity of the heterocycle-containing polymer is narrow and the weight-average molecular weight is large, the photosensitive resin composition is hard to dissolve in a solvent and thus, development failure is caused.

Here, the dispersity of the heterocycle-containing polymer precursor manufactured by an ordinary method is 2.0 or more and less than 2.5. In order to increase the dispersity of the heterocycle-containing polymer precursor to more than the range, it is necessary to perform a reaction rapidly, for example, to perform a reaction of raw materials at a high temperature, in which the raw materials are mixed at once. However, it is certain that such a method has not been studied at all in the related art.

In addition, it is well-known that in order to simply improving the resolving power of the cured film, the dispersity is preferably 1.0. However, in the present invention, it is of a high technical significance to find out that an increase in the dispersity to 2.5 or more can widen the range of exposure latitude.

The weight-average molecular weight (Mw) of the precursor composition can be appropriately determined depending on applications, but is, for example, preferably 18,000 to 35,000, more preferably 20,000 to 30,000, and still more preferably 23,000 to 28,000. Further, the number-average molecular weight (Mn) is preferably 7,200 to 14,000, more preferably 8,000 to 12,000, and still more preferably 9,200 to 11,200.

The heterocycle-containing polymer precursor preferably has a polymerizable unsaturated group. Incorporation of a polymerizable unsaturated group (particularly, a photoradically polymerizable group) into the heterocycle-containing polymer precursor is more effective in a case of a use for a negative tone photosensitive resin composition. However, in a case where the precursor composition of the present invention is used in applications other than that for a negative tone photosensitive resin composition or a case where the precursor composition of the present invention is used as a negative tone photosensitive resin composition, the polymerizable unsaturated group is not necessary in a case of blending a polymerizable compound (particularly, a photoradically polymerizable compound) into the composition.

Examples of the polymerizable unsaturated group include an epoxy group, an oxetanyl group, a group having an ethylenically unsaturated bond, a block isocyanate group, an alkoxymethyl group, a methylol group, and an amino group. Among these, for a reason of good sensitivity, a group having an ethylenically unsaturated bond is preferable. Examples of the group having an ethylenically unsaturated bond include a vinyl group, a (meth)allyl group, and a group represented by Formula (III).

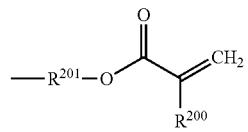

In Formula (III), $R^{200}$ represents a hydrogen atom or a methyl group, and is more preferably a methyl group.

In Formula (III), $R^{201}$ is an alkylene group having 2 to 12 carbon atoms, a —$CH_2CH(OH)CH_2$—, or a polyoxyalkylene group having 4 to 30 carbon atoms.

Suitable examples of $R^{201}$ include ethylene, propylene, trimethylene, tetramethylene, 1,2-butanediyl, 1,3-butanediyl, pentamethylene, hexamethylene, octamethylene, dodecamethylene, and —$CH_2CH(OH)CH_2$—, with ethylene, propylene, trimethylene, and —$CH_2CH(OH)CH_2$— being preferable.

It is particularly preferable that $R^{200}$ is methyl and $R^{201}$ is ethylene.

The dispersity of the heterocycle-containing polymer precursor is 2.5 or more, preferably 2.7 or more, and more preferably 2.8 or more. The upper limit of the dispersity of the heterocycle-containing polymer precursor is not particularly determined, but is, for example, preferably 4.5 or less, more preferably 4.0 or less, still more preferably 3.8 or less, even still more preferably 3.2 or less, even still more preferably 3.1 or less, even still more preferably 3.0 or less, and particularly preferably 2.95 or less. In addition, in a case where the precursor composition of the present invention includes two or more kinds of heterocycle-containing polymer precursors, the value of the dispersity of the heterocycle-containing polymer precursor is a value for the mixture of two or more kinds of the heterocycle-containing polymer precursors included in the precursor composition.

The dispersity is defined as a value calculated from the values of a weight-average molecular weight (hereinafter referred to as "Mw" in some cases) and a number-average molecular weight (hereinafter referred to as "Mn" in some cases), as measured by the method described in Examples which will be described later Example. However, in a case where the measurement equipment or the like employed in Examples is difficult to be obtained for a reason of discontinued production, or the like, other measuring measurement equipment having equivalent performance may be used. This shall also apply to other measurement methods hereinafter.

An aspect in which the precursor composition of the present invention includes two or more kinds (preferably two kinds or three kinds) of heterocycle-containing polymer precursors having a difference in at least one of the weight-average molecular weight or a constituting repeating unit as the heterocycle-containing polymer precursor can be taken. By taking such an aspect, the dispersity can be easily adjusted.

<Heterocycle-Containing Polymer Precursor>

The precursor composition of the present invention includes at least one kind of heterocycle-containing polymer precursor selected from a polyimide precursor and a polybenzoxazole precursor. In a case where the precursor composition of the present invention includes two or more kinds of heterocycle-containing polymer precursor, it may include two or more kinds of only a polyimide precursor or of only a polybenzoxazole precursor, or may include one or more kinds of the polyimide precursor and one or more kinds of the polybenzoxazole precursor. In the present invention, an aspect of including one kind or two or more kinds of only a polyimide precursor or of only a polybenzoxazole precursor is preferable.

The heterocycle-containing polymer precursor in the present invention is preferably a polyimide precursor.

Hereinafter, a preferred range of the polyimide precursor or the polybenzoxazole precursor will be described.

<<Polyimide Precursor>>

The polyimide precursor for use in the present invention is not particularly determined in terms of its structures or the like as long as polyimidization can be preformed, and also encompasses a polyamideimide precursor. The polyimide precursor for use in the present invention preferably includes a repeating unit represented by General Formula (2).

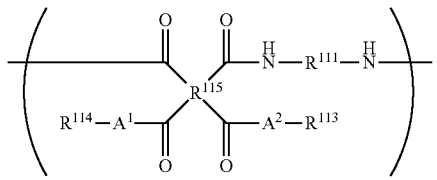

In General Formula (2), $A^1$ and $A^2$ each independently represent an oxygen atom or NH, $R^{111}$ represents a divalent organic group, $R^{115}$ represents a tetravalent organic group, and $R^{113}$ and $R^{114}$ each independently represent a hydrogen atom or a monovalent organic group.

$A^1$ and $A^2$ each independently represent an oxygen atom or NH, with an oxygen atom being preferable.

$R^{111}$ represents a divalent organic group. Examples of the divalent organic group include a linear or branched aliphatic group, a cyclic aliphatic group, and a group containing an aryl group. A linear or branched aliphatic group having 2 to 20 carbon atoms, a cyclic aliphatic group having 6 to 20 carbon atoms, an aryl group having 6 to 20 carbon atoms, or a group formed by combination thereof is preferable, and a group formed of an aryl group having 6 to 20 carbon atoms is more preferable. Examples of the aryl group include the following groups.

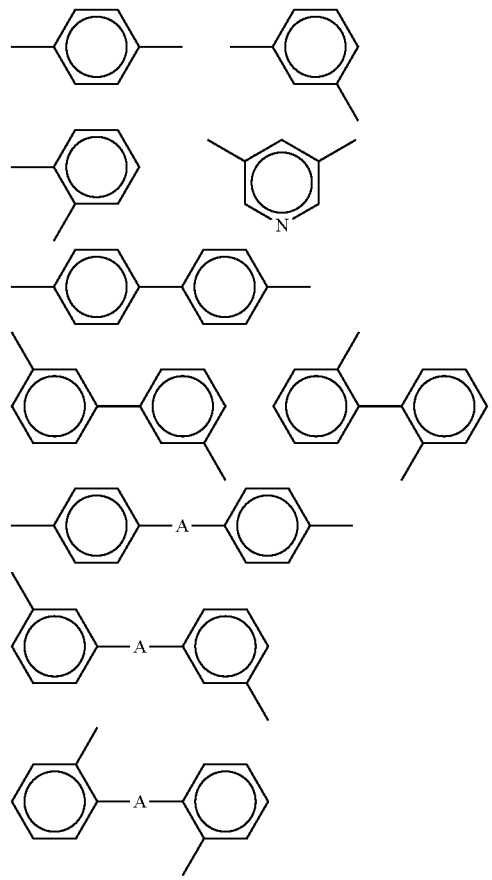

In the formulae, A is preferably a single bond, or a group selected from a hydrocarbon group having 1 to 10 carbon atoms, which may be substituted with a fluorine atom, —O—, —C(=O)—, —S—, —S(=O)$_2$—, —NHCO—, and a combination thereof, more preferably a group selected from a single bond, an alkylene group having 1 to 3 carbon atoms, which may be substituted with a fluorine atom, —O—, —C(=O)—, —S—, and —SO$_2$—, and still more preferably a divalent group selected from —CH$_2$—, —O—, —S—, —SO$_2$—, —C(CF$_3$)$_2$—, and —C(CH$_3$)$_2$—.

More specifically, examples of $R^{111}$ include a diamine residue remaining after removal of an amino group from a diamine. Examples of the diamine include a linear or branched aliphatic, cyclic aliphatic, or aromatic diamine.

Specific examples thereof include diamine residues remaining after removal from amino groups in the following diamines:

at least one kind of diamine selected from 1,2-diaminoethane, 1,2-diaminopropane, 1,3-diaminopropane, 1,4-diaminobutane and 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis(4-aminocyclohexyl)methane, bis(3-aminocyclohexyl)methane, 4,4'-diamino-3,3'-dimethylcyclohexylmethane and isophoronediamine; m- and p-phenylenediamine, diaminotoluene, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenylsulfone, 4,4'- and 3,3'-diaminodiphenylsulfide, 4,4'- and 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl)sulfone, 4,4'-diaminoparaterphenyl, 4,4'-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenylsulfone, 1,3-bis(4-aminophenoxy)benzene, 1,3-bis(3-aminophenoxy)benzene, 1,3-bis(4-aminophenyl)benzene, 1,4-bis(4-aminophenoxy)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenylsulfone, 3,3',5,5'-tetramethyl-4,4'-diaminodiphenylmethane, 2,4- and 2,5-diaminocumene, 2,5-dimethyl-p-phenylenediamine, acetoguanamine, 2,3,5,6-tetramethyl-p-phenylenediamine, 2,4,6-trimethyl-m-phenylenediamine, bis(3-aminopropyl)tetramethyldisiloxane, 2,7-diaminofluorene, 2,5-diaminopyridine, 1,2-bis(4-aminophenyl)ethane, diaminobenzanilide, diaminobenzoic ester, 1,5-diaminonaphthalene, diaminobenzotrifluoride, 1,5-diaminoanthraquinone, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)phenyl]hexafluoropropane, 3,3',5,5'-tetramethyl-4,4'-diaminobiphenyl, 3,3'-dimethoxy-4,4'-diaminobiphenyl, 4,4'-diamino-2,2'-bis(trifluoromethyl)biphenyl, 2,2',5,5',6,6'-hexafluorotolidine, and 4,4'-diaminoquaterphenyl.

Moreover, other examples of $R^{111}$ include diamine residues remaining after removal of amino groups from diamines (DA-1) to (DA-18) shown below.

(DA-1)
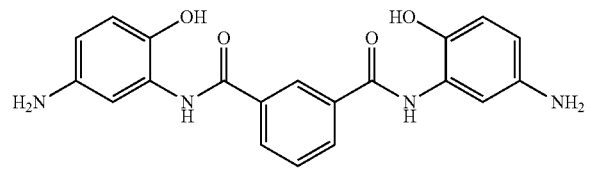

(DA-2)
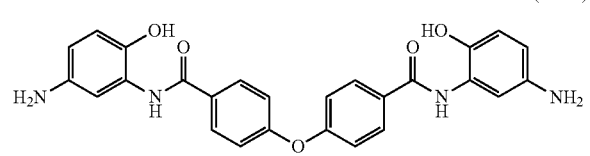

(DA-3)
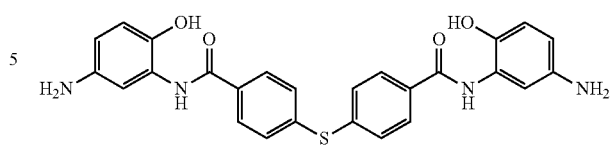

(DA-4)
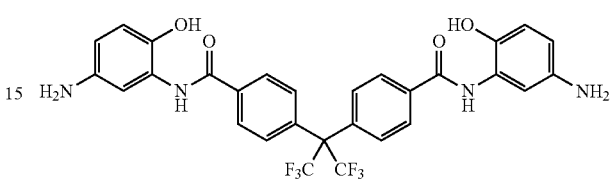

(DA-5)
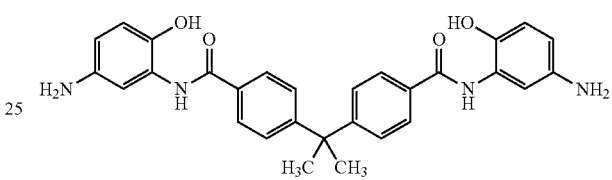

(DA-6)
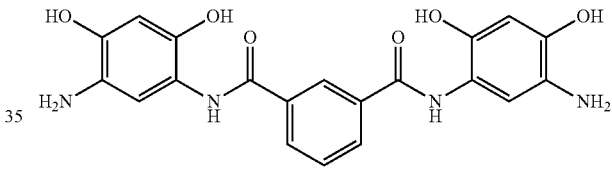

(DA-7)
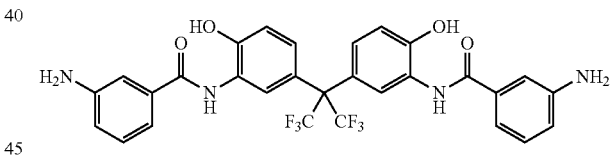

(DA-8)
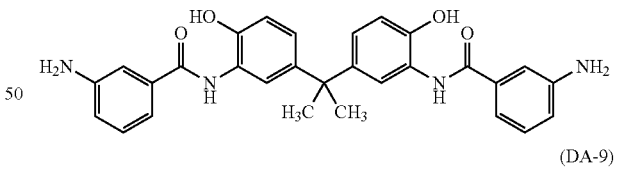

(DA-9)
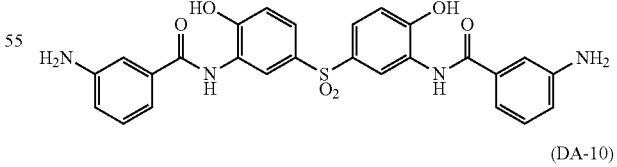

(DA-10)
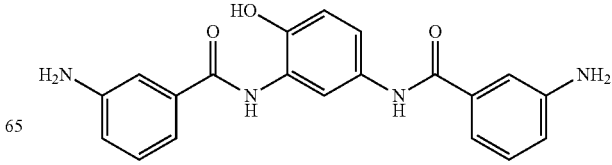

-continued (DA-11)
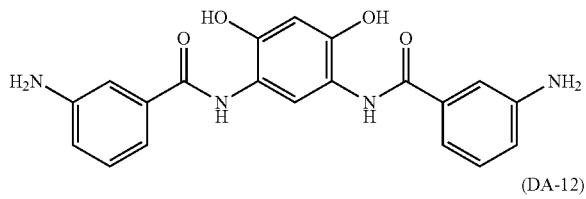

(DA-12)
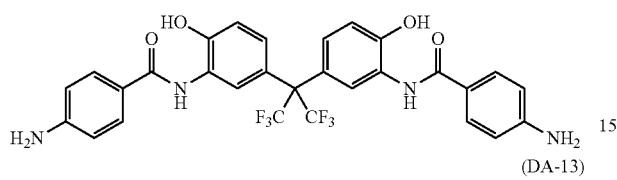

(DA-13)
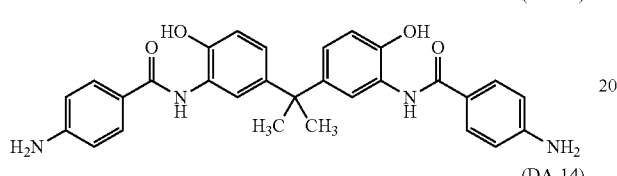

(DA-14)
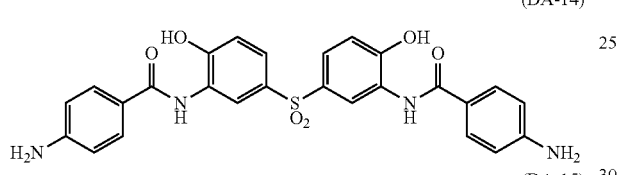

(DA-15)
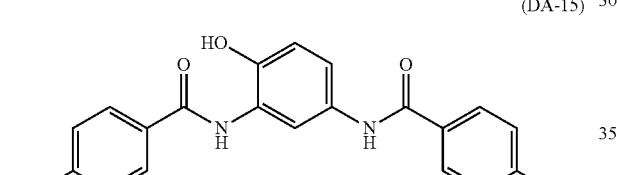

(DA-16)
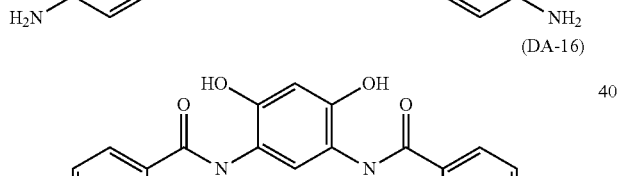

(DA-17)
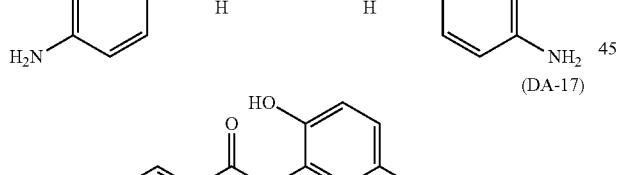

(DA-18)
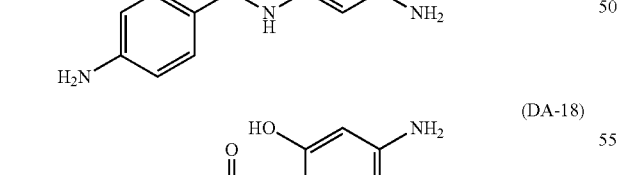

Furthermore, other examples of $R^{111}$ also include a diamine residue remaining after removal of an amino group from a diamine, which has at least two or more alkylene glycol units in the main chain. Preferred examples thereof include a diamine residue including two or more in total of any one or both of an ethylene glycol chain and a propylene glycol chain, and more preferred examples thereof include, but are not limited to, a diamine residue not including an aromatic ring. Examples thereof include JEFFAMINE (registered trademark) KH-511, ED-600, ED-900, ED-2003, EDR-148, EDR-176, D-200, D-400, D-2000, and D-4000 (all trade names, manufactured by HUNTSMAN Corporation), 1-(2-(2-(2-aminopropoxy)ethoxy)propoxy)propane-2-amine, and 1-(1-(1-(2-aminopropoxy)propan-2-yl)oxy)propane-2-amine. The structure of JEFFAMINE (registered trademark) KH-511, ED-600, ED-900, ED-2003, EDR-148, and EDR-176 are shown below.

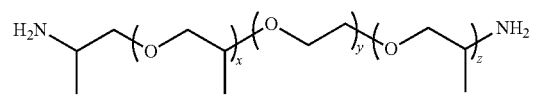

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

EDR-148
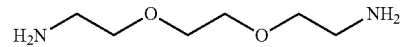

EDR-176
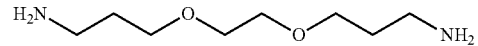

In the formula, x, y, and z are average values.

$R_{115}$ represents a tetravalent organic group. Examples of the tetravalent organic group include a group containing a cyclic structure. Examples of the cyclic structure include an aliphatic ring and an aromatic ring, with an aromatic ring being preferable. The aliphatic ring may be a monocyclic aliphatic ring or a fused ring. Further, the aliphatic ring may have a crosslinking structure. Examples of the aliphatic ring having a crosslinking structure include the following aliphatic rings.

The tetravalent organic group represented by $R_{115}$ is preferably a tetravalent organic group including an aromatic ring, and more preferably a group represented by General Formula (5) or General Formula (6).

General Formula (5)
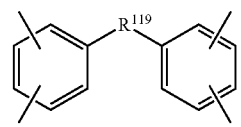

In General Formula (5), $R^{119}$ represents a single bond or a divalent group. The divalent group is preferably a group selected from a hydrocarbon group having 1 to 10 carbon atoms, which may be substituted with a fluorine atom, —O—, —CO—, —S—, —SO$_2$—, —NHCO—, and a combination thereof. $R^{119}$ is more preferably a single bond, or a divalent group selected from an alkylene group having 1 to 3 carbon atoms, which may be substituted with a fluorine atom, —O—, —CO—, —S—, and —SO₂—, and still more preferably a single bond, or a divalent group selected from the group consisting of —CH₂—, —C(CF₃)₂—, —C(CH₃)₂—, —O—, —CO—, —S—, and —SO₂—.

General Formula (6)

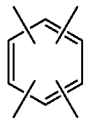

Specific examples of $R^{115}$ include a tetracarboxylic acid residue remaining after removal of an anhydride group from a tetracarboxylic dianhydride.

Specifically, the examples include tetracarboxylic acid residues remaining after removal of an anhydride group from each of the following tetracarboxylic dianhydrides.

pyromellitic dianhydride (PMDA), 3,3',4,4'-biphenyl tetracarboxylic dianhydride, 3,3',4,4'-diphenylsulfidetetracarboxylic dianhydride, 3,3',4,4'-diphenylsulfonetetracarboxylic dianhydride, 3,3',4,4'-benzophenonetetracarboxylic dianhydride, 3,3',4,4'-diphenylmethanetetracarboxylic dianhydride, 2,2',3,3'-diphenylmethanetetracarboxylic dianhydride, 2,3,3',4'-biphenyl tetracarboxylic dianhydride, 2,3,3',4'-benzophenonetetracarboxylic dianhydride, 4,4'-oxydiphthalic acid dianhydride, 2,3,6,7-naphthalenetetracarboxylic dianhydride, 1,4,5,7-naphthalenetetracarboxylic dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenyl hexafluoropropane-3,3,4,4-tetracarboxylic dianhydride, 1,4,5,6-naphthalenetetracarboxylic dianhydride, 2,2',3,3'-diphenyl tetracarboxylic dianhydride, 3,4,9,10-perylenetetracarboxylic dianhydride, 1,2,4,5-naphthalenetetracarboxylic dianhydride, 1,4,5,8-naphthalenetetracarboxylic dianhydride, 1,8,9,10-phenanthrenetetracarboxylic dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic dianhydride, and at least one tetracarboxylic dianhydride selected from these alkyl derivatives having 1 to 6 carbon atoms and these alkoxy derivatives having 1 to 6 carbon atoms.

In addition, other examples of $R^{115}$ include tetracarboxylic acid residues remaining after removal of anhydride groups from tetracarboxylic dianhydrides (DAA-1) to (DAA-5) shown below.

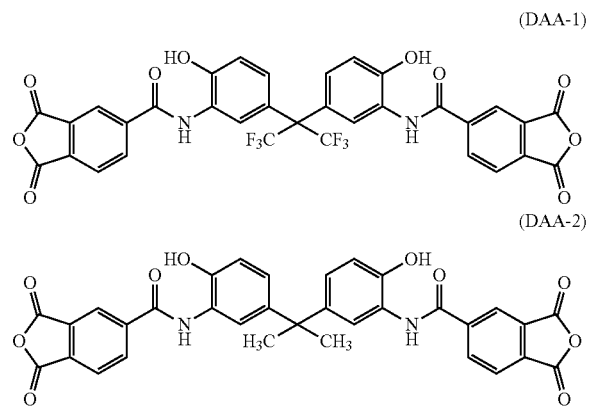

(DAA-1)

(DAA-2)

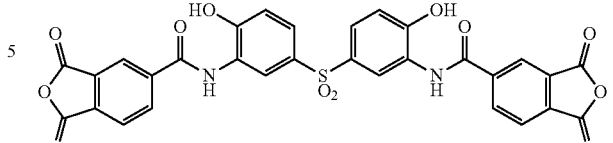

(DAA-3)

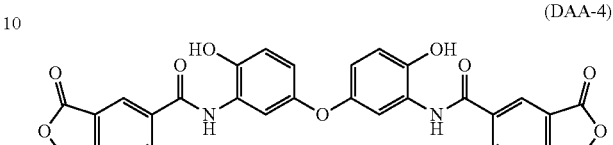

(DAA-4)

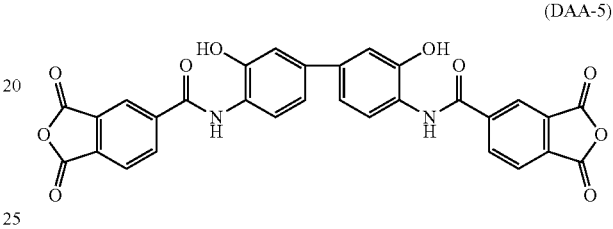

(DAA-5)

From the viewpoint of the solubility in an alkali developer, it is preferable that at least one of $R^{111}$ or $R^{115}$ has an OH group. More specifically, preferred examples of $R^{111}$ include 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl)sulfone, and (DA-1) to (DA-18), and preferred examples of $R^{115}$ include (DAA-1) to (DAA-5).

$R^{113}$ and $R^{114}$ each independently represent a hydrogen atom or a monovalent organic group.

As the monovalent organic group represented by each of $R^{113}$ and $R^{114}$, a substituent which improves the solubility in a developer is preferably used.

From the viewpoint of the solubility in an aqueous developer, $R^{113}$ and $R^{114}$ are each preferably a hydrogen atom or a monovalent organic group. Examples of the monovalent organic group include an aryl group and an aralkyl group, each having one, two, or three acidic groups, and preferably one acidic group, bonded to a carbon atom of the aryl group. Specific examples thereof include an aryl group having 6 to 20 carbon atoms, having an acidic group, and an aralkyl group having 7 to 25 carbon atoms, having an acidic group. More specific examples thereof include a phenyl group having an acidic group, and a benzyl group having an acidic group. The acidic group is preferably an OH group.

$R^{113}$ and $R^{114}$ are each preferably a hydrogen atom, 2-hydroxybenzyl, 3-hydroxybenzyl, or 4-hydroxybenzyl in views of the solubility in an aqueous developer.

From the viewpoint of the solubility in an organic solvent, $R^{113}$ and $R^{114}$ are each preferably a monovalent organic group. The monovalent organic group preferably encompasses a linear or branched alkyl group, a cyclic alkyl group, or an aryl group, and more preferably an alkyl group substituted with an aryl group.

The alkyl group preferably has 1 to 30 carbon atoms. The alkyl group may be linear, branched, or cyclic. Examples of the linear or branched alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group. The cyclic alkyl group may be a monocyclic cyclic alkyl group or a polycyclic cyclic alkyl group. Examples of the monocyclic cyclic alkyl group include a cyclopropyl group, a cyclobutyl group, a cyclopentyl group, a cyclohexyl group, a cycloheptyl group, and a cyclooctyl group. Examples of the polycyclic cyclic alkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. Among these, from the viewpoint of the compatibility with high sensitivity, a cyclohexyl group is the most preferable. In addition, the alkyl group substituted with an aryl group is preferably a linear alkyl group substituted with an aryl group, which will be described later.

The aryl group is specifically a substituted or unsubstituted benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxaline ring, an isoquinoline ring, a carbazole ring, a phenanthridine ring, an acridine ring, a phenanthroline ring, a cyanthrene ring, a cromene ring, a xanthene ring, a phenanthroline ring, a phenothiazine ring, or a phenazine ring, with a benzene ring being the most preferable.

In General Formula (2), at least one of $R^{113}$ or $R^{1114}$ preferably has a polymerizable unsaturated group. Thus, a negative tone photosensitive resin having better sensitivity and resolution can be obtained. Examples of the polymerizable unsaturated group include are the same as described for the polymerizable unsaturated group, which may be contained in the heterocycle-containing polymer precursor as described above, and a preferred range thereof is also the same.

In a case where the repeating unit of General Formula (2) contains a polymerizable group, with regard to the ratio of $R^{113}$ and $R^{114}$ which are polymerizable unsaturated groups, the molar ratio of the polymerizable groups:the groups having no polymerizable group is preferably 100:0 to 5:95, more preferably 100:0 to 20:80, and still more preferably 100:0 to 50:50.

In General Formula (2), in a case where $A^2$ is an oxygen atom and $R^{113}$ is a hydrogen atom and/or a case where $A^1$ is an oxygen atom and $R^{114}$ is a hydrogen atom, the polyimide precursor may form a counter salt with respect to a tertiary amine compound having an ethylenically unsaturated bond. Examples of the tertiary amine compound having an ethylenically unsaturated bond include N,N-dimethylaminopropyl methacrylate.

Moreover, in a case of alkali development, in a view of improving a resolution, it is preferable that the polyimide precursor has a fluorine atom in the structural unit. By the fluorine atom, water repellency is imparted to the surface of the film during alkali development, and thus, penetration through the surface, or the like can be suppressed. The content of the fluorine atoms in the polyimide precursor is preferably 10% by mass or more, and in a view of the solubility of an aqueous alkali solution, the content is preferably 20% by mass or less.

Furthermore, for the purpose of improving the adhesiveness to a substrate, an aliphatic group having a siloxane structure may be copolymerized. Specific examples of the diamine component include bis(3-aminopropyl)tetramethyldisiloxane and bis(p-aminophenyl)octamethylpentasiloxane.

In addition, in order to improve the preservation stability of the photosensitive resin composition, the polyimide precursor is preferably blocked with a terminal blocking agent such as a monoamine, an acid anhydride, a monocarboxylic acid, a mono acid chloride compound, or a monoactive ester compound. Among these, a monoamine is more preferably used. Examples of the monoamine include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these monoamines may be used or a plurality of different terminal group may be introduced by reacting a plurality of terminal blocking agents.

The repeating unit represented by General Formula (2) is preferably a repeating unit represented by General Formula (1-1). That is, the at least one kind of heterocycle-containing polymer precursor used in the present invention is preferably a precursor having the repeating units represented by General Formula (1-1). With the structure, it is possible to further widen the width of exposure latitude.

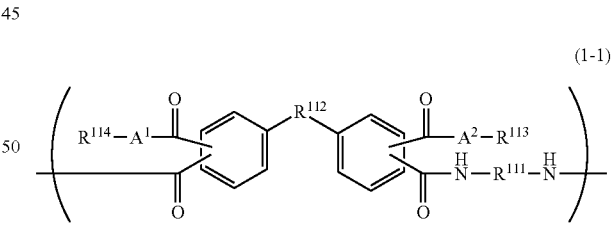

(1-1)

In General Formula (1-1), $A^1$ and $A^2$ each independently represent an oxygen atom or NH, $R^{111}$ represents a divalent organic group, $R^{112}$ represents a single bond or a divalent group, and $R^{113}$ and $R^{114}$ each independently represent a hydrogen atom or a monovalent organic group.

$A^1$, $A^2$, $R^{111}$, $R^{113}$, and $R^{114}$ each independently have the same definitions as $A^1$, $A^2$, $R^{111}$, $R^{113}$, and $R^{1114}$ in General Formula (2), and preferred ranges thereof are also the same.

$R^{112}$ has the same definition as $R^{112}$ in General Formula (5), and a preferred range thereof is also the same.

The polyimide precursor may have one kind or two or more kinds of the repeating structural unit represented by General Formula (2). Further, it may also include a structural isomer of the repeating unit represented by General Formula (2). In addition, it is needless to say that the polyimide precursor may also include another kind of repeating structural unit, in addition to the repeating unit of General Formula (2).

In one embodiment of the polyimide precursor in the present invention, a polyimide precursor in which the repeating unit represented by General Formula (2) accounts for 50% by mole or more, further 70% by mole or more, and particularly 90% by mole or more, of all the repeating units.

The weight-average molecular weight (Mw) of the polyimide precursor is, for example, in a case where the polyimide precursor is used for a photosensitive resin composition which will be described later, preferably 18,000 to 30,000, more preferably 20,000 to 27,000, and more preferably 22,000 to 25,000. In addition, the number-average molecular weight (Mn) is preferably 7,200 to 14,000, more preferably 8,000 to 12,000, and still more preferably 9,200 to 11,200.

<<Polybenzoxazole Precursor>>

The polybenzoxazole precursor used in the present invention is not particularly limited in terms of a structure or the like as long as it can form a polybenzoxazole, but is preferably a compound represented by General Formula (3).

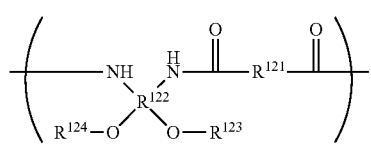

(3)

In General Formula (3), $R^{121}$ represents a divalent organic group, $R^{122}$ represents a tetravalent organic group, and $R^{123}$ and $R^{124}$ each independently represent a hydrogen atom or a monovalent organic group.

$R^{112}$ represents a divalent organic group. Examples of the divalent organic group include an aliphatic group or an aryl group.

Examples of the divalent aryl group include the following groups.

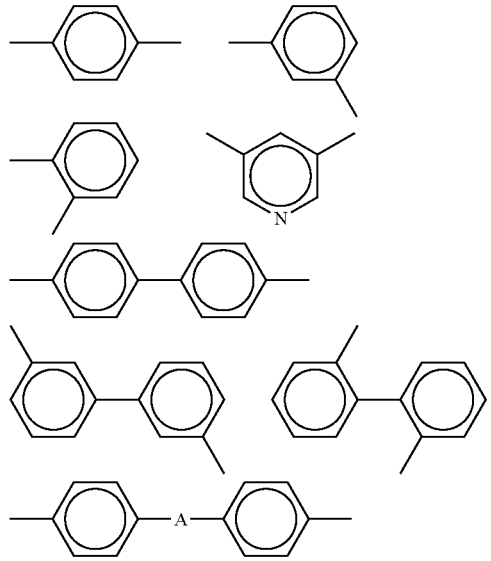

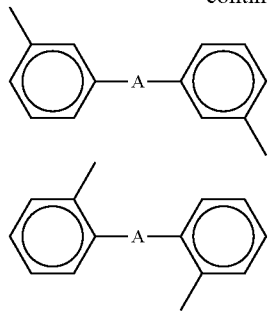

In the formulae, A represents a divalent group selected from the group consisting of —CH$_2$—, —O—, —S—, —SO$_2$—, —CO—, —NHCO—, —C(CF$_3$)$_2$—, and —C(CH$_3$)$_2$—.

In a view of promoting cyclization at a low temperature, the divalent aliphatic group is preferably a linear aliphatic group. The number of carbon atoms of the linear aliphatic group is preferably 2 to 30, more preferably 2 to 25, still more preferably 5 to 20, and particularly preferably 8 to 15. Examples of dicarboxylic acids containing the linear aliphatic group include malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimellic acid, 2,2,6,6-tetramethylpimellic acid, suberic acid, dodecafluorosuberic acid, azelaic acid, sebacic acid, hexadecafluorosebacic acid, 1,9-nonanedioic acid, dodecanedioic acid, tridodecanoic acid, tetradecanedioic acid, pentadecanedioic acid, hexadecanedioic acid, heptadecanedioic acid, octadecanedioic acid, nonadecanoic acid, eicosanedioic acid, heneicosanoic acid, docosanedioic acid, tricosanedioic acid, tetracosanedioic acid, pentadioic acid, hexacosanoic acid, heptacosanoic acid, octacosanoic acid, nonacosanoic acid, triacontanoic acid, hentriacontanoic acid, dotriacontanedioic acid, diglycolic acid, and dicarboxylic acids represented by the following general formulae.

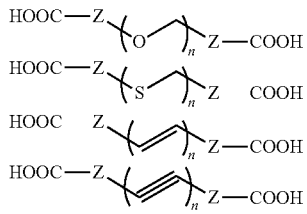

(In the formulae, Z is a hydrocarbon group having 1 to 6 carbon atoms and n is an integer of 1 to 6.)

$R^{112}$ tetravalent represents a tetravalent organic group. The tetravalent organic group is preferably a residue of a bisaminophenol derivative represented by General Formula (A).

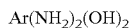

(A)

In the formula, Ar is an aryl group.

Examples of the bisaminophenol derivative of General Formula (A) include 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols derivatives may be used singly or as a mixture of two or more kinds thereof.

Among the bisaminophenol derivatives represented by General Formula (A), the bisaminophenol derivatives each having an aryl group are preferable.

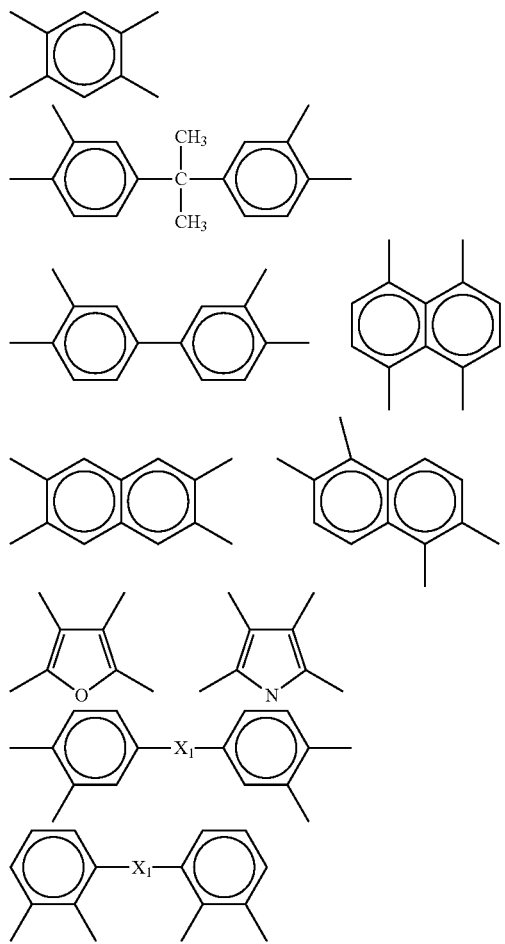

In the formulae, $X_1$ represents —O—, —S—, —C(CF$_3$)$_2$—, —CH$_2$—, —SO$_2$—, or —NHCO—. Further, in the structures, —OH and —NH$_2$ contained in the structure of General Formula (A) bind to an ortho position (adjacent position) to each other.

In a view that a polybenzoxazole precursor having high transparency to an i-line and curability at a low temperature can be obtained, the bisaminophenol derivative of General Formula (A) is preferably a bisphenol represented by General Formula (A-s).

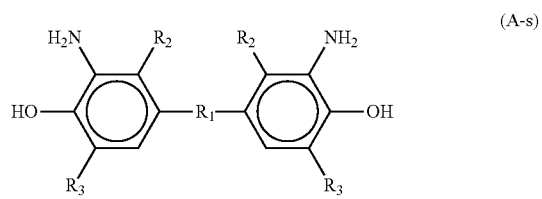

In the formulae, $R_1$ is alkylene, substituted alkylene, —O—, —S—, —SO2-, —CO—, —NHCO—, a single bond, or an organic group selected from the group of Formula (A-sc) below. $R_2$ is any one of an alkyl group, an alkoxy group, an acyloxy group, and a cyclic alkyl group, and may be the same as or different from each other. $R_3$ is any one of a hydrogen atom, a linear or branched alkyl group, an alkoxy group, an acyloxy group, and a cyclic alkyl group, and may be the same as or different from each other.

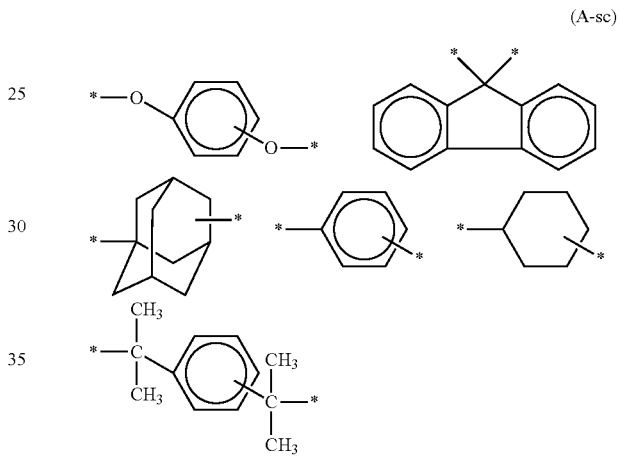

(In the formulae, * represents a bonding of the bisaminophenol derivative represented by Formula (A-s) to an aromatic ring of an aminophenol group.)

In Formula (A-s), it is considered that a substituent is particularly preferably contained at the ortho position of the phenolic hydroxyl group in a view that $R_3$ further shortens the distance between the carbonyl carbon of the amide bond and the hydroxyl group, and en effect of providing a high cyclization rate in a case of curing at a low temperature is enhanced.

Moreover, it is particularly preferable that in Formula (A-s), $R_2$ is an alkyl group and $R_3$ is an alkyl group in a view that a polybenzoxazole precursor having an excellent balance, which has a sufficient solubility in a case of using an aqueous alkaline solution as a developer while maintaining the effects of a high transparency to an i-line and a high cyclization rate in a case of being cured at a low temperature, is obtained.

Furthermore, in Formula (A-s), $R_1$ is preferably an alkylene or a substituted alkylene. Specific examples of the alkylene and the substituted alkylene for $R_1$ include —CH$_2$—, —CH(CH$_3$)—, —C(CH$_3$)$_2$—, —CH(CH$_2$CH$_3$)—, —C(CH$_3$)(CH$_2$CH$_3$)—, —C(CH$_2$CH$_3$)(CH$_2$CH$_3$)—, —C(CH$_2$CH$_2$CH$_3$)—, —C(CH$_3$)(CH$_2$CH$_2$CH$_3$)—, —CH(CH(CH$_3$)$_2$)—, —C(CH$_3$)(CH(CH$_3$)$_2$)—, —CH(CH$_2$CH$_2$CH$_3$)—, —C(CH$_3$)(CH$_2$CH$_2$CH$_3$)—, —CH(CH$_2$CH(CH$_3$)$_2$)—, —C(CH$_3$)(CH$_2$CH (CH₃)₂)—, —CH(CH₂CH₂CH₂CH₂CH₃)—, —C(CH₃) (CH₂CH₂CH₂CH₂CH₃)—, —CH(CH₂CH₂CH₂CH₂CH₂CH₃)—, and —C(CH₃)(CH₂CH₂CH₂CH₂CH₂CH₃)—, and among these, —CH₂—, —CH(CH₃)—, and —C(CH₃)₂— are more preferable in a view that a polybenzoxazole precursor having an excellent balance, which has a sufficient solubility in a solvent as well as an aqueous alkaline solution, while maintaining the effects of a high transparency to an i-line and a high cyclization rate in a case of being cured at a low temperature, is obtained.

For a method for producing the bisaminophenol derivative represented by Formula (A-s), reference can be made to, for example, those described in paragraph Nos. 0085 to 0094 and Example 1 (paragraph Nos. 0189 to 0190) of JP2013-256506A, the contents of which are incorporated herein.

For specific examples of the structure of the bisaminophenol derivative represented by Formula (A-s), reference can be made to, for example, those described in paragraph Nos. 0070 to 0080 of JP2013-256506A, the contents of which are incorporated herein. It is needless to say that the structures are not limited to these examples.

Among those, the derivatives shown below are preferable as the bisaminophenol derivative represented by Formula (A-s).

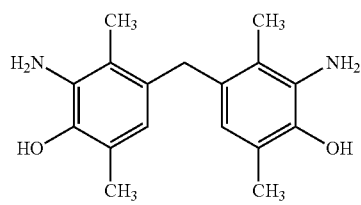
(A-s-1)

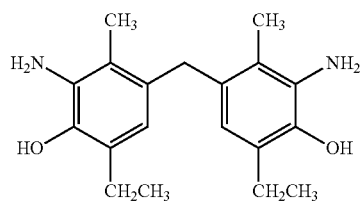
(A-s-2)

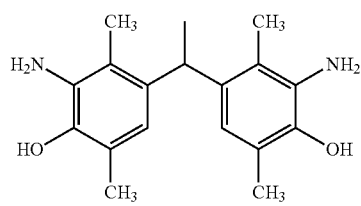
(A-s-3)

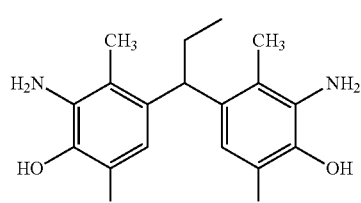
(A-s-4)

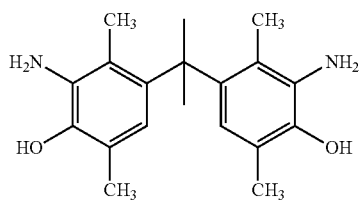
(A-s-5)

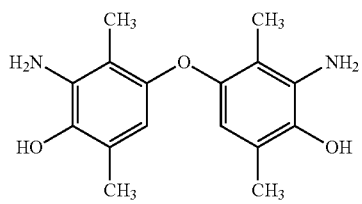
(A-s-6)

$R^{123}$ and $R^{124}$ each represent a hydrogen atom or a monovalent organic group, and in a view that a negative tone photosensitive resin having better sensitivity and resolution can be obtained, it is preferable that at least one of $R^{123}$ or $R^{124}$ represents a polymerizable unsaturated group. The polymerizable unsaturated group is the same as the above-mentioned aspect for $R^{113}$ and $R^{114}$ in General Formulae (2), and a preferred range thereof is also the same.

The polybenzoxazole precursor may include other kinds of repeating structural units, in addition to the repeating units of General Formula (3).

In a view that generation of warping accompanying the ring closure can be suppressed, it is preferable that the polybenzoxazole precursor includes other kinds of diamine residues represented by General Formula (SL).

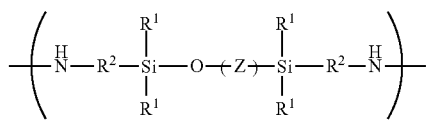
(SL)

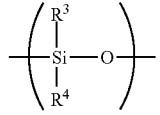
a

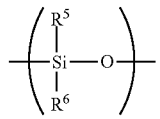
b

In the formulae, Z has a structure a and a structure b, $R^1$ is a hydrogen atom or a hydrocarbon group having 1 to 10 carbon atoms, $R^2$ is a hydrocarbon group having 1 to 10 carbon atoms, at least one of $R^3$, $R^4$, $R^5$, or $R^6$ is an aryl group and the others are each a hydrogen atom or an organic group having 1 to 30 carbon atoms, and these may be the same as or different from each other. The polymerization of the structure a and the structure b may be either block polymerization or random polymerization. The amount in % by mole of the Z moiety is as follows: the structure a accounts for 5% to 95% by mole, the structure b accounts for 95% to 5% by mole, and a+b is 100% by mole.

In Formula (SL), preferred examples of Z include those in which $R^5$ and $R^6$ in the structure b are each a phenyl group.

Further, the molecular weight of the structure represented by Formula (SL) is preferably 400 to 4,000, and more preferably 500 to 3,000. The molecular weight can be determined by means of gel permeation chromatography which is generally used. By setting the molecular weight to the above range, both of an effect of lowering the modulus of elasticity after dehydration and ring closure of a polybenzoxazole precursor, and thus suppressing the warping, and an effect of enhancing the solubility can be both attained.

In a case of including a diamine residue represented by General Formula (SL) as another kind of repeating structural unit, it is preferable to include a repeating tetracarboxylic acid residue remaining after removal of an anhydride group from a tetracarboxylic dianhydride in a view of improving alkali solubility. Examples of such a tetracarboxylic acid residue include the examples of the $R^{115}$ in General Formula (2).

Moreover, in order to improve the preservation stability of the precursor composition or the photosensitive resin composition, it is preferable to cap an amino group at a terminal of a polybenzoxazole precursor with an acid anhydride containing an aliphatic group or cyclic group having at least one of an alkenyl group or an alkanyl group.

Examples of the group derived from such the acid anhydride containing an aliphatic group or cyclic group having at least one of an alkenyl group or an alkanyl group after the reaction with the amino group, that is, a terminal blocking group include groups shown below. These may be used singly or in combination of two or more kinds thereof.

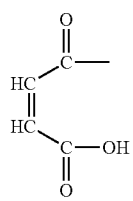
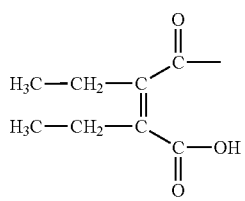
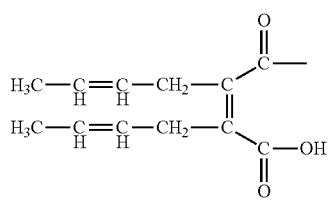
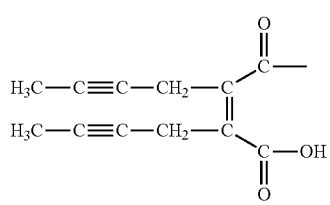
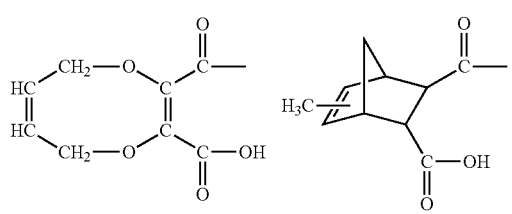

-continued

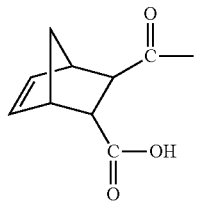
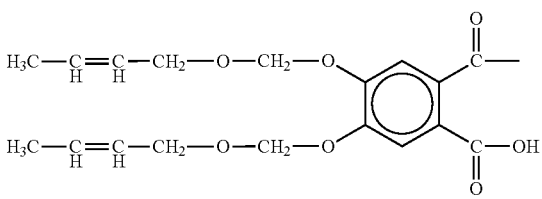
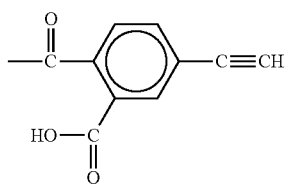
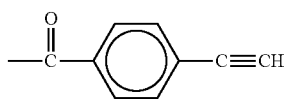
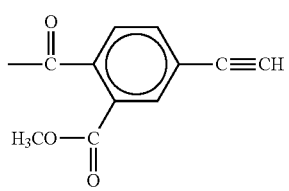
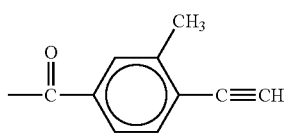
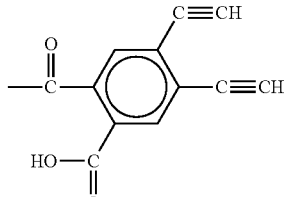
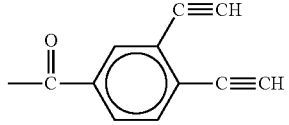
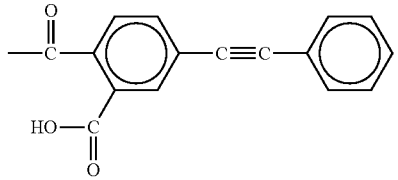

-continued

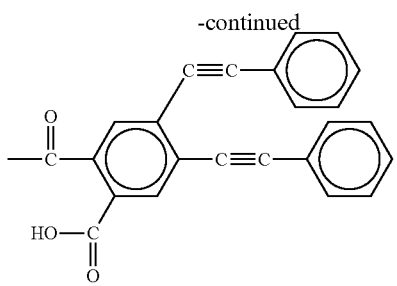

In particular, groups shown below are preferable in a view that they can improve storability.

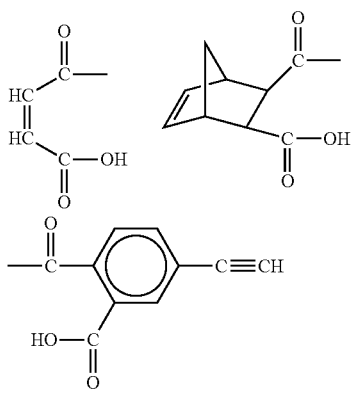

The polybenzoxazole precursor can be obtained by, for example, reacting of the bisaminophenol derivative represented by General Formula (A) with a compound selected from a dicarboxylic acid containing $R^{121}$, a dicarboxylic acid dichloride, a dicarboxylic acid derivative, and the like of the dicarboxylic acid.

Incidentally, in a case of the dicarboxylic acid, in order to enhance the reaction yield, or the like, an active ester type dicarboxylic acid derivative formed by a reaction with 1-hydroxy-1,2,3-benzotriazole or the like may also be used.

The weight-average molecular weight (Mw) of the polybenzoxazole precursor is, for example, in a case of being used in the photosensitive resin composition which will be described later, preferably 18,000 to 30,000, more preferably 20,000 to 29,000, and still more preferably 22,000 to 28,000. In addition, the number-average molecular weight (Mn) is preferably 7,200 to 14,000, more preferably 8,000 to 12,000, and still more preferably 9,200 to 11,200.

<Method for Producing Precursor Composition>

The method for producing a precursor composition of the present invention is not particularly determined, but the following aspects are exemplified.

(1) The precursor composition can be produced by using two or more kinds of the heterocycle-containing polymer precursors having different weight-average molecular weights and the same constituting repeating units (that is, raw material monomers constituting the repeating units) as a heterocycle-containing polymer precursor.

By blending two or more kinds of the heterocycle-containing polymer precursors having different weight-average molecular weights, a precursor composition satisfying a desired dispersity is obtained. Further, such the precursor composition has one kind of the structure of the heterocycle-containing polymer precursor, and therefore, a composition particularly excellent in an exposure latitude is obtained.

In one example of the present aspect, an aspect in which a heterocycle-containing polymer precursor having an Mw of 10,000 to 20,000 and a heterocycle-containing polymer precursor having an Mw of 28,000 to 42,000 are blended at 0.8 to 1.2:1.2 to 0.8 in terms of a mass ratio is exemplified.

In addition, in the present aspect, the heterocycle-containing polymer precursor having the same constituting repeating unit as a heterocycle-containing polymer precursor refers to one in which the raw material monomers constituting the repeating unit contained in the heterocycle-containing polymer precursor contained in the precursor composition of the present invention are common, and in a case of a copolymer, it is needless to say that heterocycle-containing polymer precursors having different copolymerization ratios of raw material monomers are included.

(2) The precursor composition can be produced by using two or more kinds of the heterocycle-containing polymer precursors having different weight-average molecular weights and constituting repeating units, at least one of which (that is, at least one of raw material monomers constituting the repeating units) is different, as a heterocycle-containing polymer precursor. Such the precursor composition has a merit in that the dispersity is easily adjusted.

In one example of the present aspect, an aspect in which a heterocycle-containing polymer precursor having an Mw of 10,000 to 20,000 and a heterocycle-containing polymer precursor having an Mw of 28,000 to 42,000 are blended at 0.8 to 1.2:1.2 to 0.8 in terms of a mass ratio is exemplified.

(3) The precursor composition can be synthesized such that it has a desired dispersity, using one kind of the heterocycle-containing polymer precursor by designing the reaction conditions of the heterocycle-containing polymer precursor.

Specifically, the heterocycle-containing polymer precursor of the present invention is usually synthesized by a polycondensation reaction of a diamine compound, a dicarboxylic acid or diamine compound, and a dicarboxylic acid halide, but it is possible to synthesize a precursor having a desired dispersity by controlling the reaction, for example, by setting a condition for making the reaction of two raw materials non-uniform, specifically, for example, increasing the reaction temperature, reducing the mixing time, or the like.

<Uses>

The uses of the precursor composition of the present invention are not particularly determined, and the precursor composition can be adopted and used in various uses using a polyimide or a polybenzoxazole.

In the present invention, particularly, the precursor composition is preferably used after being blended into a positive tone or negative tone photosensitive resin composition, and is more preferably used after being blended into the negative tone photosensitive resin composition.

In addition, the polyimide or the polybenzoxazole is strong against heat, and a cured formed by curing the precursor composition of the present invention can thus be suitably used as a transparent plastic substrate for a display device such as a liquid crystal display and an electronic paper, an automobile part, a heat-resistant paint, a coating, or a film.

Photosensitive Resin Composition

Next, the photosensitive resin composition of the present invention will be described.

In a first embodiment, the photosensitive resin composition of the present invention includes the precursor composition of the present invention and a photoradical polymerization initiator. Such the photosensitive resin composition is preferably used as a negative tone photosensitive resin composition. In a case of being used as a negative tone photosensitive resin composition, it is preferable that the heterocycle-containing polymer precursor included in the precursor composition of the present invention has a polymerizable unsaturated group or includes a curable compound. In a case where the photosensitive resin composition is a negative tone photosensitive resin composition, it is preferable that a compound having an ethylenically unsaturated bond is included as a curable compound.

In a second embodiment, the photosensitive resin composition of the present invention includes the precursor composition of the present invention and a photoacid generator. Such the photosensitive resin composition is preferably used as a positive tone photosensitive resin composition. In a case of being used as the positive tone photosensitive resin composition, it is preferable that the photosensitive resin composition includes a curable compound. In a case where the photosensitive resin composition is a positive tone photosensitive resin composition, at least one compound selected from a compound having a hydroxymethyl group, an alkoxymethyl group, or an acyloxymethyl group, an epoxy compound, an oxetane compound, and a benzoxazine compound is preferable as the curable compound.

Furthermore, the negative tone photosensitive resin composition may further include a sensitizer, a polymerization inhibitor, or the like. In addition, it is needless to say that the negative tone photosensitive resin composition may further include other components other than these.

On the other hand, the positive tone photosensitive resin composition may include a resin including a phenolic OH group. In addition, it is needless to say that the positive tone photosensitive resin composition may further include other components other than these.

The details of these components will be described later.

In particular, in a case of the positive tone photosensitive resin composition, it is preferable that the precursor composition of the present invention includes a polybenzoxazole precursor.

The photosensitive resin composition of the present invention may further include a polyimide or a polybenzoxazole having a closed ring structure.

In the photosensitive resin composition of the present invention, the content of the heterocycle-containing polymer precursor in the precursor composition is preferably 20% to 100% by mass, more preferably 50% to 99% by mass, still more preferably 70% to 98% by mass, and particularly preferably 80% to 95% by mass, with respect to the total solid content of the photosensitive resin composition.

The dispersity of the heterocycle-containing polymer precursor included in the photosensitive resin composition of the present invention has the same definition as the dispersity of the precursor composition of the present invention, and a preferred range thereof is also the same.

Hereinafter, the components which may be included in the photosensitive resin composition of the present invention will be described. The present invention may include components other than these, and it is needless to say that these components are not necessary.

<Resin Containing Phenolic OH Group>

In a case where the photosensitive resin composition of the present invention is of an alkali-developing positive tone, it is preferable that the photosensitive resin composition includes a resin containing a phenolic OH group in a view that the solubility in an alkali developer is adjusted, and thus good sensitivity is obtained.

Preferred examples of the resin containing a phenolic OH group include a novolac resin and a polyhydroxystyrene resin.

<<Novolac Resin>>

The novolac resin is obtained by polycondensation of phenols with aldehydes by a known method. Two or more kinds of the novolac resins may be combined.

Preferred examples of the phenols include phenol, o-cresol, m-cresol, p-cresol, 2,3-xylenol, 2,5-xylenol, 3,4-xylenol, 3,5-xylenol, 2,3,5-trimethylphenol, and 3,4,5-trimethylphenol, and particularly, phenol, m-cresol, p-cresol, 2,3-xylenol, 2,5-xylenol, 3,4-xylenol, 3,5-xylenol, and 2,3,5-trimethylphenol are preferable. These phenols may be used alone or in combination of two or more kinds thereof. From the viewpoint of the solubility in an alkali developer, m-cresol is preferable, and a combination of m-cresol and p-cresol is also preferable. That is, it is preferable that a cresol novolac resin including an m-cresol residue, or an m-cresol residue and a p-cresol residue is included as the novolac resin. Here, the molar ratio (m-cresol residue/p-cresol residue, m/p) of the m-cresol residue to the p-cresol residue in the cresol novolac resin is preferably 1.8 or more. Within this range, a suitable solubility in an alkali developer is exhibited, and good sensitivity is obtained. The molar ratio is more preferably 4 or more.

Furthermore, preferred examples of the aldehydes include formalin, paraformaldehyde, acetaldehyde, benzaldehyde, hydroxybenzaldehyde, and chloroacetaldehyde. Two or more kinds of these aldehydes may be used.

In addition, a full-aromatic novolac resin obtained by polycondensation using a compound represented by General Formula (Phe) as phenols and a compound represented by General Formula (Ald) as aldehydes is preferable in a view that it can provide a cured film of the photosensitive resin composition of the present invention with high heat resistance.

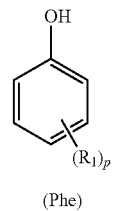

(Phe)

In the formula, $R_1$ represents an organic group selected from an alkyl group having 1 to 20 carbon atoms and an alkoxy group, and p is an integer of 1 to 3, and preferably an integer of 2 or 3.

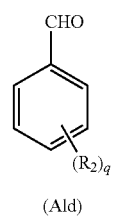

(Ald)

In the formula, $R_2$ represents an organic group selected from hydrogen, an alkyl group having 1 to 20 carbon atoms, an alkoxy group, and a hydroxyl group, and q is an integer of 0 to 3.

As the phenol compound represented by General Formula (Phe), the phenol compound having 1 to 3 substituents, and preferably 2 or 3 substituents is used, and the substituent is a group selected from an alkyl group having 1 to 20 carbon atoms and an alkoxy group. Further, specific examples of the alkyl group having 1 to 20 carbon atoms and the alkoxy group include a methyl group, an ethyl group, a propyl group, a methoxy group, and an ethoxy group. As such the phenol compound, for example, o-cresol, m-cresol, p-cresol, 2,3-dimethylphenol, 2,4-dimethylphenol, 2,5-dimethylphenol, 3,4-dimethylphenol, 3,5-dimethylphenol, 2-methyl-3-ethyl-phenol, 2-methyl-3-methoxyphenol, 2,3,4-trimethylphenol, 2,3,5-trimethylphenol, 2,3,6-trimethylphenol, or the like can be preferably used. Among these, although not being particularly limited, the phenol compound selected from 2,3-dimethylphenol, 2,4-dimethylphenol, 2,5-dimethylphenol, 3,4-dimethylphenol, 3,5-dimethylphenol, and 2,6-dimethylphenol is preferable. In addition, these phenols can be used singly or as a mixture of two or more kinds thereof.

By using the phenol compound having 1 to 3 substituents, and preferably 2 or 3 substituents as the phenol compound represented by General Formula (Phe), intramolecular rotation is suppressed, and thus, a phenol resin having sufficient heat resistance required for the photosensitive resin composition can be obtained.

As the aromatic aldehyde compound represented by General Formula (Aid), an unsubstituted aromatic aldehyde compound or an aromatic aldehyde compound having 3 or less substituents is used, and the substituent is a group selected from an alkyl group having 1 to 20 carbon atoms, an alkoxy group, and a hydroxyl group. Further, specific examples of the alkyl group having 1 to 20 carbon atoms and the alkoxy group include a methyl group, an ethyl group, a propyl group, a methoxy group, and an ethoxy group. As the aromatic aldehyde compound, for example, benzaldehyde, 2-methylbenzaldehyde, 3-methylbenzaldehyde, 4-methylbenzaldehyde, 2,3-dimethylbenzaldehyde, 2,4-dimethylbenzaldehyde, 2,5-dimethylbenzaldchyde, 2,6-dimethylbenzaldehyde, 3,4-dimethylbenzaldehyde, 3,5-dimethylbenzaldehyde, 2,3,4-trimethylbenzaldehyde, 2,3,5-trimethylbenzaldehyde, 2,3,6-trimethylbenzaldehyde, 2,4,5-trimethylbenzaldehyde, 2,4,6-trimethylbenzaldehyde, 3,4,5-trimethylbenzaldehyde, 4-ethylbenzaldehyde, 4-tert-butylbenzaldehyde, 4-isobutylbenzaldehyde, 4-methoxybenzaldehyde, salicylaldehyde, 3-hydroxybenzaldehyde, 4-hydroxybenzaldehyde, 3-methylsalicylaldehyde, 4-methylsalicylaldehyde, 2-hydroxy-5-methoxybenzaldehyde, 2,4-dihydroxybenzaldehyde, 2,5-dihydroxybenzaldehyde, 2,3,4-trihydroxybenzaldehyde, or the like can be used. Among these, although not being particularly limited, the aromatic aldehyde compound in which $R_2$ in General Formula (2) is hydrogen, a methyl group, or a hydroxyl group is preferable, and the aromatic aldehyde compound selected from aromatic aldehyde compounds shown below are more preferable. In addition, these aldehydes can be used singly or as a mixture of two or more kinds thereof.

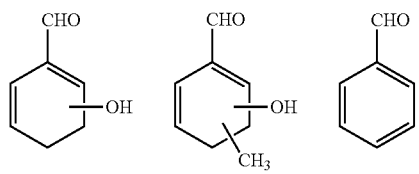

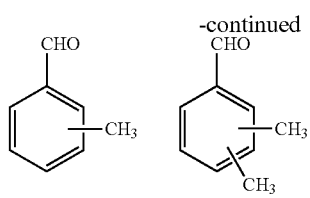

In a synthesis reaction for obtaining a novolac resin from phenols and aldehydes, 0.5 moles to 2 moles of the aldehyde compound are preferably reacted, 0.6 moles to 1.2 moles of the aldehyde compound are more preferably reacted, and 0.7 moles to 1.0 mole of the aldehyde compound are particularly preferably reacted, per mole of the phenol compound. By setting the molar ratio to the above range, a molecular weight with which sufficient characteristics for the photosensitive resin composition can be exerted can be obtained.

For the polycondensation reaction of phenols and aldehydes, an acidic catalyst is usually used. Examples of the acidic catalyst include hydrochloric acid, nitric acid, sulfuric acid, formic acid, oxalic acid, acetic acid, and p-toluenesulfonic acid. The amount of the acidic catalyst is usually $1 \times 10^{-5}$ to $5 \times 10^{-1}$ moles with respect to one mole of phenols. For the polycondensation reaction, water is usually used as a reaction medium, but in a case where a heterogeneous system is created from the initiation of the reaction, a hydrophilic solvent or a lipophilic solvent is used as the reaction medium. Examples of the hydrophilic solvent include alcohols such as methanol, ethanol, propanol, butanol, and propylene glycol monomethyl ether; and cyclic ethers such as tetrahydrofuran and dioxane. Examples of the lipophilic solvent include ketones such as methyl ethyl ketone, methyl isobutyl ketone, and 2-heptanone. The amount of the reaction medium to be used is usually 20 to 1,000 parts by mass with respect to 100 parts by mass of the reaction raw material.

The reaction temperature of polycondensation may appropriately be adjusted in accordance with the reactivity of raw materials, but is usually 10° C. to 200° C. The reaction may be carried out by appropriately employing a method in which phenols, aldehydes, an acidic catalyst, and the like are introduced at once to perform a reaction, or a method in which phenols, aldehydes, and the like are added with progress of the reaction in the presence of an acidic catalyst. After the polycondensation reaction is completed, in order to remove the unreacted materials, the acidic catalyst, the reaction medium, or the like present in the system, the reaction temperature of the system is raised to 130° C. to 230° C., and volatile components are removed under reduced pressure to recover a novolac resin.

The weight-average molecular weight (hereinafter referred to as "Mw") in terms of polystyrene of the novolac resin is preferably 1,000 or more, more preferably 2,000 or more, and still more preferably 5,000 or more. Within these ranges, good sensitivity can be obtained.

The content of the novolac resin is preferably from 1 part by mass to 70 parts by mass, more preferably from 10 parts by mass to 70 parts by mass or less, with respect to 100 parts by mass of the heterocycle-containing polymer precursor. Within these ranges, a pattern having high sensitivity and not flowing after a thermal treatment at a high temperature is obtained. The novolac resin may be used singly or in combination of two or more kinds thereof. In a case of using two or more kinds thereof, a total amount there is preferably within the above range.

<<Polyhydroxystyrene Resin>>

The hydroxystyrene resin is a polymer including hydroxystyrene and/or a derivative thereof, and is not particularly limited. However, it may be a copolymer including hydroxystyrene and/or a derivative thereof, and other monomers. Examples of the monomers as used herein include ethylene, propylene, 1-butene, 2-methylpropene, styrene, and a derivative thereof. Among these, from the viewpoint that the solubility in an alkali developer can be easily adjusted, a copolymer formed of hydroxystyrene and/or a derivative thereof, and styrene and/or a derivative thereof is preferable. The derivative may be any one resulting from substitution with an alkyl group, an alkoxy group, a hydroxyl group, or the like at an ortho-, meta-, or para-position of an aromatic ring in hydroxystyrene and styrene. The hydroxystyrene of the hydroxystyrene resin can be any one of orthohydroxystyrene, metahydroxystyrene, and parahydroxystyrene. In addition, a plurality of hydroxystyrenes may coexist.

The constitutive ratio of the hydroxystyrene and a derivative thereof in the hydroxystyrene resin is preferably 50% or more, and more preferably 60% or more with respect to the lower limit, and preferably 90% or less, and more preferably 80% or less with respect to the upper limit. Within the above range, an effect of excellent compatibility of reduction in residues after exposure in the exposed areas and high sensitivity is attained.

Among them, a hydroxystyrene resin having a repeating structural unit represented by General Formula (PHS-1) is preferable.

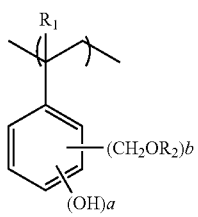

(PHS-1)

In the formula, $R_1$ represents a hydrogen atom or an alkyl group having 1 to 5 carbon atoms, a represents 1 to 4, b represents 1 to 3, and a+b is within a range of 1 to 5. $R_2$ represents an atom or group selected from a hydrogen atom, a methyl group, an ethyl group, and a propyl group.

The structural unit represented by General Formula (PHS-1) is obtained by, for example, polymerizing one kind or two or more kinds of an aromatic vinyl compound having a phenolic hydroxyl group, such as p-hydroxystyrene, m-hydroxystyrene, o-hydroxystyrene, p-isopropenylphenol, m-isopropenylphenol, and o-isopropenylphenol and an aromatic vinyl compound such as styrene, o-methylstyrene, m-methylstyrene, and p-methylstyrene, by a known method, followed by performing an addition reaction of an alkoxy group to a part of a polymer or copolymer thus obtained.

As the aromatic vinyl compound having a phenolic hydroxyl group, p-hydroxystyrene and/or m-hydroxystyrene is preferably used, and as the aromatic vinyl compound, styrene is preferably used.

Among the hydroxystyrene resins having the structural unit represented by General Formula (PHS-1), in views of further improving the sensitivity and adjusting the solubility in an alkali developer, a copolymer including a structural unit represented by General Formula (PHS-2), General Formula (PHS-3), or General Formula (PHS-4) is preferable. In addition, in a view of the solubility in an alkali developer, the content of the structural unit of General Formula (PHS-4) is preferably 50% by mole or less.

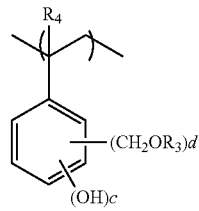

(PHS-2)

In the formulae, $R_4$ represents a hydrogen atom or an alkyl group having 1 to 5 carbon atoms, c represents 1 to 4, d represents 1 to 3, and c+d is within a range of 2 to 5. $R_3$ represents an atom or group selected from a hydrogen atom, a methyl group, an ethyl group, and a propyl group.

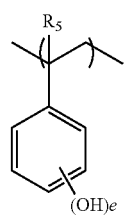

(PHS-3)

In the formulae, $R_5$ represents a hydrogen atom or an alkyl group having 1 to 5 carbon atoms, and e represents 1 to 5.

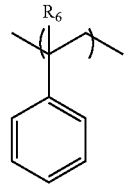

(PHS-4)

In the formulae, $R_6$ represents a hydrogen atom or an alkyl group having 1 to 5 carbon atoms.

The weight-average molecular weight (Mw) of the hydroxystyrene resin is preferably 1,000 or more, more preferably 2,000 or more, and particularly preferably 2,500 or more, and preferably 10,000 or less, more preferably 8,000 or less, and particularly preferably 7,000 or less. Within the above range, an effect of excellent compatibility of high sensitivity and preservation stability at normal temperature of varnishes is attained.

The content of the hydroxystyrene resin is from 1 part by mass to 70 parts by mass, and more preferably from 10 parts by mass to 70 parts by mass, with respect to 100 parts by mass of the heterocycle-containing polymer precursor. Within these ranges, a pattern having high sensitivity and not flowing after a thermal treatment at a high temperature is obtained. The hydroxystyrene resin may be used singly or in combination of two or more kinds thereof. In a case of using two or more kinds thereof, a total amount there is preferably within the above range.

<Curable Compound>

The photosensitive resin composition of the present invention contains a curable compound other than the heterocycle-containing polymer precursor. By incorporation of the curable compound, it is possible to form a cured film having superior heat resistance. In addition, patterning can also be carried out by a photolithography method.

The curable compound may be used singly or in combination of two or more kinds thereof.

The curable compound is a compound having curable group, and a known compound capable of undergoing a crosslinking reaction by a radical, an acid, a base, or the like can be used. The term curable group means a group capable of undergoing a crosslinking reaction by actinic rays, radiation, a radical, an acid, or a base, and preferred examples thereof include a group having an ethylenically unsaturated bond, a hydroxymethyl group, an acyloxymethyl group, an alkoxymethyl group, an epoxy group, an oxetanyl group, and a benzoxazolyl group. The compound having an ethylenically unsaturated bond used in the present invention is more preferably a compound having 2 or more ethylenically unsaturated groups, still more preferably a compound having 2 to 6 ethylenically unsaturated groups, and particularly preferably a compound having 2 to 4 ethylenically unsaturated groups.

The compound having an ethylenically unsaturated bond used in the present invention is more preferably a compound having 2 or more ethylenically unsaturated groups, still more preferably a compound having 2 to 6 ethylenically unsaturated groups, and particularly preferably a compound having 2 to 4 ethylenically unsaturated groups.

The curable compound may be in any of chemical forms, for example, a monomer, a prepolymer, an oligomer, or a mixture thereof, and a multimer thereof.

In the present invention, a curable compound of a monomer type (hereinafter, also referred to as a curable monomer) is a compound different from the polymer compound. The curable monomer is typically a low-molecular-weight compound, preferably a low-molecular-weight compound having a molecular weight of 2,000 or less, more preferably a low-molecular-weight compound having a molecular weight of 1,500 or less, and still more preferably a low-molecular-weight compound having a molecular weight of 900 or less. In addition, the molecular weight of the curable monomer is usually 100 or more.

In addition, a curable compound of an oligomer type is typically a polymer having a relatively low molecular weight, and preferably a polymer in which 10 to 100 curable monomers are bonded. The molecular weight thereof is preferably 2,000 to 20,000, more preferably 2,000 to 15,000, and most preferably 2,000 to 10,000, as a weight-average molecular weight in terms of polystyrene by a gel permeation chromatography (GPC) method.

The number of functional groups in a curable compound in the present invention refers to the number of curable groups in one molecule.

From the viewpoint of resolution, the curable compound preferably contains at least one bifunctional or higher-functional curable compound containing two or more curable groups, and more preferably contains at least one trifunctional or higher-functional curable compound.

In addition, in a view of being able to improve heat resistance through the formation of a three-dimensional crosslinked structure, the curable compound in the present invention preferably contains at least one trifunctional or higher-functional curable compound. Further, the curable compound may be a mixture of a bifunctional or lower-functional curable compound and a trifunctional or higher-functional curable compound.

<<Compound Having Ethylenically Unsaturated Bond>>

The group having an ethylenically unsaturated bond is preferably a styryl group, a vinyl group, a (meth)acryloyl group, or a (meth)allyl group, and more preferably a (meth)acryloyl group.

Specific examples of the compound having an ethylenically unsaturated bond include an unsaturated carboxylic acid (for example, acrylic acid, methacrylic acid, itaconic acid, crotonic acid, isocrotonic acid, and maleic acid), its esters and amides, and multimers thereof. Esters of an unsaturated carboxylic acid and a polyhydric alcohol compound, amides of an unsaturated carboxylic acid and a polyvalent amine compound, and multimers thereof are preferable. Also, addition reaction products of unsaturated carboxylic esters or amides having a nucleophilic substituent, for example, a hydroxyl group, an amino group, and a mercapto group, with monofunctional or polyfunctional isocyanates or epoxy compounds, and dehydration condensation reaction products with a monofunctional or polyfunctional carboxylic acid are also suitably used. Further, addition reaction products of unsaturated carboxylic esters or amides having an electrophilic substituent, for example, an isocyanate group and an epoxy group, with monofunctional or polyfunctional alcohols, amines or thiols, and substitution reaction products of unsaturated carboxylic esters or amides having a leaving substituent, for example, a halogen group and a tosyloxy group, with monofunctional or polyfunctional alcohols, amines or thiols are also suitable. As other examples, a group of compounds where the unsaturated carboxylic acid described above is replaced by an unsaturated phosphonic acid, a vinylbenzene derivative, for example, styrene, vinyl ether, and allyl ether may also be used.

Specific examples of the monomer, which is an ester of a polyhydric alcohol compound with an unsaturated carboxylic acid, include, as an acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethylol propanetriacrylate, trimethylol propanetri(acryloyloxypropyl)ether, trimethylol ethanetriacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritolhexaacrylate, pentaerythritol tetraacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide-modified triacrylate, and a polyester acrylate oligomer.

Examples of the methacrylic ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxphenyl]dimethylmethane, and bis-[p-(methacryloxyethoxy)phenyl]dimethylmethane.

Examples of the itaconic ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic ester include ethylene glycol dicrotonate, tetramethylene glycol dicrotonate, pentaerythritol dicrotonate, and sorbitol tetradicrotonate.

Examples of the isocrotonic ester include ethylene glycol diisocrotonate, pentaerythritol diisocrotonate, and sorbitol tetraisocrotonate.

Examples of the maleic ester include ethylene glycol dimaleate, triethylene glycol dimaleate, pentaerythritol dimaleate, and sorbitol tetramaleate.

As other examples of the ester, for example, the aliphatic alcohol esters described in JP1971-27926B (JP-S46-27926B), JP1976-47334B (JP-S51-47334B), and JP1982-196231A (JP-S57-196231A), the esters having an aromatic skeleton described in JP1984-5240A (JP-S59-5240A), JP1984-5241A (JP-S59-5241A), and JP1990-226149A (JP-H02-226149A), and the esters containing an amino group described in JP1989-165613A (JP-H01-165613A) are also suitably used.

Furthermore, specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bis-methacrylamide, diethylenetriamine trisacrylamnide, xylylene bisacrylamide, and xylylene bismethacrylamide.

Other preferred examples of the amide monomer include monomers having a cyclohexylene structure described in JP1979-21726B (JP-S54-21726B).

Moreover, urethane-based addition polymerizable monomers produced using an addition reaction between an isocyanate and a hydroxyl group are also suitable, and specific examples thereof include vinylurethane compounds having two or more polymerizable vinyl groups per molecule obtained by adding a vinyl monomer containing a hydroxyl group to a polyisocyanate compound having two or more isocyanate groups per molecule, described in JP1973-41708B (JP-S48-41708B).

In addition, the urethane acrylates as described in JP1976-37193A (JP-S51-37193A), JP1990-32293B (JP-H02-32293B), and JP1990-16765B (JP-H02-16765B), and the urethane compounds having an ethylene oxide skeleton as described in JP1983-49860B (JP-S58-49860B), JP1981-17654B (JP-S56-17654B), JP1987-39417B (JP-S62-39417B), and JP1987-39418B (JP-S62-39418B) are also suitable.

Also, as the compound having an ethylenically unsaturated bond, the compounds described in paragraph Nos. 0095 to 0108 of JP2009-288705A can also be suitably used in the present invention.

Furthermore, the compound having an ethylenically unsaturated bond is also preferably a compound having a boiling point of 100° C. or higher under normal pressure. Examples thereof include a monofunctional acrylate or methacrylate such as polyethylene glycol mono(meth)acrylate, polypropylene glycol mono(meth)acrylate, and phenoxyethyl (meth)acrylate; a polyfunctional acrylate or methacrylate, such as polyethylene glycol di(meth)acrylate, trimethylolethane tri(meth)acrylate, neopentyl glycol di(meth)acrylate, pentaerythritol tri(meth)acrylate, pentacrythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a compound obtained by adding ethylene oxide or propylene oxide to a polyfunctional alcohol such as glycerin or trimethylolethane, followed by (meth)acrylation, urethane (meth)acrylates as described in JP1973-41708B (JP-S48-41708B), JP1975-6034B (JP-S50-6034B) and JP1976-37193A (JP-S51-37193A), polyester acrylates described in JP1973-64183A (JP-S48-64183A), JP1974-43191B (JP-S49-43191B), and JP1977-30490B (JP-S52-30490B), and epoxy acrylates as a reaction product of an epoxy resin and a (meth)acrylic acid; and a mixture thereof. In addition, the compounds described in paragraph Nos. 0254 to 0257 of JP2008-292970A are also suitable. A polyfunctional (meth)acrylate obtained by reacting a polyfunctional carboxylic acid with a compound having a cyclic ether group and an ethylenically unsaturated bond, such as glycidyl (meth)acrylate, may also be exemplified.

Furthermore, as other preferred compounds having an ethylenically unsaturated bond, compounds having a fluorene ring and containing two or more groups having an ethylenically unsaturated bond described in JP2010-160418A, JP2010-129825A and Japanese Patent No. 4364216, and a cardo resin can also be used.

In addition, as other examples of the compound having an ethylenically unsaturated bond, specific unsaturated compounds described in JP1971-43946B (JP-S46-43946B), JP1989-40337B (JP-H01-40337B) and JP1989-40336B (JP-H01-40336B), and vinylphosphonic acid compounds described in JP1990-25493A (JP-H02-25493A) can also be exemplified. In some cases, a structure containing a perfluoroalkyl group described in JP1986-22048A (JP-S61-22048A) is suitably used. In addition, photocurable monomers or oligomers described in Journal of Japan Adhesiveness Society, Vol. 20, No. 7, pp. 300 to 308 (1984) can also be used.

Moreover, compounds each having an ethylenically unsaturated bond represented by General Formulae (MO-1) to (MO-5) can also be suitably used. Further, in the formulae, in a case where T is an oxyalkylene group, the terminal on the carbon atom side thereof is bonded to R.

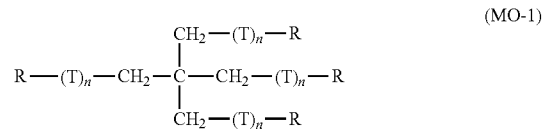

(MO-1)

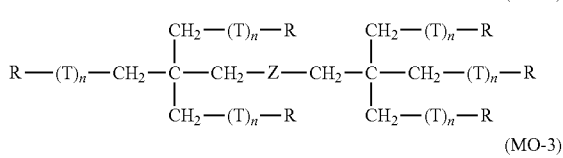

(MO-2)

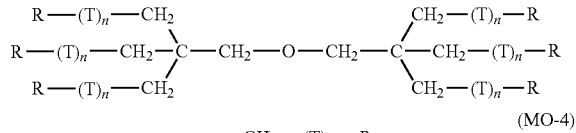

(MO-3)

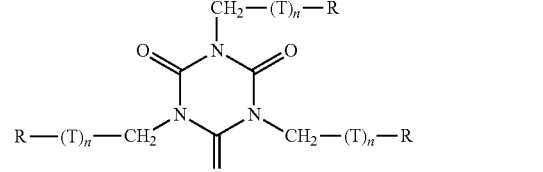

(MO-4)

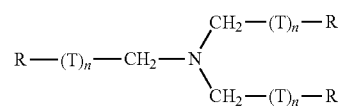

(MO-5)

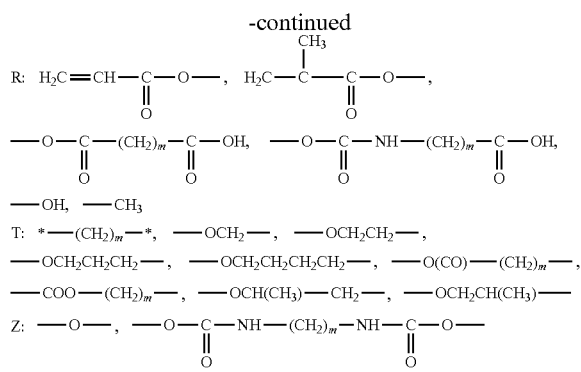

In the general formulae, n is an integer of 0 to 14 and m is an integer of 1 to 8. In a case where a plurality of R's or a plurality of T's are present in one molecule, a plurality of R's or a plurality of T's may be the same as or different from each other.

In each of the polymerizable compounds represented by General Formulae (MO-1) to (MO-5), at least one of a plurality of R's represents a group represented by —OC(=O)CH=CH$_2$ or —OC(=O)C(CH$_3$)CH$_2$.

As to specific examples of the compounds having an ethylenically unsaturated bond represented by General Formulae (MO-1) to (MO-5), the compounds described in paragraph Nos. 0248 to 0251 of JP2007-269779A can also be suitably in the present invention.

Furthermore, the compounds obtained by adding ethylene oxide or propylene oxide to a polyfunctional alcohol and then (meth)acrylating the adduct, described as General Formulae (1) and (2) together with their specific examples in JP1998-62986A (JP-H10-62986A), can also be used as the polymerizable compound.

Preferred examples of the compound having an ethylenically unsaturated bond include dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA, manufactured by Nippon Kayaku Co., Ltd.), and structures in which the (meth)acryloyl group of the compounds described above are connected through ethylene glycol or propylene glycol residue. Oligomer types of these compounds can also be used.

The compound having an ethylenically unsaturated bond may be a polyfunctional monomer having an acid group such as a carboxyl group, a sulfonic acid group or a phosphoric acid group. The polyfunctional monomer having an acid group is preferably an ester of an aliphatic polyhydroxy compound and an unsaturated carboxylic acid, more preferably a polyfunctional monomer which is obtained by reacting a non-aromatic carboxylic anhydride with an unreacted hydroxyl group of the aliphatic polyhydroxy compound to introduce the acid group, and particularly preferably the ester described above where the aliphatic polyhydroxy compound is pentaerythritol and/or dipentaerythritol. Examples of the commercially available product thereof include M-510 and M-520, as polybasic acid-modified acryl oligomers manufactured by Toagosei Co., Ltd.

The polyfunctional monomers having an acid group may be used alone or in combination of two or more kinds thereof. Further, a polyfunctional monomer having no acid group and a polyfunctional monomer having an acid group may be used in combination, if desired.

The acid value of the polyfunctional monomer having an acid group is preferably 0.1 to 40 mgKOH/g, and particularly preferably 5 to 30 mgKOH/g. If the acid value of the polyfunctional monomer is within the above range, the production or handleability thereof becomes excellent and furthermore, developability becomes excellent. In addition, curability is favorable.

The compound having an ethylenically unsaturated bond can also employ a compound having a caprolactone structure.

The compound having a caprolactone structure and an ethylenically unsaturated bond is not particularly limited as long as it has a caprolactone structure in the molecule thereof, and examples thereof include an ε-caprolactone-modified polyfunctional (meth)acrylate obtained by esterification of a polyhydric alcohol, for example, trimethylolethane, ditrimethylolethane, trimethylolpropane, ditrimethylolpropane, pentaerythritol, dipentaerythritol, tripentaerythritol, glycerin, diglycerol or trimethylolmelamine with (meth)acrylic acid and ε-caprolactone. Among those, preferred is a polymerizable compound having a caprolactone structure represented by General Formula (C).

General Formula (C)

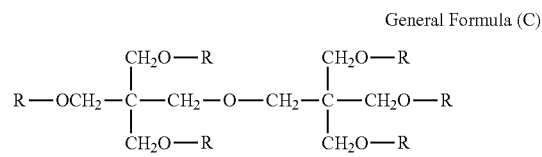

(In the formula, all of six R's are a group represented by General Formula (D), or one to five of six R's are a group represented by General Formula (D) and the remainder is a group represented by General Formula (E).)

General Formula (D)

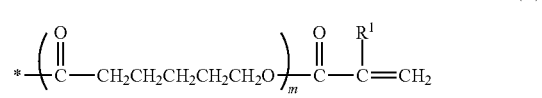

(In the formula, all of six R's are a group represented by General Formula (D), or one to five of six R's are a group represented by General Formula (D) and the remainder is a group represented by General Formula (E).)

General Formula (E)

(In the formula, R$^1$ represents a hydrogen atom or a methyl group, m represents the number of 1 or 2, and "*" represents a bonding arm.)

The polymerizable compound having a caprolactone structure is commercially available as KAYARAD DPCA Series from Nippon Kayaku Co., Ltd. and includes DPCA- 20 (compound represented by General Formulae (C) to (E), in which m is 1, the number of the group represented by General Formula (D) is 2, and all of $R^1$ are a hydrogen atom), DPCA-30 (compound represented by General Formulae (C) to (E), in which m is 1, the number of the group represented by General Formula (D) is 3, and all of $R^1$ are a hydrogen atom), DPCA-60 (compound represented by General Formulae (C) to (E), in which m is 1, the number of the group represented by General Formula (D) is 6, and all of $R^1$ are a hydrogen atom), and DPCA-120 (compound represented by General Formulae (C) to (E), in which m is 2, the number of the group represented by General Formula (D) is 6, and all of $R^1$ are a hydrogen atom).

In the present invention, the compound having an ethylenically unsaturated bond having a caprolactone structure may be used alone or in combination of two or more kinds thereof.

The compound having an ethylenically unsaturated bond is also preferably at least one selected from the group of compounds represented by General Formula (i) or (ii).

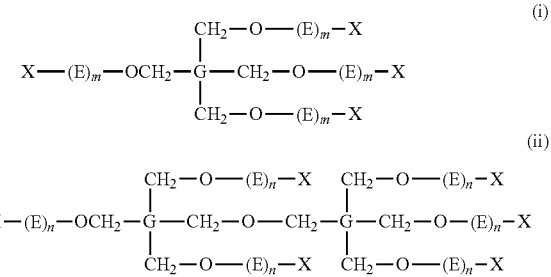

In General Formulae (i) and (ii), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In General Formula (i), the total number of (meth)acryloyl groups is 3 or 4, m's each independently represent an integer of 0 to 10, and the total of the respective m's is an integer of 0 to 40, provided that in a case where the total number of each m is 0, any one of X's is a carboxyl group.

In General Formula (ii), the total number of (meth) acryloyl groups is 5 or 6, n's each independently represent an integer of 0 to 10, and the total number of each n is an integer of 0 to 60, provided that in a case where the total number of each n is 0, any one of X's is a carboxyl group.

In General Formula (i), m is preferably an integer of 0 to 6, and more preferably an integer of 0 to 4.

The total of the respective m's is preferably an integer of 2 to 40, more preferably an integer of 2 to 16, and particularly preferably an integer of 4 to 8.

In General Formula (ii), n is preferably an integer of 0 to 6, and more preferably an integer of 0 to 4.

The total of the respective n's is preferably an integer of 3 to 60, more preferably an integer of 3 to 24, and particularly preferably an integer of 6 to 12.

An aspect in which in $-((CH_2)_yCH_2O)-$ or $-((CH_2)_yCH(CH_3)O)-$ in General Formula (i) or (ii), the terminal on the oxygen atom side is bonded to X is preferable. In particular, an aspect in which all of six X's in General Formula (ii) are acryloyl groups is preferable.

The compound represented by General Formula (i) or General Formula (ii) can be synthesized through a step of connecting a ring-opened skeleton of ethylene oxide or propylene oxide to pentaerythritol or dipentaerythritol by a ring-opening addition reaction, and a step of introducing a (meth)acryloyl group into the terminal hydroxyl group of the ring-opened skeleton by reacting, for example, (meth)acryloyl chloride, which are steps known in the related art. Each step is a well-known step and the compound represented by General Formula (i) or (ii) can be easily synthesized by a person skilled in the art.

Among the compounds represented by General Formulae (i) and General Formula (ii), a pentaerythritol derivative and/or a dipentaerythritol derivative is/are more preferable.

Specific examples of the compounds include compounds represented by Formulae (a) to (f) (hereinafter also referred to as "Exemplary Compounds (a) to (f)"). Among those, Exemplary Compounds (a), (b), (e), and (f) are preferable.

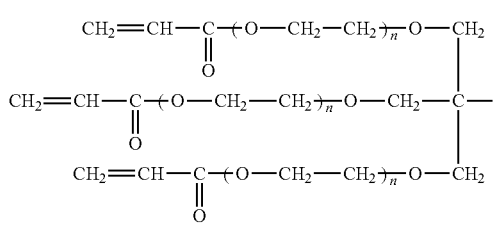 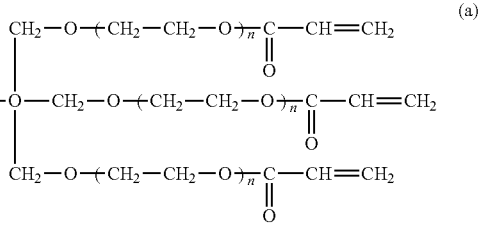

(a)

(the sum of the respective n's is 6)

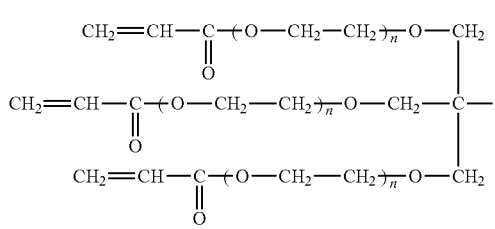 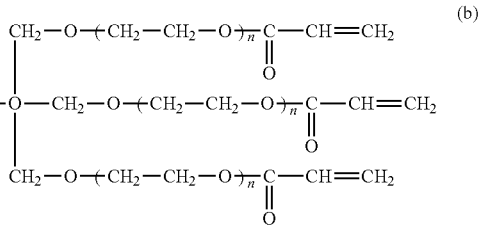

(b)

(the sum of the respective n's is 12)

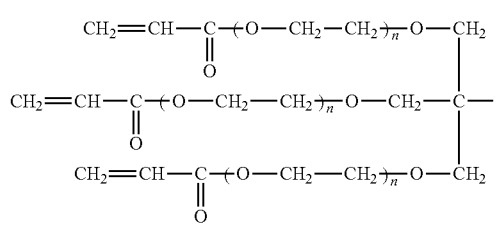
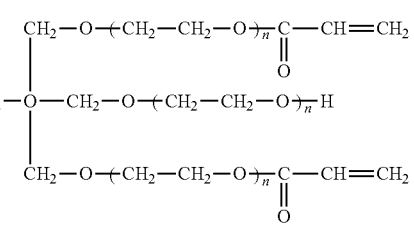

(c)

(the sum of the respective n's is 12)

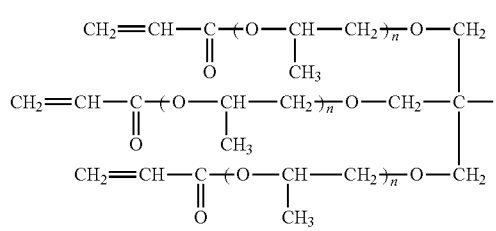
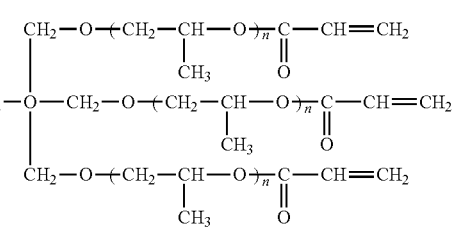

(d)

(the sum of the respective n's is 6)

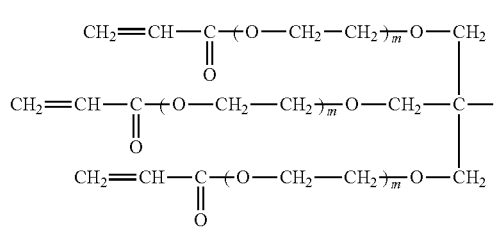

(e)

(the sum of the respective m's is 4)

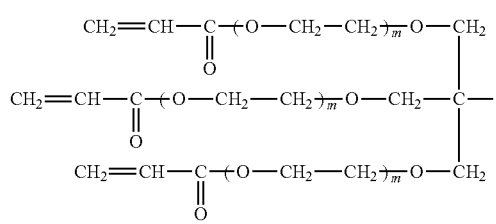

(f)

(the sum of the respective m's is 12)

Examples of commercially available products of the polymerizable compounds represented by General Formulae (i) and General Formulae (ii) include SR-494, which is a tetrafunctional acrylate having four ethyleneoxy chains, manufactured by Sartomer Company, and DPCA-60, which is a hexafunctional acrylate having six pentyleneoxy chains and TPA-330, which is a trifunctional acrylate having three isobutyleneoxy chains, both manufactured by Nippon Kayaku Co., Ltd.

Furthermore, urethane acrylates as described in JP1973-41708B (JP-S48-41708B), JP1976-37193A (JP-S51-37193A), JP1990-32293B (JP-H02-32293B), and JP1990-16765B (JP-H02-16765B), and urethane compounds having an ethylene oxide skeleton described in JP1983-49860B (JP-S58-49860B), JP1981-17654B (JP-S56-17654B), JP1987-39417B (JP-S62-39417B) and JP1987-39418B (JP-S62-39418B) are also suitable as the compound having an ethylenically unsaturated bond. In addition, addition-polymerizable monomers having an amino structure or a sulfide structure in the molecule thereof described in JP 1988-277653A (JP-S63-277653A), JP1988-260909A (JP-S63-260909A) and JP1989-105238A (JP-H01-105238A) may also be used as the compound having an ethylenically unsaturated bond.

Examples of commercially available products of the compound having an ethylenically unsaturated bond include Urethane Oligomers UAS-10 and UAB-140 (manufactured by Sanyo Kokusaku Pulp Co., Ltd.), NK Ester M-40G, NK Ester 4G. NK Ester M-9300, NK Ester A-9300, and UA-7200 (manufactured by Shin-Nakamura Chemical Co, Ltd.), DPHA-40H (manufactured by Nippon Kayaku Co., Ltd.), UA-306H, UA-306T, UA-3061, AH-600, T-600, and AI-600 (manufactured by Kyoeisha Chemical Co., Ltd.), and BLEMMER PME400 (manufactured by NOF Co., Ltd.).

From the viewpoint of heat resistance, the compound having an ethylenically unsaturated bond preferably has a partial structure represented by the following formula. Here, * in the formula is a bonding arm.

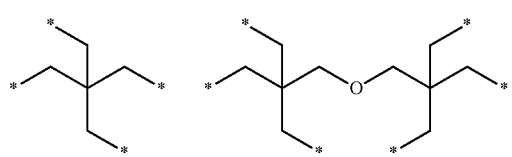

-continued

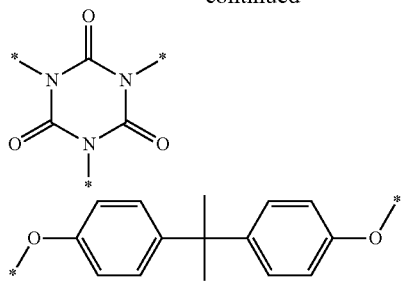

Specific examples of the compound having an ethylenically unsaturated bond having a partial structure include trimethylolpropane tri(meth)acrylate, isocyanuric acid ethylene oxide-modified di(meth)acrylate, isocyanuric acid ethylene oxide-modified tri(meth)acrylate, pentaerythritol tri(meth)acrylate, pentaerythritol tetra(meth)acrylate, dimethylolpropane tetra(meth)acrylate, dipentaerythritol penta(meth)acrylate, dipentaerythritol hexa(meth)acrylate, and tetramethylolmethane tetra(meth)acrylate, and these polymerizable compounds can be particularly preferably used in the present invention.

From the viewpoints of good curability and heat resistance, the content of the compound having an ethylenically unsaturated bond in the photosensitive resin composition is preferably 1% to 50% by mass with respect to the total solid content of the photosensitive resin composition. The lower limit is more preferably 5% by mass or more. The upper limit is more preferably 30% by mass or less, and still preferably 25% by mass or less. The compounds having an ethylenically unsaturated bond may be used alone or in combination of two or more kinds thereof.

Furthermore, the mass ratio of the heterocycle-containing polymer precursor to the compound having an ethylenically unsaturated bond (heterocycle-containing polymer precursor/polymerizable compound) is preferably 98/2 to 10/90, more preferably 95/5 to 30/70, still more preferably 90/10 to 50/50, and even still more preferably 90/10 to 70/30. If the mass ratio of the heterocycle-containing polymer precursor to the compound having an ethylenically unsaturated bond is within the above range, a cured film having excellent curability and heat resistance can be formed.

The compound having an ethylenically unsaturated bond may be used singly or in combination of two or more kinds thereof. In a case of using the combination of two or more kinds, a total amount thereof is preferably within the above range.

<Compound Having Hydroxymethyl Group, Alkoxymethyl Group, or Acyloxymethyl Group>

The compound having a hydroxymethyl group, an alkoxymethyl group, or an acyloxymethyl group is preferably a compound represented by General Formula (AM1).

 (AM1)

(In the formula, t represents an integer of 1 to 20, $R^4$ represents a t-valent organic group having 1 to 200 carbon atoms, and $R^5$ represents a group represented by General Formula (AM2) or (AM3).)

(In the formulae, $R^6$ represents a hydroxyl group or an organic group having 1 to 10 carbon atoms.)

The content of the compound represented by General Formula (AM1) is preferably from 5 parts by mass to 40 parts by mass, and preferably from 10 parts by mass to 35 parts by mass, with respect to 100 parts by mass of the heterocycle-containing polymer precursor. In addition, it is preferable that the amount of a compound represented by General Formula (AM4) in the entire curable compound is from 10% by mass to 90% by mass, and the amount of a compound represented by General Formula (AM5) in the entire thermal crosslinking agent is from 10% by mass to 90% by mass.

These compounds may be used singly or in combination of two or more kinds thereof. In a case of using the combination of two or more kinds, a total amount thereof is preferably within the above range.

 (AM4)

(In the formula, $R^4$ represents a divalent organic group having 1 to 200 carbon atoms, and $R^1$ represents a group represented by General Formula (AM2) or (AM3).)

 (AM5)

(In the formula, u represents an integer of 3 to 8, $R^4$ represents an u-valent organic group having 1 to 200 carbon atoms, and $R^5$ represents a group represented by General Formula (AM2) or (AM3).)

 (AM2)

 (AM3)

(In the formula, $R^6$ represents a hydroxyl group or an organic group having 1 to 10 carbon atoms.)

With this range, in a case where a photosensitive resin composition is formed on a substrate having concaves and convexes by using these compounds, generation of cracks is further reduced. Further, the pattern processability is excellent, and high heat resistance with a 5%-mass reduction temperature of 350° C. or higher, and more preferably 380° C. or higher can be attained. Specific examples of the compound represented by General Formula (AM4) include 46DMOC and 46DMOEP (both trade names, manufactured by Asahi Organic Chemicals Industry Co., Ltd.), DML-MBPC, DML-MBOC, DML-OCHP, DML-PCHP, DML-PC, DML-PTBP, DML-34X, DML-EP, DML-POP, dimethyol BisOC-P, DML-PFP, DML-PSBP, and DML-MTrisPC (all trade names, manufactured by Honshu Chemical Industry Co., Ltd.), NIKALAC MX-290 (trade name, manufactured by Sanwa Chemical Co., Ltd.), 2,6-dimethoxymethyl-4-t-buthylphenol, 2,6-dimethoxymethyl-p-cresol, and 2,6-diacetoxymethyl-p-cresol.

In addition, specific examples of the compound represented by General Formula (AM5) include TriML-P, TriML-35XL, TML-HQ, TML-BP, TML-pp-BPF, TML-BPA, TMOM-BP, HML-TPPHBA, HML-TPHAP, HMOM-TPPHBA, and HMOM-TPHAP (all trade names, manufactured by Honshu Chemical Industry Co., Ltd.), TM-BIP-A (trade name, manufactured by Asahi Organic Chemicals Industry Co., Ltd.), and NIKALAC MX-280, NIKALAC MX-270, and NIKALACMW-100LM (all trade names, manufactured by Sanwa Chemical Co., Ltd.).

<Epoxy Compound (Compound Having Epoxy Group)>

The epoxy compound is preferably a compound having 2 or more epoxy groups within one molecule. The epoxy compound undergoes a crosslinking reaction at 200° C. or lower, but does not undergo a dehydration reaction in the crosslinking reaction, and therefore, film shrinkage hardly occurs. As a result, incorporation of the epoxy compound is effective for reduction in curing at a low temperature and warping of the photosensitive resin composition.

The epoxy compound preferably contains a polyethylene oxide group. Thus, the modulus of elasticity is further reduced, and the warping can also be further reduced. Further, since the flexibility is high, a cured film having excellent elongation or the like can be obtained. The polyethylene oxide group means that it has the number of the repeating units of ethylene oxide of 2 or more, with the number of the repeating units of 2 to 15 being preferable.

Preferred examples of the epoxy compound include, but are not limited to, a bisphenol A type epoxy resin; a bisphenol F type epoxy resin; an alkylene glycol type epoxy resin such as propylene glycol diglycidyl ether; a polyalkylene glycol type epoxy resin such as polypropylene glycol diglycidyl ether; and an epoxy group-containing silicone such as polymethyl(glycidyloxypropyl)siloxane. Specific examples thereof include EPICLON (registered trademark) 850-S, EPICLON (registered trademark) HP-4032, EPICLON (registered trademark) HP-7200, EPICLON (registered trademark) HP-820, EPICLON (registered trademark) HP-4700, EPICLON (registered trademark) EXA-4710, EPICLON (registered trademark) HP-4770, EPICLON (registered trademark) EXA-859CRP, EPICLON (registered trademark) EXA-1514, EPICLON (registered trademark) EXA-4880, EPICLON (registered trademark) EXA-4850-150, EPICLON (registered trademark) EXA-4850-1000, EPICLON (registered trademark) EXA-4816, and EPICLON (registered trademark) EXA-4822 (all trade names, manufactured by Dainippon Ink and Chemicals, Inc.), RIKARESIN (registered trademark) BEO-60E (all trade names, manufactured by New Japan Chemical Co., Ltd.), and EP-4003S and EP-4000S (both trade names, manufactured by ADEKA Corporation). Among these, the polyethylene oxide group-containing epoxy resin is preferable in a view that it is excellent in low warping and heat resistance. For example, EPICLON (registered trademark) EXA-4880, EPICLON (registered trademark) EXA-4822, and RIKARESIN (registered trademark) BEO-60E are preferable since they each contain a polyethylene oxide group.

The content of the epoxy compound is preferably 5 to 50 parts by mass, more preferably 10 to 50 parts by mass, and still more preferably 10 to 40 parts by mass, with respect to 100 parts by mass of the heterocycle-containing polymer precursor. If the blend amount is 5 parts by mass or more, the warping of the cured film can be further suppressed, and if the blend amount is 50 parts by mass or less, pattern embedment accompanying a reflow during the final heating (curing) can be further suppressed.

The epoxy compound may be used singly or in combination of two or more kinds thereof. In a case of using the epoxy compounds in combination of two or more kinds thereof, a total amount thereof is preferably within the above range.

<Oxetane Compound (Compound Having Oxetanyl Group)>

The oxetane compound is a compound having two or more oxetane rings within one molecule, and examples thereof include 3-ethyl-3-hydroxymethyl oxetane, 1,4-bis{[(3-ethyl-3-oxetanyl)methoxy]methyl}benzene, 3-ethyl-3-(2-ethylhexylmethyl)oxetane, and 1,4-benzenedicarboxylic acid-bis[(3-ethyl-3-oxetanyl)methyl] ester. As specific examples thereof, ARON Oxetane series (for example, OXT-121, OXT-221, OXT-191, and OXT-223) manufactured by Toagosei Chemical Industry Co., Ltd. can be suitably used, and these may be used singly or as a mixture of two or more kinds thereof.

The content of the oxetane compound is preferably 5 to 50 parts by mass, more preferably 10 to 50 parts by mass, and still more preferably 10 to 40 parts by mass, with respect to 100 parts by mass of the heterocycle-containing polymer precursor.

The oxetane compound may be used singly or in combination of two or more kinds thereof. In a case of using the oxetane compounds in combination of two or more kinds thereof, a total amount thereof is preferably within the above range.

<Benzoxazine Compound (Compound Having Benzoxazolyl Group)>

In the benzoxazine compound, a crosslinking reaction occurs by a side reaction of ring opening, and therefore, degassing which accompanies the curing does not occur and the shrinkage due to heat is small. As a result, occurrence of the warping can be suppressed.

Preferred examples of the benzoxazine compound include a B-a type benzoxazine and a B-m type benzoxazine (both trade names, manufactured by Shikoku Chemicals Corporation), a benzoxazine adduct of a polyhydroxystyrene resin, and a phenol novolac type dihydrobenzoxazine compound. These may be used singly or as a mixture of two or more kinds thereof.

The content of the benzoxazine compound is preferably 5 to 50 parts by mass, more preferably 10 to 50 parts by mass, and still more preferably 10 to 40 parts by mass, with respect to 100 parts by mass of the heterocycle-containing polymer precursor.

The benzoxazine compound may be used singly or in combination of two or more kinds thereof. In a case of using the benzoxazine compounds in combination of two or more kinds thereof, a total amount thereof is preferably within the above range.

<Photoradical Polymerization Initiator>

The photosensitive resin composition of the present invention may include a photoradical polymerization initiator. By incorporating the photoradical polymerization initiator into the photosensitive resin composition, the photosensitive resin composition is applied onto a semiconductor wafer or the like to form a composition layer in the form of a layer shape, and then irradiated with light to cause curing due to radicals, and thus, dissolution in the areas irradiated with light can be reduced. As a result, for example, by exposing the composition layer via a photomask having a pattern that masks only an electrode portion, there is an advantage that regions having different solubilities depending on the patterns of the electrodes can be simply prepared.

The photoradical polymerization initiator is not particularly limited as long as it has an ability of initiating a polymerization reaction (crosslinking reaction) of the polymerizable compound, and can be appropriately selected from known photoradical polymerization initiators. For example, it is preferable to have photosensitivity to rays ranging from an ultraviolet ray region to a visible light region. In addition, the photoradical polymerization initiator may be an activator which causes a certain reaction with a photoexcited sensitizer to produce an active radical.

The photoradical polymerization initiator preferably contains at least one compound having a molar light absorption coefficient of at least about 50 within the range of about 300 to 800 nm (preferably 330 to 500 nm). The molar light absorption coefficient of the compound can be measured using a known method. It is preferably measured by means of, for example, an ultraviolet and visible light spectrophotometer (Cary-5 spectrophotometer manufactured by Varian) by using an ethyl acetate solvent at a concentration of 0.01 g/L.

As the photoradical polymerization initiator, known compounds can be used without limitation, but examples thereof include halogenated hydrocarbon derivatives (for example, a derivative having a triazine skeleton, a derivative having an oxadiazole skeleton, and a derivative having a trihalomethyl group), acylphosphine compounds such as acylphosphine oxide, oxime compounds such as hexaaryl biimidazole and an oxime derivative, organic peroxide, thio compounds, ketone compounds, aromatic onium salts, ketoxime ethers, aminoacetophenone compounds, hydroxyacetophenone, azo-based compounds, azide compounds, metallocene compounds, organic boron compounds, and iron-arene complexes.

Examples of the halogenated hydrocarbon derivative having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A.

Examples of the compounds described in U.S. Pat. No. 4,212,976A include a compound having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, and 2-tribromomethyl-5-styryl-1,3,4-oxadiazole).

Furthermore, examples of the photoradical polymerization initiator other than those described above include the compounds described in Paragraph No. 0086 of JP2015-087611A, JP1978-133428A (JP-S53-133428A), JP1982-1819A (JP-S57-1819A), JP1982-6096A (JP-S57-6096A), and U.S. Pat. No. 3,615,455A, and the like, the contents of which are incorporated herein.

Examples of the ketone compound include the compounds described in paragraph No. 0087 of JP2015-087611A, the contents of which are incorporated herein.

As a commercially available product thereof, KAYACURE DETX (manufactured by Nippon Kayaku Co., Ltd.) is also suitably used.

As the metallocene compound, any compound capable of generating an active radical upon irradiation with light is available. Examples thereof include the titanocene compounds described in JP1984-152396A (JP-S59-152396A), JP1986-151197A (JP-S61-151197A) JP1988-41484A (JP-S63-41484A), JP1990-249A (JP-H02-249A), JP1990-291A (JP-H02-291A), and JP1990-4705A (JP-H02-4705A), and the iron-arene complexes described in JP1989-304453A (JP-H01-304453A) and JP1989-152109A (JP-H01-152109A). The metallocene compound is preferably a titanocene compound.

Specific examples of the titanocene compound include bis(cyclopentadieny)-Ti-di-chloride, bis(cyclopentadieny)-Ti-bis-phenyl, bis(cyclopentadieny)-Ti-bis(2,3,4,5,6-pentafluorophenyl), bis(cyclopentadieny)-Ti-bis(2,3,5,6-tetrafluorophenyl), bis(cyclopentadieny)-Ti-bis(2,4,6-trifluorophenyl), bis(cyclopentadieny)-Ti-bis(2,6-difluorophenyl), bis(cyclopentadieny)-Ti-bis(2,4-difluorophenyl), bis(methylcyclopentadieny)-Ti-bis(2,3,4,5,6-pentafluorophenyl), bis(methylcyclopentadieny)-Ti-bis(2,3,5,6-tetrafluorophenyl), bis(methylcyclopentadieny)-Ti-bis(2,6-difluorophenyl), bis(cyclopentadieny)-bis(2,6-difluoro-3-(pyr-1-yl)phenyl)titanium, bis(cyclopentadieny)-bis(2,4,6-trifluoro-3-(pyr-1-yl)phenyl)titanium, and bis(cyclopentadieny)-bis(2,4,6-trifluoro-3-(2-5-dimethylpyr-1-yl)phenyl)titanium, with bis(cyclopentadieny)-bis(2,6-difluoro-3-(pyr-1-yl)phenyl) titanium being preferable.

Furthermore, specific examples of the metallocene compound include bis(cyclopentadieny)bis[2,6-difluoro-3-(methylsulfonamide)phenyl]titanium, bis(cyclopentadieny) bis[2,6-difluoro-3-(N-butylbiaroyl-amino)phenyl]titanium, bis(cyclopentadieny)bis[2,6-difluoro-3-(N-butyl-(4-chlorobenzoyl)amino)phenyl]titanium, bis(cyclopentadieny)bis[2,6-difluoro-3-(N-benzyl-2,2-dimethylpentanoylamino)phenyl]titanium, bis(cyclopentadieny)bis[2,6-difluoro-3-(N-(2-ethylhexyl)-4-tolyl-sulfonylamino)phenyl]titanium, bis(cyclopentadieny)bis[2,6-difluoro-3-(N-(3-oxaheptyl)benzoylamino)phenyl]titanium, bis(cyclopentadieny)bis[2,6-difluoro-3-(N-(3,6-dioxadecyl)benzoylamino)phenyl]titanium, bis(cyclopentadieny)bis[2,6-difluoro-3-(trifluoromethylsulfonylamino)phenyl]titanium, bis(cyclopentadieny)bis[2,6-difluoro-3-(trifluoroacetylamino)phenyl]titanium, bis(cyclopentadieny)bis[2,6-difluoro-3-(2-chlorobenzoyl)aminophenyl]titanium, bis(cyclopentadieny)bis[2,6-difluoro-3-(4-chlorobenzoylamino)phenyl]titanium, bis(cyclopentadieny)bis[2,6-difluoro-3-(N-(3,6-dioxadecyl)-2,2-dimethylpentanoylamino)phenyl]titanium, bis(cyclopentadieny)bis[2,6-difluoro-3-(N-(3,7-dimethyl-7-methoxyoctyl)benzoylamino)phen yl]titanium, and bis(cyclopentadieny)bis[2,6-difluoro-3-(N-cyclohexylbenzoylamino)phenyl]titanium.

As the metallocene compound, a commercially available product thereof may be used, and examples thereof include IRGACURE-727 (manufactured by BASF) as the bis (methylcyclopentadienyl)-Ti-bis(2,6-difluorophenyl), and IRUGACURE-784 (manufactured by BASF Corporation) as the bis(cyclopentadieny)-bis(2,6-difluoro-3-(pyr-1-yl)phenyl) titanium.

As the photoradical polymerization initiator, a hydroxyacetophenone compound, an aminoacetophenone compound and an acylphosphine compound can also be preferably used. More specifically, for example, the aminoacetophenone initiator described in JP1998-291969A (JP-H10-291969A) and the acylphosphine oxide initiator described in JP4225898B can also be used.

As the hydroxyacetophenone-based initiator, IRGACURE-184 (IRGACURE is a registered trademark), DAROCUR-173, TRGACURE-500, IRGACURE-2959, and IRGACURE-127 (trade names: all manufactured by BASF Corp.) can be used.

As the aminoacetophenone-based initiator, commercially available products of IRGACURE-907, IRGACURE-369, and IRGACURE-379 (trade names, all manufactured by BASF Corp.) can be used.

As the aminoacetophenone-based initiator, compounds described in JP2009-191179A, in which the absorption wavelength matches a light source having a long wavelength, for example, 365 nm or 405 nm, can also be used.

As the acylphosphine initiator, commercially available products of IRGACURE-819 and DAROCUR-TPO (trade names, both manufactured by BASF Corp.) can be used.

More preferred examples of the photoradical polymerization initiator include an oxime compound. As specific examples of the oxime initiator, the compounds described in JP2001-233842A, the compounds describe in JP2000-80068A, and the compounds described in JP2006-342166A can be used.

Preferred examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include the compounds described in J. C. S. Perkin II, (1979) pp. 1653 to 1660, J. C. S. Perkin II, (1979) pp. 156 to 162, Journal of Photopolymer Science and Technology, (1995) pp 202 to 232, JP2000-66385A, JP2000-80068A, JP2004-534797A, and JP2006-342166A.

As the commercially available products thereof, IRGACURE-OXE01 (manufactured by BASF Corp.), IRGACURE-OXE02 (manufactured by BASF Corp.), and N-1919 (manufactured by ADEKA Corporation) are also suitably used.

In addition, the compounds described in JP2009-519904A, in which oxime is linked to the N-position of carbazole, the compounds described in U.S. Pat. No. 7,626,957A, in which a hetero-substituent is introduced into the benzophenone moiety, the compounds described in JP2010-15025A and US2009/292039A, in which a nitro group is introduced into the dye moiety, the ketoxime compounds described in WO2009/131189A, the compounds containing a triazine skeleton and an oxime skeleton in the same molecule, described in U.S. Pat. No. 7,556,910A, and the compounds having an absorption maximum at 405 nm and exhibiting good sensitivity for a g-line light source, described in JP2009-221114A, may also be used.

Incidentally, the cyclic oxime compounds described in JP2007-231000A and JP2007-322744A can also be suitably used. Among the cyclic oxime compounds, in particular, the cyclic oxime compounds condensed to a carbazole dye, described in JP2010-32985A and JP2010-185072A, have high light absorptivity, and thus are preferable from the viewpoint of high sensitivity.

Moreover, the compounds having an unsaturated bond at a specific site of an oxime compound, described in JP2009-242469A, can also be suitably used.

In addition, it is also possible to use an oxime compound having a fluorine atom. Specific examples of such an oxime compound include the compounds described in JP2010-262028A, the Compounds 24, and 36 to 40 described in paragraph No. 0345 of JP2014-500852A, and the compound (C-3) described in paragraph No. 0101 of JP2013-164471A. Specific examples thereof include the following compounds.

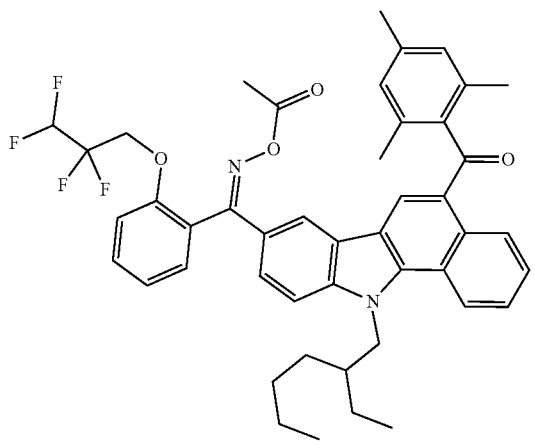

24

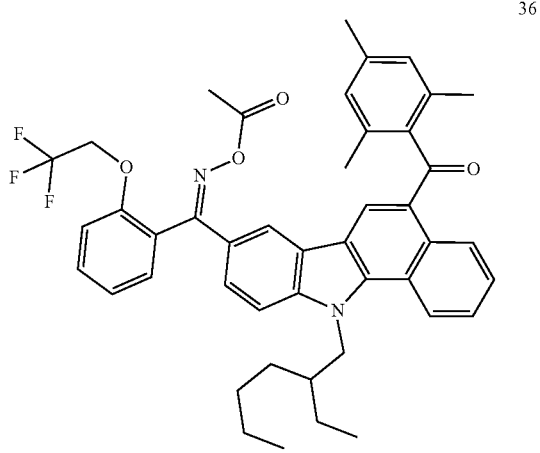

36

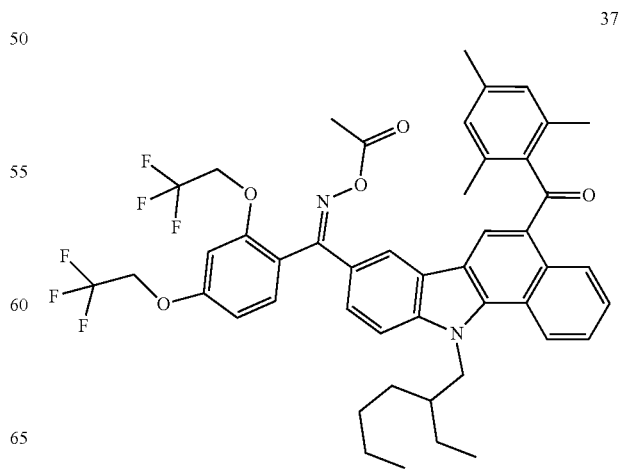

37

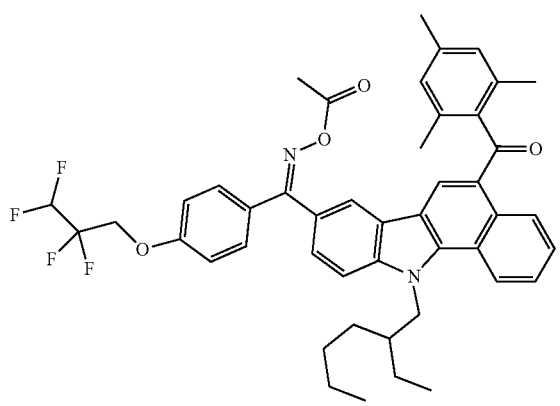

The most preferred examples of the oxime compound include the oxime compounds having a specific substituent, described in JP2007-269779A and the oxime compounds having a thioaryl group, described in JP2009-191061A.

From the viewpoint of exposure sensitivity, the photoradical polymerization initiator is preferably a compound selected from the group consisting of a trihalomethyltriazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound, and a 3-aryl-substituted coumarin compound.

The photoradical polymerization initiator is more preferably a trihalomethyltriazine compound, an α-aminoketone compound, an acyl phosphine compound, a phosphine oxide compound, a metallocene compound, an oxime compound, a triarylimidazole dimer, an onium compound, a benzophenone compound, or an acetophenone compound, still more preferably a trihalomethyltriazine compound, an α-aminoketone compound, a metallocene compound, an oxime compound, a triarylimidazole dimer, or a benzophenone compound, and even still more preferably a metallocene compound or an oxime compound.

In a case where the photosensitive resin composition includes a photoradical polymerization initiator, the content of the photoradical polymerization initiator is preferably 0.1% to 30% by mass, more preferably 0.1% to 20% by mass, and still more preferably 0.1% to 10% by mass, with respect to the total solid content of the photosensitive resin composition. Further, the photoradical polymerization initiator is included in an amount of preferably 1 to 20 parts by mass, and more preferably 5 to 15 parts by mass, with respect to 100 parts by mass of the photoradically polymerizable compound.

The photoradical polymerization initiator may be of one kind or of two or more kinds thereof. In a case where there are two or more kinds of the photoradical polymerization initiators, a total amount thereof is preferably within the above range.

<Photoacid Generator>

The photosensitive resin composition of the present invention may contain a photoacid generator. By incorporation of the photoacid generator, an acid is generated in the exposed areas, the solubility of the exposed areas in an aqueous alkali solution is increased, and therefore, the photosensitive resin composition can be used as a positive tone photosensitive resin composition.

Examples of the photoacid generator include a quinine diazide compound, a sulfonium salt, a phosphonium salt, a diazonium salt, and an iodonium salt. Among these, the quinine diazide compound is preferably used in a view that an excellent dissolution inhibitory effect of the unexposed areas is expressed, and thus, a positive tone photosensitive resin composition having high sensitivity and a small reduction in the film can be obtained. Further, two or more kinds of the photoacid generators can be included. Thus, the dissolution rate of the exposed areas and the unexposed areas can be further increased, and thus, a positive tone photosensitive resin composition having high sensitivity can be obtained.

Examples of the quinone diazide compound include a quinone diazide compound in which a sulfonic acid of a quinone diazide forms an ester bond with a polyhydroxy compound, a quinone diazide compound in which a sulfonic acid of a quinone diazide forms a sulfonamide bond with a polyhydroxy compound, and a quinone diazide compound in which a sulfonic acid of a quinone diazide forms an ester bond and/or sulfonamide bond with a polyhydroxy compound. By using such a quinone diazide compound, a positive tone photosensitive resin composition having photosensitivity at an i-line such as a mercury lamp (wavelength of 365 nm), an h-line (wavelength of 405 nm), or a g-line (of wavelength 436 nm), which is a general ultraviolet ray, can be obtained. Further, all the functional groups of the polyhydroxy compound, the polyamino compound, and the polyhydroxypolyamino compound do not need to be substituted with quinone diazide, but it is preferable that two or more functional groups within one molecule are substituted with quinone diazide.

An example thereof is the following compound.

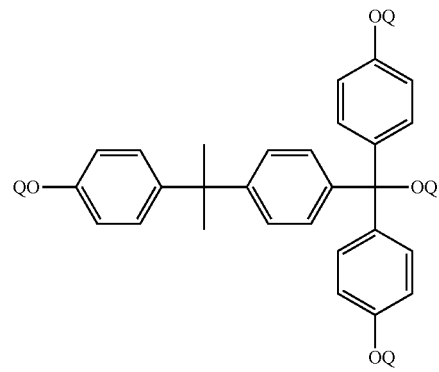

Q represents a hydrogen atom or

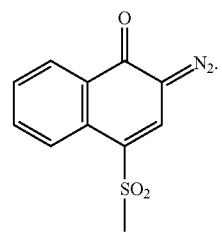

A hydrogen atom accounts for 1% to 10%, and preferably 4% to 5% of all the Q's.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-PZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (all trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (all trade names, manufactured by Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate ester, bisphenol A, bisphenol E, methylene bisphenol, and BisP-AP (all trade names, manufactured by Honshu Chemical Industry Co., Ltd.), and a novolac resin.

Examples of the polyamino compound include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenylsulfide.

Furthermore, examples of the polyhydroxypolyamino compound include, but are not limited to, 2,2-bis(3-amino-4-hydroxyphenyl)hexafluoropropane and 3,3'-dihydroxybenzidine.

As the quinone diazide compound, either of a compound having a 5-naphthoquinone diazide sulfonyl group and a compound having a 4-naphthoquinone diazide sulfonyl group is be preferably used. A compound having both of these groups in the same molecule may be used, and a compound in which another group is used may also be used in combination therewith.

Examples of a method for producing the quinone diazide compound include a method in which 5-naphthoquinone diazide sulfonyl chloride is reacted with a phenol compound in the presence of triethylamine. Examples of a method for synthesizing the phenol compound include a method in which an α-(hydroxyphenyl)styrene derivative is reacted with a polyhydric phenol compound in the presence of an acid catalyst.

The content of the photoacid generator is preferably 3 to 40 parts by mass with respect to 100 parts by mass of the heterocycle-containing polymer precursor. By setting the content of the photoacid generator to this range, high sensitivity can be further promoted. In addition, a sensitizer and the like may be included, as desired.

The photoacid generator may be used singly or in combination of two or more kinds thereof. In a case of using the photoacid generators in combination of two or more kinds thereof, a total amount thereof is preferably within the above range.

<Photobase Generator>

The photosensitive resin composition of the present invention may include a photobase generator. The photobase generator is a substance which generates a base by exposure, and is not particularly limited as long as it does not exhibit activity under typical conditions of a normal temperature and a normal pressure, but generates a base (basic substance) when subjected to irradiation with electromagnetic waves and heating as external stimuli. The base generated by exposure serves as a catalyst upon curing by heating the heterocycle-containing polymer precursor, and thus, it can be suitably used in the negative tone.

The content of the photobase generator is not particularly limited as long as it can form a desired pattern, and may be a general content. The content of the photobase generator is preferably in the range of 1 part by mass to less than 30 parts by mass, more preferably in the range of 0.5 parts by mass to 25 parts by mass, and still more preferably in the range of 0.5 parts by mass to 20 parts by mass, with respect to 100 parts by mass of the photosensitive resin composition. The photobase generator may be used singly or in combination of two or more kinds thereof. In a case of using the photobase generators in combination of two or more kinds thereof, a total amount thereof is preferably within the above range.

In the present invention, known photobase generators may be used as the photobase generator. Examples thereof include, as described in M. Shirai and M. Tsunooka, Prog. Polym. Sci., 21, 1 (1996); Masahiro Tsunooka, Kobunshi Kakou (Polymer Processing), 46, 2 (1997); C. Kutal, Coord. Chem. Rev., 211, 353 (2001); Y. Kaneko, A. Sarker, and D. Neckers, Chem. Mater., 11, 170 (1999); H. Tachi, M. Shirai, and M. Tsunooka, J. Photopolym. Sci. Technol., 13, 153 (2000); M. Winkle, and K. Graziano, J. Photopolym. Sci. Technol., 3, 419 (1990); M. Tsunooka, H. Tachi, andS. Yoshitaka, J. Photopolym. Sci. Technol., 9, 13 (1996); and K. Suyama, H. Araki, M. Shirai, J. Photopolym. Sci. Technol., 19, 81 (2006), transition metal compound complexes, ionic compounds which have been neutralized as the basic component forms a salt, such as ionic compounds having a structure of an ammonium salt or the like, or ionic compounds which have become latent as the amidine moiety forms a salt with a carboxylic acid, and nonionic compounds which have become latent by urethane bonds or oxime bonds, such as carbamate derivatives, oxime ester derivatives, and acyl compounds.

A photobase generator which can be used in the present invention is particularly limited, and known photobase generators can be used. Examples thereof include carbamate derivatives, amide derivatives, imide derivatives, alpha cobalt complexes, imidazole derivatives, cinnamic acid derivatives, and oxime derivatives.

The basic substance generated from the photobase generator is not particularly limited, but examples thereof include a compound having an amino group, in particular, monoamines, polyamines such as diamines, and amidine.

The generated basic substance is preferably a compound having an amino group having higher basicity since it has a strong catalytic effect on a dehydration condensation reaction or the like in the imidization of the heterocycle-containing polymer precursor, and even with addition of a small amount of the compound, it is possible that the catalytic effect in the dehydration condensation reaction at a lower temperature should be expressed. Consequently, since the catalytic effect of the generated base substance is significant, the apparent sensitivity of the photosensitive resin composition is improved.

From the viewpoint of the catalytic effect, amidines and aliphatic amines are preferable.

The photobase generator is preferably a photobase generator that does not include a salt in the structure thereof, and more preferably a photobase generator that has no charge on a nitrogen atom of a base portion generated in the photobase generator. The photobase generator is preferably a photobase generator in which the generated base has become latent by a covalent bond, and more preferably a compound in which a covalent bond between a nitrogen atom in the generated base portion and an adjacent atom is cleaved to generate a base by a base generating mechanism. Since a base generator not including a salt in the structure thereof can make the base generator itself neutral, solvent solubility is good and the pot life is enhanced. For this reason, amines generated from the photobase generator used in the present invention are preferably primary amines or secondary amines.

Furthermore, for the reason described above, the photobase generator is preferably a photobase generator in which the generated base has become latent by a covalent bond as described above, and more preferably a photobase generator in which the generated base becomes latent by an amide bond, a carbamate bond, or an oxime bond.

Examples of the base generator according to the present invention include, but are not limited to, the base generators having cinnamic acid amide structures, disclosed in JP2009-80452A and WO2009/123122A, the base generators having carbamate structures, disclosed in JP2006-189591A and JP2008-247747A, and the base generators having oxime structures or carbamoyl oxime structures, disclosed in JP2007-249013A and JP2008-003581B, and structures of other known base generator can also be used.

Hereinafter, the photobase generator which can be used in the present invention will be described with reference to specific examples thereof.

Examples of the ionic compounds include those having the following structural formulae.

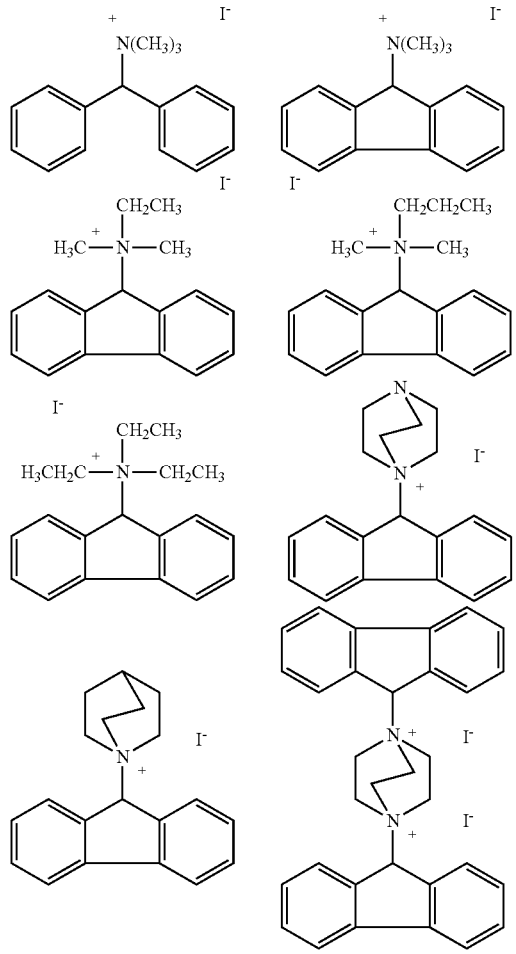

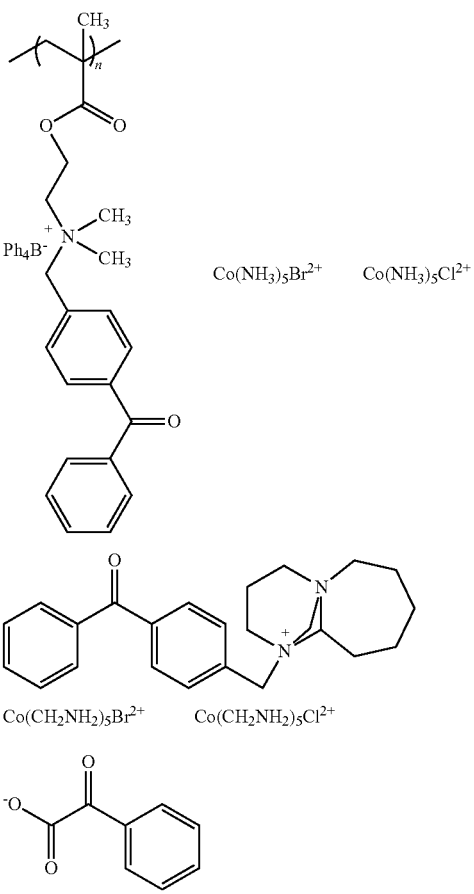

Examples of the acyl compound include compounds represented by the following formulae.

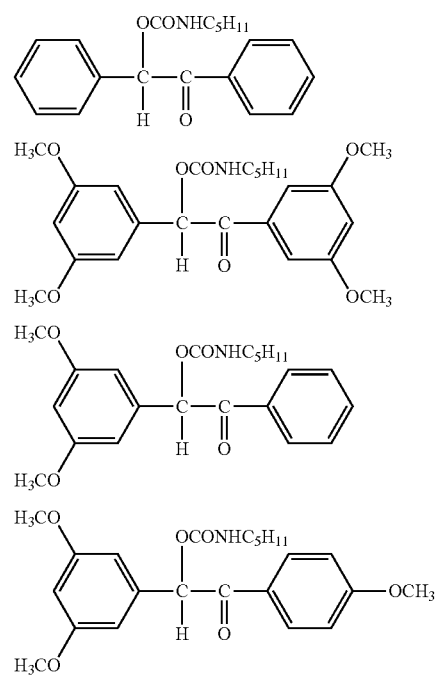

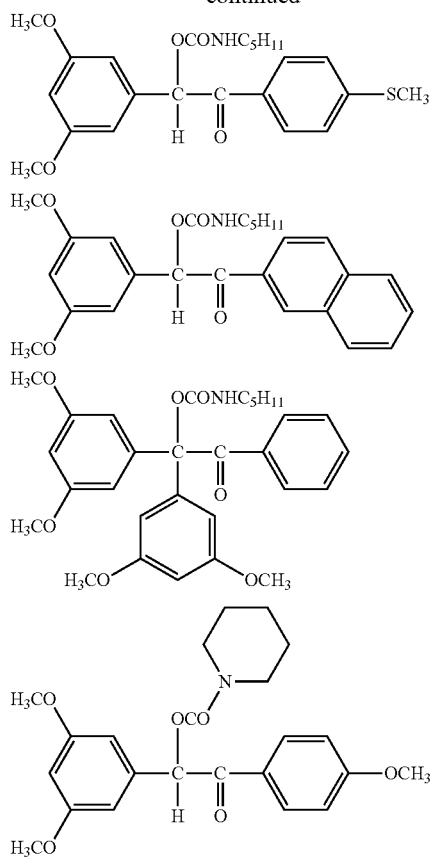

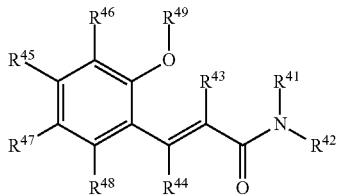

(In General Formula (PB-1), $R^{41}$ and $R^{42}$ are each a hydrogen atom or an organic group, and may be the same as or different from each other, provided that at least one of $R^{41}$ or $R^{42}$ is an organic group. Alternatively, $R^{41}$ and $R^{42}$ may be bonded to each other to form a ring structure, and may also include a bond of heteroatoms. $R^{43}$ and R are each a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonato group, or an organic group, and may be the same as or different from each other. $R^{45}$, $R^{46}$, $R^{47}$, and $R^{48}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group, and may be the same as or different from each other. Alternatively, two or more of $R^{45}$, $R^{46}$, $R^{47}$, and $R^{48}$ may be bonded to each other to form a ring structure or may include a bond of heteroatoms. $R^{49}$ is a hydrogen atom or a protecting group which can be deprotected by heating and/or irradiation with electromagnetic waves.)

Moreover, examples of the photobase generator include a compound represented by General Formula (PB-1).

Specific examples of General Formula (PB-1) include, but are not limited to, the following ones.

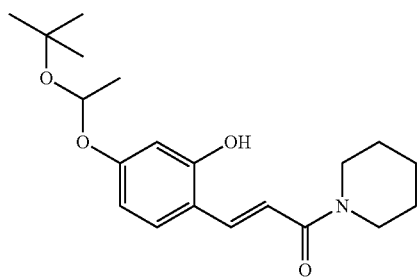 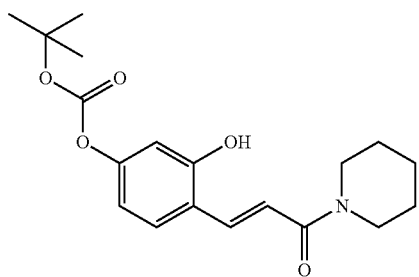

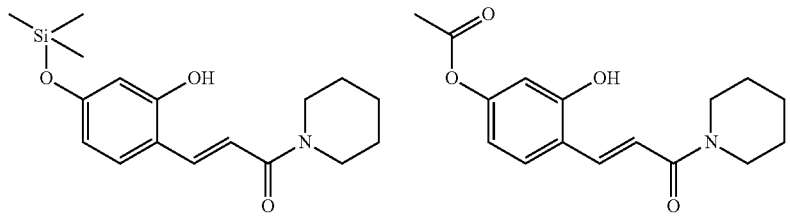

-continued
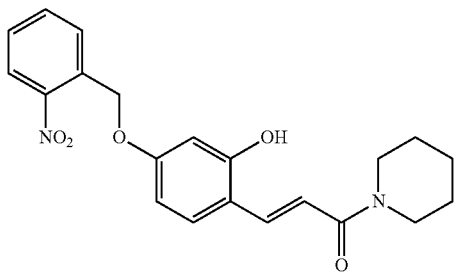
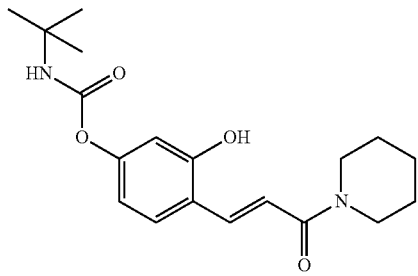
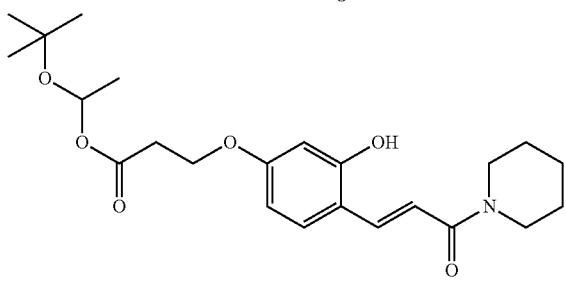
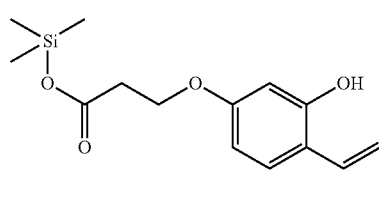
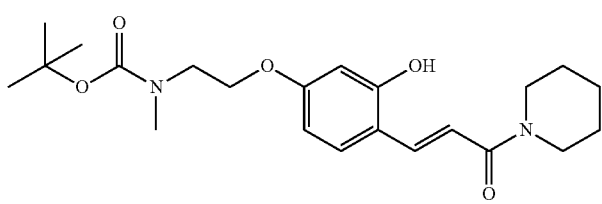
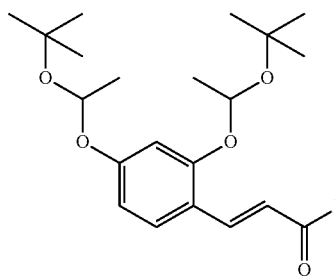
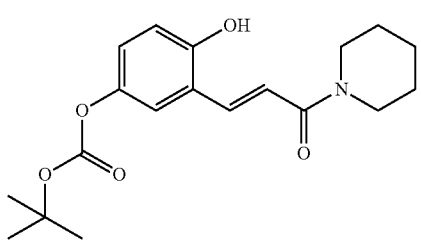
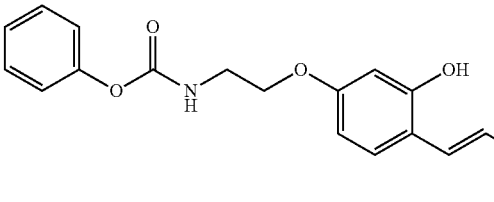
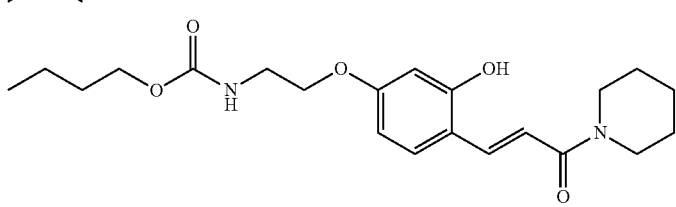
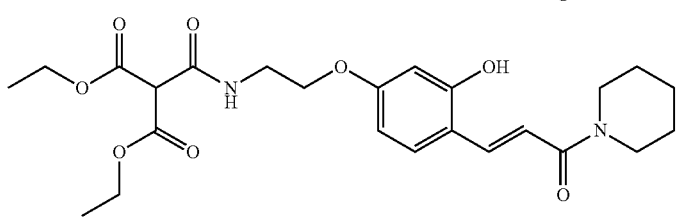
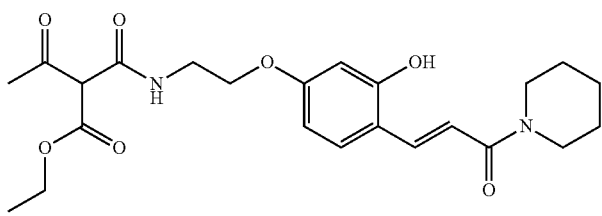

-continued
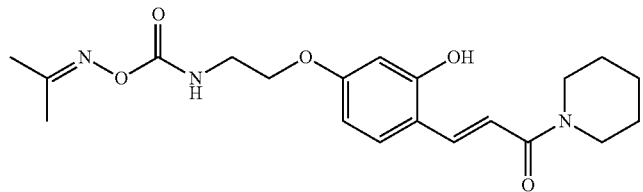
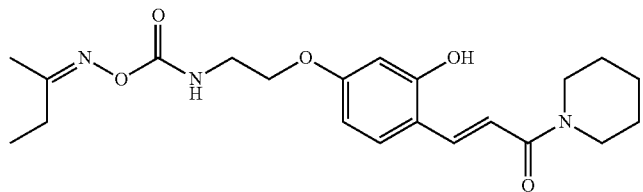
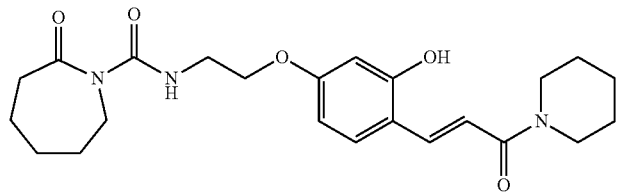
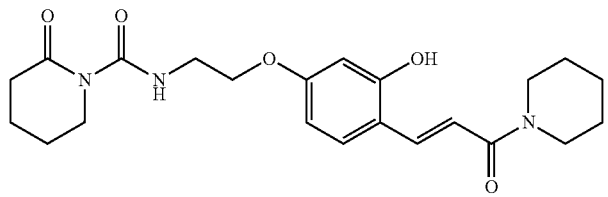
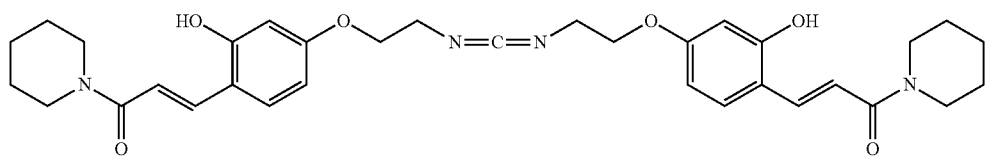
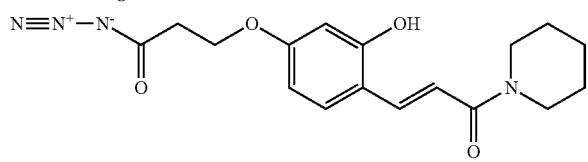
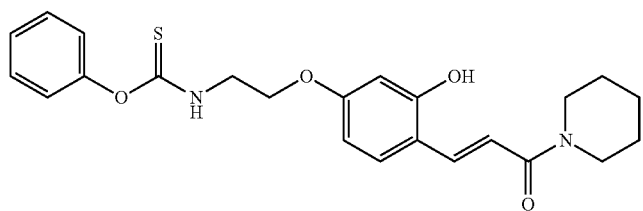
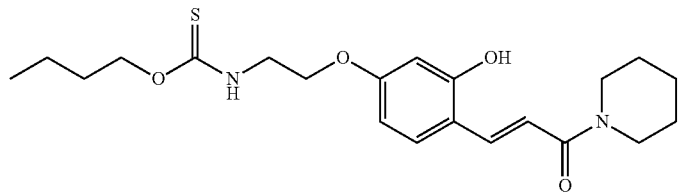
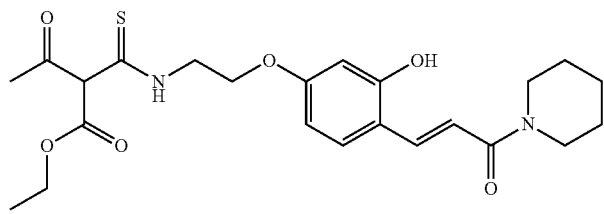

-continued

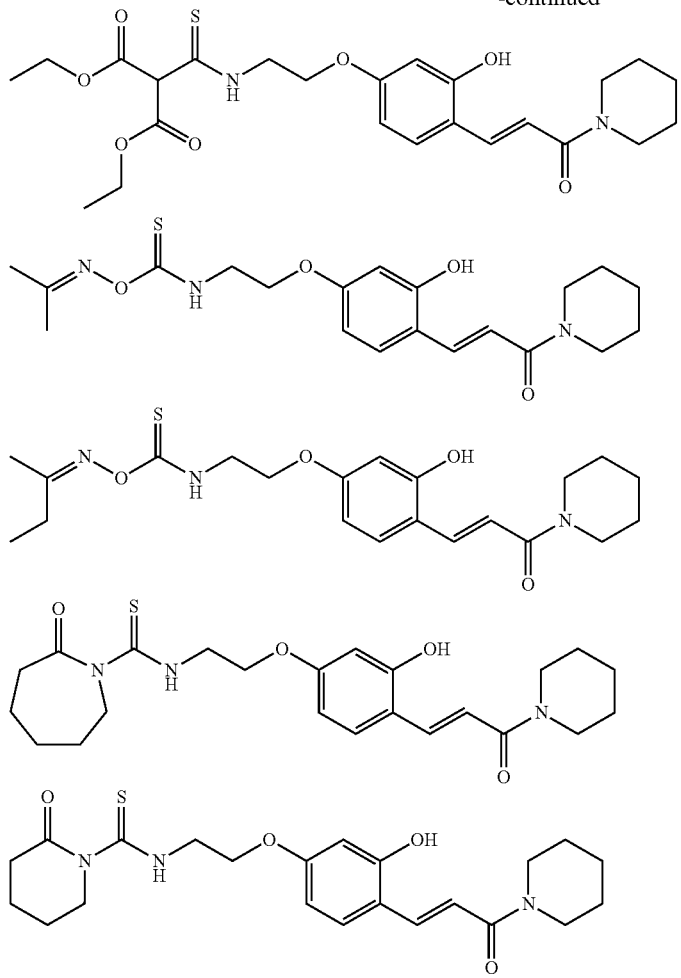

Other examples of the photobase generator include the compounds described in paragraph Nos. 0185 to 0188, and 0199 to 0200 and 0202 of JP2012-93746A, the compounds described in paragraph Nos. 0022 to 0069 of JP2013-194205A, the compounds described in paragraph Nos. 0026 to 0074 of JP2013-204019A, and the compounds described in paragraph No. 0052 of WO2010/064631A.

<Thermal Base Generator>

The photosensitive resin composition of the present invention may include a thermal base generator.

The kind of the thermal base generator is not particularly determined, but it is preferable to include a thermal base generator including at least one selected from an acidic compound which generates a base upon heating to 40° C. or higher, and an ammonium salt having an anion with a pKa1 of 0 to 4 and an ammonium cation. Here, the pKa1 indicates a logarithm expression ($-\text{Log}_{10}$ Ka) of a dissociation constant (Ka) of the first proton of a polyvalent acid.

By blending such a compound, the cyclization reaction of the heterocycle-containing polymer precursor can be carried out at a low temperature, and further, a photosensitive resin composition having superior stability can be obtained. In addition, the thermal base generator does not generate a base when not being heated, and therefore, even in the coexistence with the heterocycle-containing polymer precursor, the cyclization of the heterocycle-containing polymer precursor in the preservation can be suppressed, contributing to preservation stability.

The thermal base generator in the present invention includes at least one selected from an acidic compound (A1) which generates a base upon heating to 40° C. or higher, and ammonium salt (A2) having an anion with a pKa1 of 0 to 4 and an ammonium cation.

Since the acidic compound (A1) and the ammonium salt (A2) generate a base upon heating, the cyclization reaction of a heterocycle-containing polymer precursor can be promoted by the action of a base generated from these compounds, and therefore cyclization of the heterocycle-containing polymer precursor can be carried out at a low temperature. In addition, since even in a case where these compounds are present together with a heterocycle-containing polymer precursor which is cyclized to be cured by the action of a base, cyclization of the heterocycle-containing polymer precursor hardly proceeds without heating, it is possible to prepare a precursor composition having excellent stability.

In addition, in the present specification, the acidic compound means a compound having a pH value of less than 7 measured at 20° C. using a pH meter, by such a manner that 1 g of a compound is collected in a container, 50 mL of a mixed liquid of deionized water and tetrahydrofuran (mass ratio: water/tetrahydrofuran=1/4) is added thereto, followed by stirring at room temperature for 1 hour, and a pH value of the resulting solution is measured.

In the present invention, the base generation temperature of the acidic compound (A1) and the ammonium salt (A2) is preferably 40° C. or higher, and more preferably 120° C. to 200° C. The upper limit of the base generation temperature is preferably 190° C. or lower, more preferably 180° C. or lower, and still more preferably 165° C. or lower. The lower limit of the base generation temperature is preferably 130° C. or higher, and more preferably 135° C. or higher.

If the base generation temperature of the acidic compound (A1) and the ammonium salt (A2) is 120° C. or higher, the base is so unlikely to occur during preservation, and therefore it is possible to prepare a precursor composition having excellent stability. If the base generation temperature of the acidic compound (A1) and the ammonium salt (A2) is 200° C. or lower, it is possible to decrease the temperature for cyclization of a heterocycle-containing polymer precursor. The base generation temperature may be measured, for example, by heating a compound to 250° C. at a rate of 5° C./minute in a pressure-resistant capsule, reading a peak temperature of an exothermic peak having the lowest temperature, and taking the peak temperature as a base generation temperature, using differential scanning calorimetry.

In the present invention, the base generated by a thermal base generator is preferably a secondary amine or a tertiary amine, and more preferably a tertiary amine. Since the tertiary amine has high basicity, the temperature for cyclization of a heterocycle-containing polymer precursor resin can be further decreased. In addition, the boiling point of the base generated by a thermal base generator is preferably 80° C. or higher, more preferably 100° C. or higher, and most preferably 140° C. or higher. Further, the molecular weight of the base generated is preferably 80 to 2,000. The lower limit is more preferably 100 or more. The upper limit is more preferably 500 or less. In addition, the value of the molecular weight is a theoretical value calculated from the structural formula.

In the present invention, the acidic compound (A1) preferably includes one or more selected from an ammonium salt and a compound represented by General Formula (1A) which will be described later.

In the present invention, the ammonium salt (A2) is preferably an acidic compound. The ammonium salt (A2) may be a compound containing an acidic compound which generates a base upon heating to 40° C. or higher (preferably 120° C. to 200° C.), or may be a compound other than an acidic compound which generates a base upon heating to 40° C. or higher (preferably 120° C. to 200° C.).

<<Ammonium Salt>>

In the present invention, the ammonium salt means a salt of an ammonium cation represented by General Formula (1) or (2) with an anion. The anion may be bonded via a covalent bond to any portion of the ammonium cation, or may also be contained outside the molecule of the ammonium cation. The anion is preferably present outside the molecule of the ammonium cation. The expression of the anion being present outside the molecule of the ammonium cation refers to a case where an ammonium cation and an anion are not bonded via a covalent bond. Hereinafter, an anion outside the molecule of the cation moiety is also referred to as a counter anion.

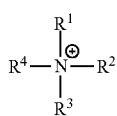

(1)

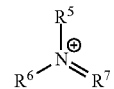

(2)

In General Formulae (1) and (2), $R^1$ to $R^6$ each independently represent a hydrogen atom or a hydrocarbon group, and $R^7$ represents a hydrocarbon group. $R^1$ and $R^2$, $R^3$ and $R^4$, $R^5$ and $R^6$, and $R^5$ and $R^7$ may be bonded to each other to form a ring.

In the present invention, the ammonium salt preferably has an anion having a pKa1 of 0 to 4 and an ammonium cation. The upper limit of pKa1 of the anion is more preferably 3.5 or less, and still more preferably 3.2 or less. The lower limit is preferably 0.5 or more, and more preferably 1.0 or more. If a pKa1 of the anion is within the above range, a heterocycle-containing polymer precursor can be cyclized at a low temperature and further, the stability of the precursor composition can be improved. If the pKa1 is 4 or less, the stability of a thermal base generator is good and generation of a base without heating can be suppressed, and thus, the stability of a precursor composition is good. If the pKa1 is 0 or more, the generated base is hardly neutralized and the cyclization efficiency of the heterocycle-containing polymer precursor is satisfactory.

The type of an anion is preferably one selected from a carboxylate anion, a phenol anion, a phosphoric acid anion, and a sulfuric acid anion. More preferred is a carboxylate anion for a reason that it is possible for stability and thermal decomposition of a salt to be compatible. That is, the ammonium salt is more preferably a salt of an ammonium cation with a carboxylate anion.

The carboxylate anion is preferably a divalent or higher-valent anion of a carboxylic acid having two or more carboxyl groups, and more preferably a divalent anion of a carboxylic acid. According to this aspect, it is possible to obtain a thermal base generator capable of further improving the stability, the curability, and the developability of a precursor composition. In particular, the stability, the curability, and the developability of the precursor composition can be further improved by using a divalent anion of a carboxylic acid.

In the present invention, the carboxylate anion is preferably an anion of a carboxylic acid having a pKa1 of 4 or less. The pKa1 is more preferably 3.5 or less, and still more preferably 3.2 or less. According to this aspect, the stability of the precursor composition can be further improved.

Here, the pKa1 represents the logarithm of a reciprocal number of a first dissociation constant of an acid, and reference can be made to the values described in Determination of Organic Structures by Physical Methods (written by Brown, H. C., McDaniel, D. H., Hafliger, O., Nachod, F. C.; edited by Braude, E. A., Nachod, F. C.; and Academic Press, New York, 1955), or Data for Biochemical Research (written by Dawson, R. M. C. et al.; and Oxford, Clarendon Press, 1959). For compounds not listed in these documents, the value calculated from the structural formula using a software ACD/pKa (manufactured by ACD/Labs) shall be used.

In the present invention, the carboxylate anion is preferably represented by General Formula (X1).

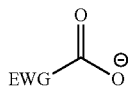
(XI)

In General Formula (X1), EWG represents an electron-withdrawing group.

The electron-withdrawing group in the present invention means that a Hammett's substituent constant (σm is a positive value. Here, the σm is described in detail in the review by TSUNO Yuho, Journal of the Society of Synthetic Organic Chemistry, Japan, Vol. 23, No. 8 (1965), pp 631 to 642. In addition, the electron-withdrawing group of the present invention is not limited to the substituents described in the document.

Examples of the substituent in a case where a σm represents a positive value include a $CF_3$ group (σm=0.43), a $CF_3CO$ group (σm=0.63), a HC≡C group (σm=0.21), a $CH_2$=CH group (σm=0.06), an Ac group (σm=0.38), a MeOCO group (σm=0.37), a MeCOCH=CH group (σm=0.21), a PhCO group (σm=0.34), and a $H_2NCOCH_2$ group (σm=0.06). Incidentally, Me represents a methyl group, Ac represents an acetyl group, and Ph represents a phenyl group.

In the present invention, EWG preferably represents a group represented by each of General Formulae (EWG-1) to (EWG-6).

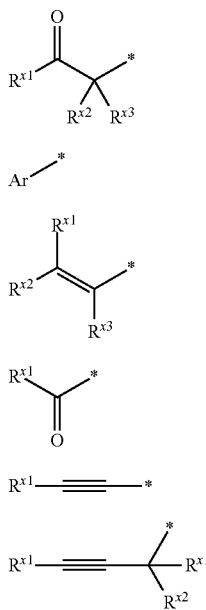

(EWG-1)

(EWG-2)

(EWG-3)

(EWG-4)

(EWG-5)

(EWG-6)

In the formula, $R^{x1}$ to $R^{x3}$ each independently represent a hydrogen atom, an alkyl group, an alkenyl group, an aryl group, a hydroxyl group, or a carboxyl group, and Ar represents an aromatic ring group.

The number of carbon atoms in the alkyl group is preferably 1 to 30, more preferably 1 to 20, and still more preferably 1 to 10. The alkyl group may be linear, branched, or cyclic, and is preferably linear or branched, and more preferably linear. The alkyl group may have a substituent or may be unsubstituted. Examples of the substituent include those described for the substituent which may be contained in the organic group represented by $A^1$ which will be described later. The substituent is preferably a carboxy group.

The number of carbon atoms in the alkenyl group is preferably 2 to 30, more preferably 2 to 20, and still more preferably 2 to 10. The alkenyl group may be linear, branched, or cyclic, and is preferably linear or branched, and more preferably linear. The alkenyl group may have a substituent or may be unsubstituted. Examples of the substituent include those described for the substituent which may be contained in the organic group represented by $A^1$ which will be described later. The substituent is preferably a carboxy group.

The number of carbon atoms in the aryl group is preferably 6 to 30, more preferably 6 to 20, and still more preferably 6 to 12. The aryl group may have a substituent or may be unsubstituted. Examples of the substituent include those described for the substituent which may be contained in the organic group represented by $A^1$ which will be described later. The substituent is preferably a carboxy group.

In the present invention, the carboxylate anion is preferably represented by General Formula (X).

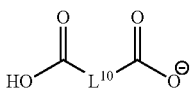
(X)

In General Formula (X), $L^{10}$ represents a single bond, or a divalent linking group selected from an alkylene group, an alkenylene group, an arylene group, —$NR^x$—, and a combination thereof, and $R^x$ represents a hydrogen atom, an alkyl group, an alkenyl group, or an aryl group.

The number of carbon atoms in the alkylene group represented by $L^{10}$ is preferably 1 to 30, more preferably 1 to 20, and still more preferably 1 to 10. The alkylene group may be linear, branched, or cyclic, and is preferably linear or branched, and more preferably linear. The alkylene group may have a substituent or may be unsubstituted. Examples of the substituent include those described for the substituent which may be contained in the organic group represented by $A^1$ which will be described later.

The number of carbon atoms in the alkenylene group represented by $L^{10}$ is preferably 2 to 30, more preferably 2 to 20, and still more preferably 2 to 10. The alkenylene group may be linear, branched, or cyclic, and is preferably linear or branched, and more preferably linear. The alkenylene group may have a substituent or may be unsubstituted. Examples of the substituent include those described for the substituent which may be contained in the organic group represented by $A^1$ which will be described later.

The number of carbon atoms in the arylene group represented by $L^{10}$ is preferably 6 to 30, more preferably 6 to 20, and still more preferably 6 to 12. The arylene group may have a substituent or may be unsubstituted. Examples of the substituent include those described for the substituent which may be contained in the organic group represented by $A^1$ which will be described later.

The number of carbon atoms in the alkylene group represented by $R^x$ is preferably 1 to 30, more preferably 1 to 20, and still more preferably 1 to 10. The alkylene group may be linear, branched, or cyclic, and is preferably linear or branched, and more preferably linear. The alkylene group may have a substituent or may be unsubstituted. Examples of the substituent include those described for the substituent which may be contained in the organic group represented by $A^1$ which will be described later.

The number of carbon atoms in the alkenylene group represented by $R^X$ is preferably 2 to 30, more preferably 2 to 20, and still more preferably 2 to 10. The alkenylene group may be linear, branched, or cyclic, and is preferably linear or branched, and more preferably linear. The alkenylene group may have a substituent or may be unsubstituted. Examples of the substituent include those described for the substituent which may be contained in the organic group represented by $A^1$ which will be described later.

The number of carbon atoms in the aryl group represented by $R^X$ is preferably 6 to 30, more preferably 6 to 20, and still more preferably 6 to 12. The aryl group may have a substituent or may be unsubstituted. Examples of the substituent include those described for the substituent which may be contained in the organic group represented by $A^1$ which will be described later.

Specific examples of the carboxylate anion include a maleic acid anion, a phthalic acid anion, an N-phenyliminodiacetic acid anion, and an oxalic acid anion. These anions may be preferably used.

The ammonium cation is preferably represented by any one of General Formulae (Y1-1) to (Y1-6).

(Y1-1)

(Y1-2)

(Y1-3)

(Y1-4)

(Y1-5)

(Y1-6)

In the general formulae, $R^{101}$ represents an n-valent organic group, $R^{102}$ to $R^{111}$ each independently represent a hydrogen atom or a hydrocarbon group, $R^{150}$ and $R^{151}$ each independently represent a hydrocarbon group, $R^{104}$ and $R^{105}$, $R^{104}$ and $R^{150}$, $R^{107}$ and $R^{108}$, and $R^{109}$ and $R^{110}$ may be bonded to each other to form a ring, $Ar^{101}$ and $Ar^{102}$ each independently represent an aryl group, n represents an integer of 1 or more, and m represents an integer of 0 to 5.

$R^{101}$ represents an n-valent organic group. Examples of the monovalent organic group include an alkyl group, an alkylene group, and an aryl group. Examples of the bivalent or higher-valent organic group include n-valent groups formed by removing one or more hydrogen atoms from monovalent organic groups.

$R^{101}$ is preferably an aryl group. Specific examples of the aryl group include those described for $Ar^{10}$ which will be described later.

$R^{102}$ to $R^{111}$ each independently represent a hydrogen atom or a hydrocarbon group, and $R^{150}$ and $R^{151}$ each independently represent a hydrocarbon group.

The hydrocarbon group represented by each of $R^{102}$ to $R^{111}$, $R^{150}$, and $R^{151}$ is preferably an alkyl group, an alkenyl group, or an aryl group. The alkyl group, the alkenyl group, and the aryl group may further have a substituent. Examples of the substituent include those described for the substituent which may be contained in the organic group represented by $A^1$ which will be described later.

The number of carbon atoms in the alkyl group is preferably 1 to 30, more preferably 1 to 20, and still more preferably 1 to 10. The alkyl group may be linear, branched, or cyclic, and is preferably linear or branched, and more preferably linear. The alkyl group may be substituted or unsubstituted.

The number of carbon atoms in the alkenyl group is preferably 2 to 30, more preferably 2 to 20, and still more preferably 2 to 10. The alkenyl group may be linear, branched, or cyclic, and is preferably linear or branched, and more preferably linear. The alkenyl group may be substituted or unsubstituted.

The number of carbon atoms in the aryl group is preferably 6 to 30, more preferably 6 to 20, and still more preferably 6 to 12. The aryl group may be substituted or unsubstituted.

$Ar^{101}$ and $Ar^{102}$ each independently represent an aryl group.

The number of carbon atoms in the aryl group is preferably 6 to 30, more preferably 6 to 20, and still more preferably 6 to 12. The aryl group may be substituted or unsubstituted.

$R^{104}$ and $R^{105}$, $R^{104}$ and $R^{150}$, $R^{107}$ and $R^{108}$, and $R^{109}$ and $R^{110}$ may be bonded to each other to form a ring. Examples of the ring include a cyclic aliphatic ring (non-aromatic hydrocarbon ring), an aromatic ring, and a heterocycle. The ring may be monocyclic or polycyclic. In a case where the groups are bonded to each other to form a ring, examples of the linking group include a divalent linking group selected from the group consisting of —CO—, —O—, —NH—, a divalent aliphatic group, a divalent aryl group, and a combination thereof. Specific examples of the formed ring include a pyrrolidine ring, a pyrrole ring, a piperidine ring, a pyridine ring, an imidazole ring, a pyrazole ring, an oxazole ring, a thiazole ring, a pyrazine ring, a morpholine ring, a thiazine ring, indole ring, isoindole ring, a benzimidazole ring, a purine ring, a quinoline ring, an isoquinoline ring, a quinoxaline ring, a cinnoline ring, and a carbazole ring.

In the present invention, the ammonium cation is preferably a structure represented by General Formula (Y1-1) or General Formula (Y1-2), more preferably a structure represented by General Formula (Y1-1) or General Formula (Y1-2), in which $R^{101}$ is an aryl group, and particularly preferably a structure represented by General Formula (Y1-1) in which $R^{101}$ is an aryl group. That is, in the present invention, the ammonium cation is preferably represented by General Formula (Y).

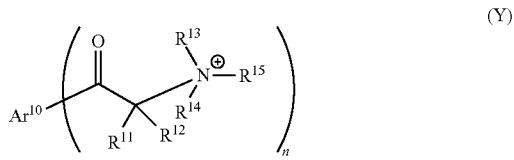

In General Formula (Y), $Ar^{10}$ represents an aryl group, $R^{11}$ to $R^{15}$ each independently represent a hydrogen atom or a hydrocarbon group, $R^{14}$ and $R^{15}$ may be bonded to each other to form a ring, and n represents an integer of 1 or more.

$Ar^{10}$ represents an aryl group. Specific examples of the aryl group include a substituted or unsubstituted benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, a oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxaline ring, an isoquinoline ring, a carbazole ring, a phenanthridine ring, a acridine ring, a phenanthroline ring, a cyanthrene ring, a cromene ring, a xanthene ring, a phenanthroline ring, a phenothiazine ring, and a phenazine ring. Among these, from the viewpoints of preservation stability and high sensitivity, a benzene ring, a naphthalene ring, an anthracene ring, a phenothiazine ring, or a carbazole ring is preferable, and a benzene ring or a naphthalene ring is the most preferable.

Examples of the substituent which may be contained in the aryl group include those described for the substituent which may be contained in the organic group represented by $A^1$ which will be described later.

$R^{11}$ and $R^{12}$ each independently represent a hydrogen atom or a hydrocarbon group. The hydrocarbon group is not particularly limited, but is preferably an alkyl group, an alkenyl group, or an aryl group.

$R^{11}$ and $R^{12}$ are each preferably a hydrogen atom.

The number of carbon atoms in the alkyl group is preferably 1 to 30, more preferably 1 to 20, and still more preferably 1 to 10. The alkyl group may be linear, branched, or cyclic.

Examples of the linear or branched alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group.

The cyclic alkyl group may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. Among these, a cyclohexyl group is the most preferable from the viewpoint of compatibility with high sensitivity.

The number of carbon atoms in the alkenyl group is preferably 2 to 30, more preferably 2 to 20, and still more preferably 2 to 10. The alkenyl group may be linear, branched, or cyclic, and is preferably linear or branched, and more preferably linear. The alkenyl group may be substituted or unsubstituted.

The number of carbon atoms in the aryl group is preferably 6 to 30, more preferably 6 to 20, and still more preferably 6 to 12. The aryl group may be substituted or unsubstituted.

$R^{13}$ to $R^{15}$ each represent a hydrogen atom or a hydrocarbon group.

Examples of the hydrocarbon group include the hydrocarbon groups described above for $R^{11}$ and $R^{12}$. $R^{13}$ to $R^{15}$ are each particularly preferably an alkyl group, and preferred aspects thereof are also the same as those described for $R^{11}$ and $R^{12}$.

$R^{14}$ and $R^{15}$ may be bonded to each other to form a ring. Examples of the ring include a cyclic aliphatic ring (non-aromatic hydrocarbon ring), an aromatic ring, and a heterocycle. The ring may be monocyclic or polycyclic. In a case where $R^{14}$ and $R^{15}$ are bonded to each other to form a ring, examples of the linking group include a divalent linking group selected from the group consisting of —CO—, —O—, —NH—, a divalent aliphatic group, a divalent aryl group, and a combination thereof. Specific examples of the formed ring include a pyrrolidine ring, a pyrrole ring, a piperidine ring, a pyridine ring, an imidazole ring, a pyrazole ring, an oxazole ring, a thiazole ring, a pyrazine ring, a morpholine ring, a thiazine ring, an indole ring, an isoindole ring, a benzimidazole ring, a purine ring, a quinoline ring, an isoquinoline ring, a quinoxaline ring, a cinnoline ring, and a carbazole ring.

Regarding $R^{13}$ to $R^{15}$, it is preferable that $R^{14}$ and $R^{15}$ are bonded to each other to form a ring, or that $R^{13}$ is a linear alkyl group having 5 to 30 carbon atoms (more preferably having 6 to 18 carbon atoms), and $R^{14}$ and $R^{15}$ are each independently an alkyl group having 1 to 3 carbon atoms (more preferably having 1 or 2 carbon atoms). According to this aspect, it is possible to easily generate amine species having a high boiling point.

Furthermore, from the viewpoint of the basicity or the boiling point of amine species generated by $R^{13}$ to $R^{15}$, the total number of carbon atoms in $R^{13}$, $R^{14}$, and $R^{15}$ is preferably 7 to 30, and more preferably 10 to 20.

In addition, for a reason that it is easy to generate amine species having a high boiling point, the chemical formula weight of "$NR^{13}R^{14}R^{15}$" in General Formula (Y) is preferably 80 to 2,000, and more preferably 100 to 500.

On the other hand, an embodiment for further improving adhesiveness to a copper wiring may be an aspect in which in General Formula (Y), $R^{13}$ and $R^{14}$ are each a methyl group or an ethyl group, and $R^{15}$ is a linear, branched, or cyclic alkyl group having 5 or more carbon atoms, or an aromatic group. In the present embodiment, it is preferable that $R^{13}$ and $R^{14}$ are each a methyl group, and $R^{15}$ is a linear alkyl group having 5 to 20 carbon atoms, a branched alkyl group having 6 to 17 carbon atoms, a cyclic alkyl group having 6 to 10 carbon atoms, or a phenyl group, and it is more preferable that $R^{13}$ and $R^{14}$ are each a methyl group, and $R^{15}$ is a linear alkyl group having 5 to 10 carbon atoms, a branched alkyl group having 6 to 10 carbon atoms, a cyclic alkyl group having 6 to 8 carbon atoms, or a phenyl group. By thus reducing the hydrophobicity of the amine species, it is possible to more effectively suppress the lowering of affinity between the copper surface and the polyimide even in a case where the amine is deposited on the copper wiring. In the present embodiment, preferred ranges of $Ar^{10}$, $R^{11}$, $R^{12}$, and n are the same as described above.

<Compound Represented by General Formula (1A)>

In the present invention, the acidic compound is also preferably a compound represented by General Formula (1A). Although this compound is acidic at room temperature, it undergoes the loss of a carboxyl group through decarboxylation or cyclodehydration by heating, and therefore, the amine moiety which had been neutralized and inactivated till then becomes active to be basic. Hereinafter, General Formula (1A) will be described.

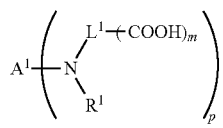

In General Formula (1A), $A^1$ represents a p-valent organic group, $R^1$ represents a monovalent organic group, $L^1$ represents a (m+1)-valent organic group, m represents an integer of 1 or more, and p represents an integer of 1 or more.

In General Formula (1A), $A^1$ represents a p-valent organic group. Examples of the organic group include an aliphatic group and an aromatic ring group, and the organic group is preferably an aromatic ring group. If $A^1$ is an aromatic ring group, it is possible for a base having a high boiling point to be easily generated at a lower temperature. By increasing the boiling point of the generated base, volatilization or decomposition caused by heating during the curing of a heterocycle-containing polymer precursor is suppressed, whereby the cyclization of the heterocycle-containing polymer precursor can proceed more effectively.

Examples of the monovalent aliphatic group include an alkyl group and an alkenyl group.

The number of carbon atoms in the alkyl group is preferably 1 to 30, more preferably 1 to 20, and still more preferably 1 to 10. The alkyl group may be linear, branched, or cyclic. The alkyl group may have a substituent or may be unsubstituted. Specific examples of the alkyl group include a methyl group, an ethyl group, a tert-butyl group, a dodecyl group, a cyclopentyl group, a cyclohexyl group, a cycloheptyl group, and an adamantyl group.

The number of carbon atoms in the alkenyl group is preferably 2 to 30, more preferably 2 to 20, and still more preferably 2 to 10. The alkenyl group may be linear, branched, or cyclic. The alkenyl group may have a substituent or may be unsubstituted. Examples of the alkenyl group include a vinyl group, and a (meth)allyl group.

Examples of the divalent or higher-valent aliphatic group include groups formed by removing one or more hydrogen atoms from the above-mentioned monovalent aliphatic group.

The aryl group may be monocyclic or polycyclic. The aryl group may be a heteroaryl group containing a heteroatom. The aryl group may have a substituent or may be unsubstituted, and is preferably unsubstituted. Specific examples of the aryl group include a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring, with a benzene ring being the most preferable.

In the aryl groups, a plurality of aromatic rings may be linked via a single bond or a linking group which will be described later. The linking group is preferably, for example, an alkylene group. The alkylene group is also preferably linear or branched. Specific examples of the aryl group in which a plurality of aromatic rings are linked via a single bond or a linking group include biphenyl, diphenylmethane, diphenylpropane, diphenylisopropane, triphenylmethane, and tetraphenylmethane.

Examples of the substituent which may be contained in the organic group represented by $A^1$ include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group and a butoxycarbonyl group; arylcarbonyl groups such as a phenoxycarbonyl group, and acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; linear or branched alkyl groups such as a methyl group, an ethyl group, a tert-butyl group, and a dodecyl group; halogenated alkyl groups such as a fluorinated alkyl group; cyclic alkyl groups such as a cyclopentyl group, a cyclohexyl group, a cycloheptyl group, and an adamantyl group; aryl groups such as a phenyl group, a p-tolyl group, a xylyl group, a cumenyl group, a naphthyl group, an anthryl group, and a phenanthryl group; a hydroxyl group; a carboxy group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; a diarylamino group; a thioxy group; or a combination thereof.

$L^1$ represents a (m+1)-valent linking group. The linking group is particularly limited, and examples thereof include —COO—, —OCO—, —CO—, —O—, —S—, —SO—, —SO$_2$—, an alkylene group (preferably a linear or branched alkylene group having 1 to 10 carbon atoms), a cycloalkylene group (preferably a cycloalkylene group having 3 to 10 carbon atoms), an alkenylene group (preferably a linear or branched alkenylene group having 1 to 10 carbon atoms), or a linking group in which a plurality of these groups are linked. The total number of carbon atoms in the linking group is preferably 3 or less. The linking group is preferably an alkylene group, a cycloalkylene group, or an alkenylene group, more preferably a linear or branched alkylene group, still more preferably a linear alkylene group, and particularly preferably an ethylene group or a methylene group, and most preferably a methylene group.

$R^1$ represents a monovalent organic group. Examples of the monovalent organic group include an aliphatic group and an aromatic ring group. Examples of the aliphatic group and the aromatic ring group include those described above in $A^1$. The monovalent organic group represented by $R^1$ may have a substituent. Examples of the substituent include those described above.

$R^1$ is preferably a group having a carboxy group. That is, $R^1$ is preferably a group represented by the following formula.

-L²-(COOH)$_n$

In the formula, $L^2$ represents an (n+1)-valent connecting group, and n represents an integer of 1 or more.

Examples of the linking group represented by $L^2$ include the groups described above for $L^1$, and a preferred range thereof is also the same. Particularly preferred is an ethylene group or a methylene group, and the most preferred is a methylene group.

n represents an integer of 1 or more, and is preferably 1 or 2, and more preferably 1. The upper limit of n is a maximum number of substituents that can be taken by the linking group represented by $L^2$. If n is 1, it is easy to generate a tertiary amine having a high boiling point by heating at 200° C. or lower. In addition, the stability of a precursor composition can be improved.

m represents an integer of 1 or more, preferably 1 or 2, and more preferably 1. The upper limit of m is a maximum number of substituents that can be taken by the linking group represented by $L^1$. If m is 1, it is easy to generate a tertiary amine having a high boiling point by heating at 200° C. or lower. In addition, the stability of a precursor composition can be improved.

p represents an integer of 1 or more, and is preferably 1 or 2 and more preferably 1. The upper limit of p is a maximum number of substituents that can be taken by the organic group represented by $A^1$. If p is 1, it is easy to generate a tertiary amine having a high boiling point by heating at 200° C. or lower.

In the present invention, the compound represented by General Formula (1A) is preferably a compound represented by General Formula (1a).

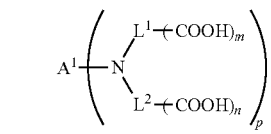

In General Formula (1a), $A^1$ represents a p-valent organic group, $L^1$ represents a (m+1)-valent linking group, L represents a (n+1)-valent linking group, m represents an integer of 1 or more, n represents an integer of 1 or more, and p represents an integer of 1 or more.

$A^1$, $L^1$, $L^2$, m, n, and p in General Formula (1a) have the same definitions as in General Formula (1A), respectively, and preferred ranges thereof are also the same.

In the present invention, the compound represented by General Formula (1A) is preferably N-aryl iminodiacetic acid. The N-aryl iminodiacetic acid is a compound in which in General Formula (1A), $A^1$ is an aromatic ring group, $L^1$ and $L^2$ are each a methylene group, m is 1, n is 1, and p is 1. The N-aryl iminodiacetic acid easily generates a tertiary amine having a high boiling point at 120° C. to 200° C.

Hereinafter, specific examples of the thermal base generator in the present invention are described, but the present invention is not limited thereto. These thermal base generators may be used singly or in combination of two or more kinds thereof. Me in the following formulae represents a methyl group. Among the compounds shown below, (A-1) to (A-11), (A-18), and (A-19) are the compounds represented by Formula (1). Among the compounds shown below, (A-1) to (A-11), and (A-18) to (A-26) are more preferable, and (A-1) to (A-9), (A-18) to (A-21), (A-23), and (A-24) are still more preferable.

In addition, from the viewpoint of improving the adhesiveness to copper, (A-18) to (A-26), and (A-38) to (A-43) are more preferable, and (A-26), and (A-38) to (A-43) are still more preferable.

TABLE 1

| Structure | Base generation temperature |
|---|---|
| 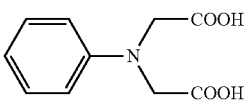 (A-1) | 145° C. |
| 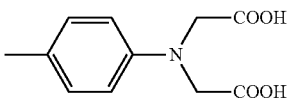 (A-2) | 140° C. |

TABLE 1-continued

| Structure | Base generation temperature |
|---|---|
| (A-3) MeO-C6H4-N(CH2COOH)2 | 140° C. |
| (A-4) Ph-C6H4-N(CH2COOH)2 | 150° C. |
| (A-5) 3,5-(F3C)2-C6H3-N(CH2COOH)2 | 155° C. |
| (A-6) 4-F3C-C6H4-N(CH2COOH)2 | 155° C. |
| (A-7) 4-MeC(O)-C6H4-N(CH2COOH)2 | 155° C. |
| (A-8) (HOOCCH2)2N-C6H4-CH2-C6H4-N(CH2COOH)2 | 145° C. |
| (A-9) (HOOCCH2)2N-C6H4-C(Me)2-C6H4-N(CH2COOH)2 | 140° C. |
| (A-10) 4-Me-C6H4-NH-CH(COOH)-CH2-COOH | 200° C. |

TABLE 1-continued
| Structure | Base generation temperature |
|---|---|
| 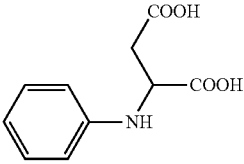 (A-11) | 200° C. |
TABLE 2
| Structure | Base generation temperature |
|---|---|
| (A-12) | 150° C. |
| (A-13) | 170° C. |
| (A-14) | 170° C. |
| (A-15) | 170° C. |
| (A-16) | 130° C. |
| (A-17) | 190° C. |
TABLE 3
| Structure | Base generation temperature pKa1 of anion |
|---|---|
| (A-18) | Base generation temperature = 150° C. pKa1 = 1.9 |
| (A-19) | Base generation temperature = 150° C. pKa1 = 2.0 |

TABLE 3-continued
| Structure | | Base generation temperature pKa1 of anion |
|---|---|---|
| 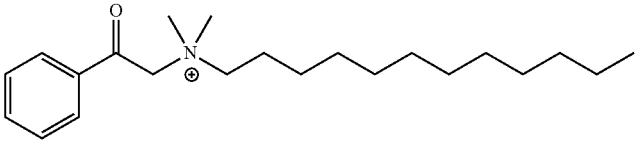 (A-20) | 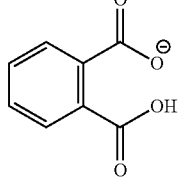 | Base generation temperature = 150° C. pKa1 = 3.0 |
| 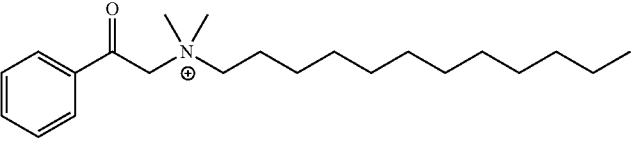 (A-21) | 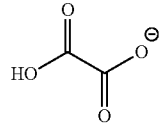 | Base generation temperature = 150° C. pKa1 = 1.2 |
| 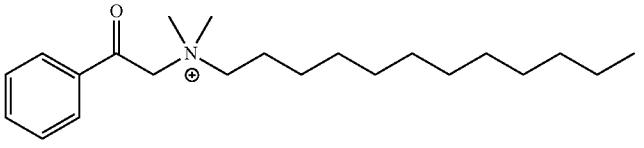 (A-22) | 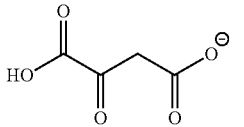 | Base generation temperature = 130° C. pKa1 = 4.2 |
| 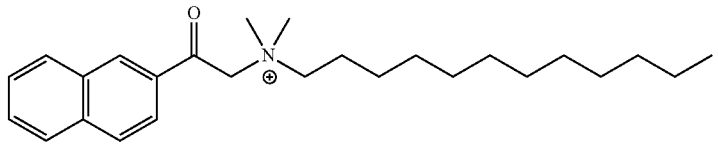 (A-23) | 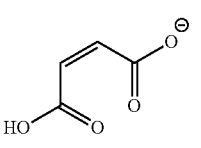 | Base generation temperature = 140° C. pKa1 = 1.9 |
| 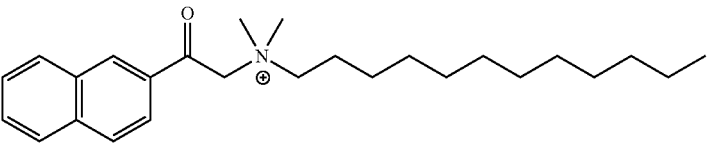 (A-24) | 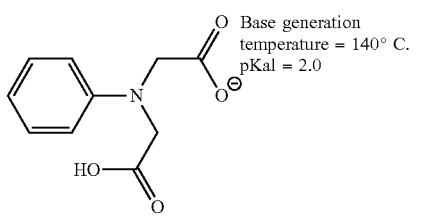 | Base generation temperature = 140° C. pKa1 = 2.0 |

TABLE 3-continued

| Structure | Base generation temperature pKa1 of anion |
|---|---|
| (A-25) | Base generation temperature = 150° C.<br>pKa1 = 3.0 or less |
| (A-26) | Base generation temperature = 150° C.<br>pKa1 = 3.0 or less |

TABLE 4

| Structure | Base generation temperature pKa1 of anion |
|---|---|
| (A-27) | Base generation temperature = 140° C.<br>pKa1 = 1.2 |
| (A-28) | Base generation temperature = 140° C.<br>pKa1 = 1.2 |
| (A-29) | Base generation temperature = 140° C.<br>pKa1 = 1.2 |

TABLE 4-continued
| Structure | Base generation temperature pKa1 of anion |
|---|---|
| 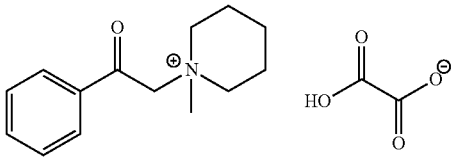 (A-30) | Base generation temperature = 140° C. pKa1 = 1.2 |
| 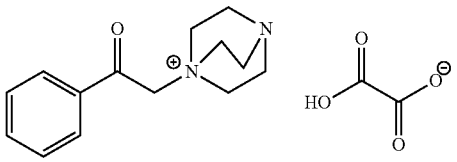 (A-31) | Base generation temperature = 140° C. pKa1 = 1.2 |
| 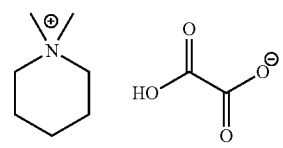 (A-32) | Base generation temperature = 190° C. pKa1 = 1.2 |
| 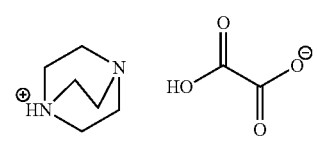 (A-33) | Base generation temperature = 70° C. pKa1 = 1.2 |
| 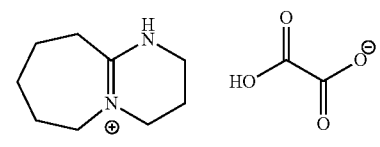 (A-34) | Base generation temperature = 80° C. pKa1 = 1.2 |
| 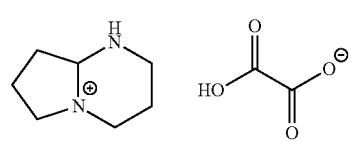 (A-35) | Base generation temperature = 80° C. pKa1 = 1.2 |
| 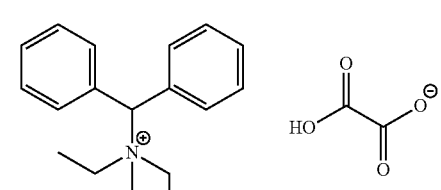 (A-36) | Base generation temperature = 170° C. pKa1 = 1.2 |

TABLE 4-continued

| Structure | Base generation temperature pKa1 of anion |
|---|---|
| 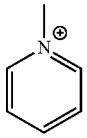<br>(A-37) | Base generation temperature = 180° C.<br>pKa1 = 1.2 |

TABLE 5

| Structure | Base generation temperature pKa1 of anion |
|---|---|
| 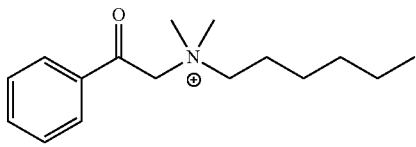<br>(A-38) | Base generation temperature = 150° C.<br>pKa1 = 1.9 |
| 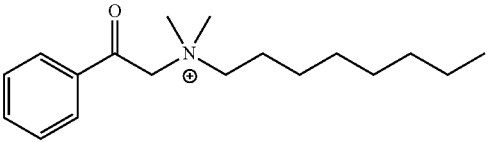<br>(A-39) | Base generation temperature = 150° C.<br>pKa1 = 1.9 |
| 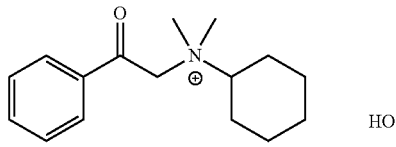<br>(A-40) | Base generation temperature = 150° C.<br>pKa1 = 1.9 |
| 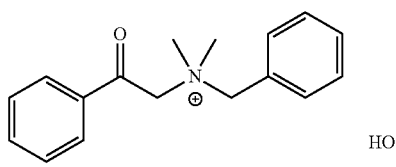<br>(A-41) | Base generation temperature = 150° C.<br>pKa1 = 1.9 |
| 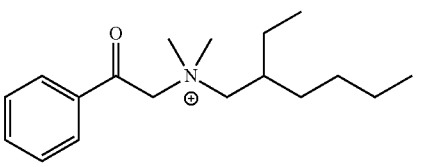<br>(A-42) | Base generation temperature = 150° C.<br>pKa1 = 1.9 |

As the thermal base generator used in the present invention, those described in paragraph Nos. 0015 to 0055 of the specification of Japanese Patent No. 2015-034388 are preferably used, and the contents thereof are incorporated herein.

In a case of using a thermal base generator, the content of the thermal base generator in the photosensitive resin composition is preferably 0.1% to 50% by mass, with respect to the total solid content of the photosensitive resin composition. The lower limit is more preferably 0.5% by mass or more, and still more preferably 1% by mass or more. The upper limit is more preferably 30% by mass or less, and still more preferably 20% by mass or less.

One kind of or two or more kinds of the thermal base generators may be used. In a case of using two or more kinds of the thermal base generators, the total amount is preferably within the above range.

<Thermal Acid Generator>

The photosensitive resin composition of the present invention may include a thermal acid generator. The thermal acid generator generates an acid upon heating, promotes the cyclization of the heterocycle-containing polymer precursor, and further improves the mechanical characteristics of a cured film, and further, there is an effect of promoting the crosslinking reaction of at least one compound selected from a compound having a hydroxymethyl group, an alkoxymethyl group, or an acyloxymethyl group, an epoxy compound, an oxetane compound, and a benzoxazine compound.

The thermal decomposition initiation temperature of the thermal acid generator is preferably 50° C. to 270° C., and more preferably 250° C. or lower. Further, it is preferable to select a thermal acid generator which does not generate an acid during drying (prebaking: about 70° C. to 140° C.) after applying the photosensitive resin composition onto a substrate, but generates an acid during final heating (curing: about 100° C. to 400° C.) after exposure and development later since a reduction in the sensitivity during development can be suppressed.

The acid generated from the thermal acid generator is preferable, and preferred examples thereof include arylsulfonic acids such as p-toluenesulfonic acid and benzenesulfonic acid, alkylsulfonic acids such as methanesulfonic acid, ethanesulfonic acid, and butanesulfonic acid, or haloalkylsulfonic acids such as trifluoromethanesulfonic acid. Examples of such the thermal acid generator include those described in paragraph No. 0055 of JP2013-72935A.

Among these, an alkylsulfonic acid having 1 to 4 carbon atoms or a haloalkylsulfonic acid having 1 to 4 carbon atoms is more preferably generated from the viewpoints of less residues in the cured film and no deterioration of the physical properties of a cured film.

As the thermal acid generator, (4-hydroxyphenyl)dimethylsulfonium methanesulfonate, (4-((methoxycarbonyl)oxy)phenyl)dimethylsulfonium methanesulfonate, benzyl(4-hydroxyphenyl)methylsulfonium methanesulfonate, benzyl(4-((methoxycarbonyl)oxy)phenyl)methylsulfonium methanesulfonate, (4-hydroxyphenyl)methyl((2-methylphenyl)methyl)sulfonium methanesulfonate, (4-hydroxyphenyl)dimethylsulfonium trifluoromethanesulfonate, (4-((methoxycarbonyl)oxy)phenyl)dimethylsulfonium trifluoromethanesulfonate, benzyl(4-hydroxyphenyl)methylsulfonium trifluoromethanesulfonate, benzyl(4-((methoxycarbonyl)oxy)phenyl)methylsulfonium trifluoromethanesulfonate, (4-hydroxyphenyl)methyl((2-methylphenyl)methyl)sulfonium trifluoromethanesulfonate, 3-(5-(((propylsulfonyl)oxy)imino)thiophen-2(5H)-ylidene)-2-(o-tolyl)propanenitrile, or 2,2-bis(3-(methanesulfonylamino)-4-hydroxyphenyl)hexafluoropropane is preferable.

Furthermore, the compounds described in paragraph No. 0059 of JP2013-167742A is also preferable as the thermal acid generator.

In a case of using the thermal acid generator, the content of the thermal acid generator is preferably 0.01 parts by mass or more, more preferably 0.1 parts by mass or more, and still more preferably 0.01 parts by mass or more, with respect to 100 parts by mass of the heterocycle-containing polymer precursor. By incorporation of the thermal acid generator at the content of 0.01 parts by mass or more, the crosslinking reaction and the cyclization of the heterocycle-containing polymer precursor are promoted, and therefore, the mechanical characteristics and the chemical resistance of the cured film can be further improved. In addition, from the viewpoint of the insulating properties of the cured film, the content is preferably 20 parts by mass or less, more preferably 15 parts by mass or less, and still more preferably 10 parts by mass or less.

The thermal acid generator may be used singly or in combination of two or more kinds thereof. In a case of using the thermal acid generators in combination of two or more kinds thereof, a total amount thereof is preferably within the above range.

<Thermal Radical Polymerization Initiator>

The photosensitive resin composition of the present invention may include a thermal radical polymerization initiator. A known thermal radical polymerization initiator may be used as the thermal radical polymerization initiator.

The thermal radical polymerization initiator is a compound which generates radicals with heat energy to initiate or accelerate a polymerization reaction of a polymerizable compound. By adding a thermal radical polymerization initiator, the polymerization reaction of the polymerizable compound can proceed when the cyclization reaction of a heterocycle-containing polymer precursor is allowed to proceed. Further, in a case where the heterocycle-containing polymer precursor contains an ethylenically unsaturated bond, it would become possible to achieve being of higher heat resistance since the polymerization reaction of a heterocycle-containing polymer precursor can also be proceeded together with the cyclization of a heterocycle-containing polymer precursor.

Examples of the thermal radical polymerization initiator include aromatic ketones, an onium salt compound, a peroxide, a thio compound, a hexaarylbiimidazole compound, a ketoxime ester compound, a borate compound, an azinium compound, a metallocene compound, an active ester compound, a compound having a carbon-halogen bond, and an azo-based compound. Among those, a peroxide and an azo-based compound are more preferable, and a peroxide is particularly preferable.

The thermal radical polymerization initiator used in the present invention has a 10 hour half-time period temperature of preferably 90° C. to 130° C., and more preferably 100° C. to 120° C.

Specific examples of the thermal radical polymerization initiator include the compounds described in paragraph Nos. 0074 to 0118 of JP2008-63554A.

As a commercially available product, PERBUTYL Z and PERCUMYL D (manufactured by Nippon Oil & Fats Co., Ltd.) can be suitably used.

In a case where the photosensitive resin composition contains a thermal radical polymerization initiator, the content of the thermal radical polymerization initiator is preferably 0.1% to 50% by mass, more preferably 0.1% to 30% by mass, and particularly preferably 0.1% to 20% by mass, with respect to the total solid content of the photosensitive resin composition. Further, the thermal radical polymerization initiator is contained an amount of preferably 0.1 to 50 parts by mass, and more preferably 0.5 to 30 parts by mass, with respect to 100 parts by mass of the polymerizable compound. According to this aspect, it is easy to form a cured film having superior heat resistance.

The thermal radical polymerization initiator may be of one kind or of two or more kinds thereof. In a case where there are two or more kinds of the thermal radical polymerization initiators, a total amount thereof is preferably within the above range.

<Corrosion Inhibitor>

It is preferable to add a corrosion inhibitor to the photosensitive resin composition of the present invention. The corrosion inhibitor is added for the purpose of preventing the outflow of ions from the metal wiring, and as a compound, for example, the rust inhibitors described in paragraph No. 0094 of JP2013-15701A, the compounds described in paragraph Nos. 0073 to 0076 of JP2009-283711A, the compounds described in paragraph No. 0052 of JP2011-59656A, the compounds described in paragraph Nos. 0114, 0116, and 0118 of JP2012-194520A, or the like can be used. Among these, a compound having a tetrazole ring or a compound having a triazole ring can be preferably used, 1,2,4-triazole, 1,2,3-benzotriazole, 5-methyl-1H-benzotriazole, 1H-tetrazole, or 5-methyl-1H-tetrazole is more preferable, and 1H-tetrazole is the most preferable.

In a case where a corrosion inhibitor is added, the blend amount of the corrosion inhibitor is preferably in the range of 0.1 to 10 parts by mass, and more preferably in the range of 0.2 to 5 parts by mass, with respect to 100 parts by mass of the heterocycle-containing polymer precursor.

The corrosion inhibitor may be used singly or in combination of two or more kinds thereof. In a case of using the corrosion inhibitors in combination of two or more kinds, a total amount thereof is preferably within the above range.

<Metal Adhesiveness Improving Agent>

The photosensitive resin composition of the present invention preferably includes a metal adhesiveness improving agent for improving adhesiveness to metallic materials used for electrodes, wirings, or the like. Examples of the metal adhesiveness improving agent include the sulfide-based compounds described in paragraph Nos. 0046 to 0049 of JP2014-186186A and paragraph Nos. 0032 to 0043 of JP2013-072935A. Other examples of the metal adhesiveness improving agent include the following compound.

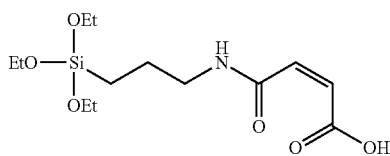 [SMILES: CCO[Si](CCCNC(=O)/C=C\C(=O)O)(OCC)OCC]

In a case of using a metal adhesiveness improving agent, the blend amount of the metal adhesiveness improving agent is preferably 0.1 to 30 parts by weight, and more preferably 0.5 to 15 parts by weight, with respect to 100 parts by mass of the polyimide precursor. If the blend amount is 0.1 parts by weight or more, the adhesiveness of the film after thermal curing to a metal is improved, whereas if the content is 30 parts by weight or less, the heat resistance and the mechanical characteristics of the film after curing is improved.

The metal adhesiveness improving agent may be of one kind or of two or more kinds thereof. In a case of using the metal adhesiveness improving agents in combination of two or more kinds thereof, a total amount thereof is preferably within the above range.

<<Silane Coupling Agent>>

In a view of improving the adhesiveness to a substrate, it is preferable that the photosensitive resin composition of the present invention includes a silane coupling agent. Examples of the silane coupling agent include the compounds described in paragraph Nos. 0062 to 0073 of JP2014-191002A, the compounds described in paragraph Nos. 0063 to 0071 of WO2011/080992A1, the compounds described in paragraph Nos. 0060 and 0061 of JP2014-191252A, the compounds described in paragraph Nos. 0045 to 0052 of JP2014-41264A, and the compounds described in paragraph No. 0055 of WO2014/097594A. In addition, it is also preferable that two or more different kinds of the silane coupling agents are used as described in paragraph Nos. 0050 to 0058 of JP2011-128358A.

In a case of using the silane coupling agent, the blend amount of the silane coupling agent is preferably in the range of 0.1 to 20 parts by weight, and more preferably in the range of 1 to 10 parts by weight, with respect to 100 parts by mass of the heterocycle-containing polymer precursor. If the blend amount is 0.1 parts by mass or more, sufficient adhesiveness to a substrate can be imparted, whereas if the blend amount is 20 parts by mass or less, problems such as an increase in viscosity during preservation at room temperature can be further suppressed.

The silane coupling agent may be used singly or in combination of two or more kinds thereof. In a case of using the combination of two or more kinds, a total amount thereof is preferably within the above range.

<Dissolution Accelerator>

In a case where the photosensitive resin composition of the present invention is of a positive tone using an alkali developer, it is preferable to add a dissolution accelerator (solubility-promoting compound) from the viewpoint of improving the sensitivity. Examples of the dissolution accelerator include low molecular phenols (for example, Bis-Z, TekP-4HBPA, TrisP-HAP, TrisP-PA, BisRS-2P, and BisRS-3P (all trade names, manufactured by Honshu Chemical Industry Co., Ltd.), BIR-PC, BIR-PTBP, and BIR-BIPC-F (all trade names, manufactured by Asahi Organic Chemicals Industry Co., Ltd.), the phenols described in paragraph Nos. 0056 to 0062 of JP2013-152381), and arylsulfonamide derivatives (for example, the compounds described in paragraph No. 0058 of JP2011-164454A).

In a case of using the dissolution accelerator, the blend amount of the dissolution accelerator is preferably 0.1 to 20 parts by weight, and more preferably in the range of 1 to 10 parts by weight, with respect to 100 parts by mass of the heterocycle-containing polymer precursor.

The dissolution accelerator may be used singly or in combination of two or more kinds thereof. In a case of using the combination of two or more kinds, a total amount thereof is preferably within the above range.

<<Dissolution Inhibitor>>

In a case where the photosensitive resin composition of the present invention is of a positive tone using an alkali developer, it is preferable to add a dissolution inhibitor (solubility-inhibiting compound) for the purpose of adjusting the solubility in an alkali developer. As such the compound, an onium salt, a diaryl compound, and a tetraalkylammonium salt are preferable.

Examples of the onium salt include iodonium salts such as a diaryliodonium salt, sulfonium salts such as a triarylsulfonium salt, phosphonium salts, and diazonium salts such as an aryldiazonium salt.

Examples of the diaryl compound include diarylurea, diarylsulfone, diarylketone, diaryl ether, diarylpropane, diarylhexafluoropropane, and the like, in which two aryl groups are bonded via a bonding group, and a phenyl group is preferable as the aryl group.

Examples of the tetraalkylammonium salt include tetraalkylammonium halide in which the alkyl group is a methyl group, an ethyl group, or the like.

Among these, examples of those exhibiting a good dissolution inhibitory effect include diaryliodonium salts, diarylurea, diarylsulfone, and tetramethylammonium halide, examples of the diarylurea include diphenylurea and dimethyldiphenylurea, and examples of the tetramethylammonium halide include tetramethylammonium chloride, tetramethylammonium bromide, and tetramethylammonium iodide.

Among these, a diaryliodonium salt represented by General Formula (Inh) is preferable.

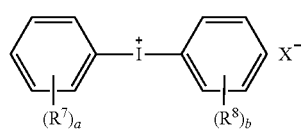

(Inh)

(In the formula, $X^-$ represents a counter anion, $R^7$ and $R^8$ each independently represent a monovalent organic group, and a and b each independently represent an integer of 0 to 5.)

Examples of the counter anion X— include a nitrate ion, a tetrafluorinated boron ion, a perchlorate ion, a trifluoromethanesulfonate ion, a p-toluenesulfonate ion, a thiocyanate ion, a chlorine ion, a bromine ion, and an iodine ion.

As the diaryliodonium salt, for example, diphenyliodonium nitrate, bis(p-tert-butylphenyl)iodonium nitrate, diphenyliodonium trifluoromethanesulfonate, bis(p-tert-butylphenyl)iodonium trifluoromethanesulfonate, diphenyliodonium bromide, diphenyliodonium chloride, diphenyliodonium iodide, diphenyliodonium-8-anilinonaphthalene-1-sulfonate or the like can be used.

Among these, diphenyliodonium nitrate, diphenyliodonium trifluoromethanesulfonate, and diphenyliodonium-8-anilinonaphthalene-1-sulfonate can be mentioned as the preferred salts due to enhanced effects.

In a case where a dissolution inhibitor is contained, the content of the dissolution inhibitor is preferably 0.1 to 20 parts by mass, more preferably 0.1 to 15 parts by mass, and still more preferably 0.5 to 10 parts by mass, with respect to 100 parts by mass of the heterocycle-containing polymer precursor, in a view of the tolerance in sensitivity and development time.

The dissolution inhibitor may be used singly or in combination of two or more kinds thereof. In a case of using the combination of two or more kinds, a total amount thereof is preferably within the above range.

<Sensitizing Dye>

The photosensitive resin composition of the present invention may include a sensitizing dye. The sensitizing dye becomes an electron excited state by absorbing specific actinic radiation. The sensitizing dye in the electronically excited state comes into contact with a thermal base generator, a thermal radical polymerization initiator, a photoradical polymerization initiator, or the like, resulting in actions such as electron transfer, energy transfer, and heat generation. Thus, a thermal base generator, a thermal radical polymerization initiator, or a photoradical polymerization initiator undergoes chemical changes to be decomposed to produce a radical, an acid or a base.

Preferred examples of the sensitizing dye include those which belong to the following compounds and have an absorption wavelength in a region of 300 nm to 450 nm. Examples thereof include polynuclear aromatic compounds (for example, phenanthrene, anthracene, pyrene, perylene, triphenylene, and 9,10-dialkoxyanthracene), xanthenes (for example, fluorescein, eosin, erythrosine, rhodamine B, and rose bengal), thioxanthones (for example, 2,4-diethylthioxanthone), cyanines (for example, thiacarbocyanine, and oxacarbocyanine), merocyanines (for example, merocyanine and carbomerocyanine), thiazines (for example, thionine, methylene blue, and toluidine blue), acridines (for example, acridine orange, chioroflavin, and acriflavin), anthraquinones (for example, anthraquinone), squaryliums (for example, squarylium), coumarins (for example, 7-diethylamino-4-methylcoumarin), phenothiazines, styryl benzenes, distyryl benzenes, and carbazoles.

Among these, in the present invention, it is preferable to use polynuclear aromatic compounds (for example, phenanthrene, anthracene, pyrene, perylene, and triphenylene), thioxanthones, distyryl benzenes, or styryl benzenes from the viewpoint of initiation efficiency, and it is more preferable to use a compound having an anthracene skeleton. Particularly preferred specific examples of the compound include 9,10-diethoxyanthracene and 9,10-dibutoxyanthracene.

In a case where the photosensitive resin composition includes a sensitizing dye, the content of the sensitizing dye is preferably 0.01% to 20% by mass, more preferably 0.1% to 15% by mass, and still more preferably 0.5% to 10% by mass, with respect to the total solid content of the photosensitive resin composition. The sensitizing dye may be used singly and in combination of two or more kinds thereof.

<Chain Transfer Agent>

The photosensitive resin composition of the present invention may contain a chain transfer agent. The chain transfer agent is defined, for example, in Polymer Dictionary, 3$^{rd}$ Edition, pp. 683 and 684 (edited by The Society of Polymer Science, 2005). As the chain transfer agent, for example, a group of compounds having SH, PH, SiH, or GeH in their molecules is used. Such a compound group donates a hydrogen to a low active radical species to generate a radical or is oxidized and then deprotonated to generate a radical. In particular, thiol compounds (for example, 2-mercaptobenzimidazoles, 2-mercaptobenzothiazoles, 2-mercaptobenzoxazoles, 3-mercaptotriazoles, and 5-mercaptotetrazoles) can be preferably used.

In a case where the photosensitive resin composition contains a chain transfer agent, the content of the chain transfer agent is preferably 0.01 to 20 parts by mass, more preferably 0.01 to 10 parts by mass, and particularly preferably 1 to 5 parts by mass, with respect to 100 parts by mass of the total solid content of the photosensitive resin composition.

The chain transfer agent may be of one kind or of two or more kinds thereof. In a case where there are two or more kinds of the chain transfer agents, a total amount thereof is preferably within the above range.

<Polymerization Inhibitor>

The photosensitive resin composition of the present invention preferably contains a small amount of a polymerization inhibitor in order to inhibit unnecessary thermal polymerization of a heterocycle-containing polymer precursor and a radically polymerizable compound during production or preservation of the composition.

Suitable examples of the polymerization inhibitor include hydroquinone, p-methoxyphenol, di-tert-butyl-p-cresol, pyrogallol, p-tert-butylcatechol, benzoquinone, 4,4'-thiobis (3-methyl-6-tert-butylphenol), 2,2'-methylene bis(4-methyl-6-tert-butylphenol), an N-nitroso-N-phenylhydroxylaminealuminum salt, phenothiazine, N-nitrosodiphenylamine, N-phenylnaphthylamine, ethylenediamine tetraacetic acid, 1,2-cyclohexanediamine tetraacetic acid, glycol etherdiamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, an N-nitroso-N-(1-naphthyl)hydroxylamineammonium salt, and bis(4-hydroxy-3,5-tert-butyl)phenylmethane.

In a case where the photosensitive resin composition contains a polymerization inhibitor, the content of the polymerization inhibitor is preferably 0.01% to 5% by mass with respect to the total solid content of the photosensitive resin composition.

The polymerization inhibitor may be of one kind or of two or more kinds thereof. In a case where there are two or more kinds of the polymerization inhibitors, a total amount thereof is preferably within the above range.

The fluorine content in the fluorine-based surfactant is preferably 3% to 40% by mass, more preferably 5% to 30% by mass, and particularly preferably 7% to 25% by mass. The fluorine-based surfactant having a fluorine content in the range described above is effective in view of the uniformity of coating thickness and the liquid-saving property and also exhibits good solubility.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corp.), FLUORAD FC430, FLUORAD FC431, and FLUORAD FC171 (all manufactured by Sumitomo 3M Ltd.), SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (all manufactured by Asahi Glass Co, Ltd.), and PF636, PF656, PF6320, PF6520 and PF7002 (all manufactured by OMNOVA Solutions Inc.).

As the fluorine-based surfactant, a block polymer can also be used, and specific examples thereof include the compounds described in JP2011-89090A.

In addition, the following compounds are also exemplified as the fluorine-based surfactant used in the present invention.

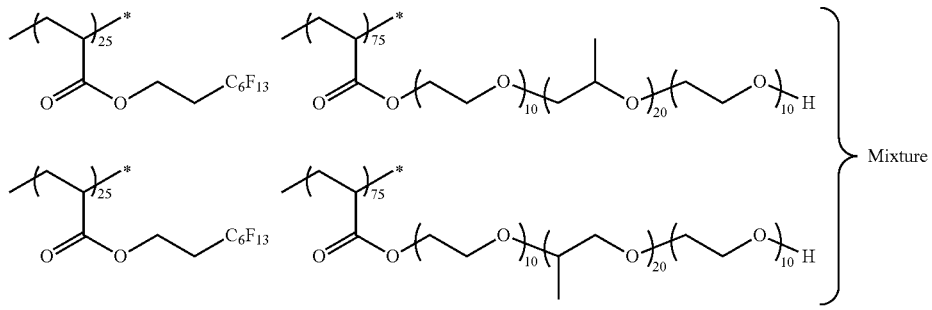

<Surfactant>

From the viewpoint of further improving coatability, various surfactants may be added to the photosensitive resin composition of the present invention. As the surfactant, various surfactants, for example, a fluorine-based surfactant, a nonionic surfactant, a cationic surfactant, an anionic surfactant or a silicone-based surfactant may be used.

In particular, by including a fluorine-based surfactant, liquid properties (particularly, fluidity) of a coating solution prepared are further improved so that the uniformity of coating thickness or the liquid-saving property can be more improved.

In the case of forming a film by using a coating solution containing a fluorine-based surfactant, the interface tension between a surface to be coated and the coating solution is reduced, whereby wettability to the surface to be coated is improved and the coatability on the surface to be coated is increased. This is effective in that even in a case where a thin, film of about several n is formed using a small liquid volume, formation of the film having a little thickness unevenness and a uniform thickness can be more suitably carried out.

The weight-average molecular weight of the compound is, for example, 14,000.

Specific examples of the nonionic surfactant include glycerol, trimethylolpropane, trimethylolethane, ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (PLURONIC L10, L31, L61, L62, 10R5, 17R2, and 25R2, and TETRONIC 304, 701, 704, 901, 904, and 150R1 (manufactured by BASF Corp.)), and SOLSPERSE 20000 (manufactured by The Lubrizol Corp.). In addition, PIONIN D-6112-W manufactured by Takemoto Oil & Fat Co., Ltd., or NCW-101, NCW-1001, or NCW-1002 manufactured by Wako Pure Chemical Industries, Ltd. can also be used.

Specific examples of the cationic surfactant include a phthalocyanine derivative (trade name: EFKA-745, manufactured by Morishita Sangyo K.K.), an organosiloxane polymer KP341 (manufactured by Shin-Etsu Chemical Co., Ltd.), a (meth)acrylic acid (co)polymers POLYFLOW No. 75, No. 90, and No. 95 (manufactured by Kyoeisha Chemical Co., Ltd.) and W001 (manufactured by Yusho Co., Ltd.).

Specific examples of the anionic surfactant include W004, W005, and W017 (manufactured by Yusho Co., Ltd.).

Examples of the silicon-based surfactant include "TORAY SILICONE DC3PA", "TORAY SILICONE SH7PA", "TORAY SILICONE DC11PA", "TORAY SILICONE SH21PA", "TORAY SILICONE SH28PA", "ITORAY SILICONE SH29PA", "TORAY SILICONE SH30PA", and "TORAY SILICONE SH8400" (manufactured by Dow Corning Toray Co., Ltd.), "TSF-4440", "TSF-4300", "TSF-4445", "TSF-4460", and "TSF-4452" (manufactured by Momentive Performance Materials Inc.), "KP341", "KF6001", and "KF6002" (manufactured by Shin-Etsu Silicone Co, Ltd.), and "BYK307", "BYK323", and "BYK330" (manufactured by BYK-Chemie GmbH).

In a case where the photosensitive resin composition contains a surfactant, the content of the surfactant is preferably 0.001% to 2.0% by mass, and more preferably 0.005% to 1.0% by mass, with respect to the total solid content of the photosensitive resin composition.

The surfactant may be of one kind or of two or more kinds thereof. In a case where there are two or more kinds of the surfactants, a total amount thereof is preferably within the above range.

The surfactant may be of one kind or of two or more kinds thereof. In a case where there are two or more kinds of the surfactants, a total amount thereof is preferably within the above range.

<<Higher Fatty Acid Derivative or the Like>>

In order to prevent polymerization inhibition due to oxygen, a higher fatty acid derivative or the like, for example, behenic acid or behenic acid amide may be added to the photosensitive resin composition of the present invention, and may be localized on the surface of a photosensitive resin composition in the process of drying after the coating.

In a case where the photosensitive resin composition contains a higher fatty acid derivative or the like, the content of the higher fatty acid derivative or the like is preferably 0.1% to 10% by mass with respect to the total solid content of the photosensitive resin composition.

The higher fatty acid derivative or the like may be of one kind or of two or more kinds thereof. In a case where there are two or more kinds of the higher fatty acid derivatives or the like is two or more types, a total amount thereof is preferably within the above range.

<Solvent>

In a case where the photosensitive resin composition of the present invention is in the shape of a layer by application, it is preferable to blend a solvent. Known solvents can be used without limitation as long as it is capable of forming the photosensitive resin composition in a layer shape.

Suitable examples of the solvent used in the photosensitive resin composition of the present invention include, as esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl oxyacetate (for example: methyl oxyacetate, ethyl oxyacetate, butyl oxyacetate (for example: methyl methoxyacetate, ethyl methoxyacetate, butyl methoxyacetate, methyl ethoxyacetate or ethyl ethoxyacetate)), alkyl 3-oxypropionate esters (for example: methyl 3-oxypropionate and ethyl 3-oxypropionate (for example, methyl 3-methoxypropionate, ethyl 3-methoxypropionate, methyl 3-ethoxypropionate or ethyl 3-ethoxypropionate)), alkyl 2-oxypropionate esters (for example, methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate or ethyl 2-ethoxypropionate)), methyl 2-oxy-2-methylpropionate and ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate; as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate or propylene glycol monopropyl ether acetate; as ketones, for example, methyl ethyl ketone, cyclohexanone, cyclopentanone, 2-heptanone, 3-heptanone, and N-methyl-2-pyrrolidone; as aromatic hydrocarbons, for example, toluene, xylene, anisole, and limonene; and as sulfoxides, for example, dimethyl sulfoxide.

From the viewpoint of improving the shape of the coated surface, or the like, an aspect in which two or more kinds of the solvents are mixed is also preferable. Among those, a mixed solution formed of two or more kinds of the solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate is preferable. Combined use of dimethyl sulfoxide and γ-butyrolactone is particularly preferable.

In a case where the photosensitive resin composition contains a solvent, the content of the solvent is set such that the total concentration of solid contents of the photosensitive resin composition becomes preferably 5% to 80% by mass, more preferably 5% to 70% by mass, and particularly preferably 10% to 60% by mass, from the viewpoint of coatability.

The solvent may be of one kind or of two or more kinds thereof. In a case where there are two or more kinds of the solvents, a total amount thereof is preferably within the above range.

In addition, from the viewpoint of a film strength, the content of N-methyl-2-pyrrolidone, N-ethyl-2-pyrrolidone, N,N-dimethylacetamide, and N,N-dimethylformamide is preferably less than 5% by mass, more preferably less than 1% by mass, still more preferably less than 0.5% by mass, and particularly preferably less than 0.1% by mass, with respect to the total mass of the photosensitive resin composition.

<Other Additives>

The photosensitive resin composition of the present invention may contain, if desired, various additives, for example, a curing agent, a curing catalyst, a silane coupling agent, a filler, an antioxidant, an ultraviolet absorbent, and an aggregation inhibitor as long as the effects of the present invention are not impaired. In the case of adding such an additive, the total blend amount thereof is preferably set to 3% by mass or less of the solid content of the photosensitive resin composition.

The moisture content of the photosensitive resin composition of the present invention is preferably less than 5% by mass, more preferably less than 1% by mass, and particularly preferably less than 0.6% by mass, from the viewpoint of the shape of the coated surface.

The metal content in the photosensitive resin composition of the present invention is preferably less than 5 ppm by mass, more preferably less than 1 ppm by mass, and particularly preferably less than 0.5 ppm by mass, from the viewpoint of insulating properties. Examples of the metal include sodium, potassium, magnesium, calcium, iron, chromium, and nickel. In a case of containing a plurality of metals, it is preferable that the total of these metals is within the above range.

Furthermore, examples of a method for reducing metal impurities that are included in the photosensitive resin composition without intention include a method in which a raw material having a low metal content as a raw material constituting the photosensitive resin composition is selected, the raw material constituting the photosensitive resin composition is filtered through a filter, and the inside of the device is lined with polytetrafluoroethylene or the like, and distilled under the conditions where contamination can be suppressed as much as possible.

The content of halogen atoms in the photosensitive resin composition of the present invention is preferably less than 500 ppm by mass, more preferably less than 300 ppm by mass, and particularly preferably less than 200 ppm by mass, from the viewpoint of wiring corrosion preventing properties. Among those, one present in the state of halogen ions is preferably less than 5 ppm by mass, more preferably less than 1 ppm by mass, and particularly preferably less than 0.5 ppm by mass. Examples of the halogen atom include a chlorine atom and a bromine atom. The total of chlorine atoms and bromine atoms, or the total of chloride ions and bromide ions is preferably within the above range.

<Preparation of Photosensitive Resin Composition>

The photosensitive resin composition of the present invention can be prepared by mixing the respective components. The mixing method is not particularly limited and may be carried out by a method known in the related art.

Incidentally, for the purpose of removing impurities such as dusts and fine particles in the photosensitive resin composition, it is preferable to carry out filtration using a filter. The pore diameter of the filter is preferably 1 μm or less, more preferably 0.5 min or less, and still more preferably 0.1 μm or less. As for the materials of the filter, a polytetrafluoroethylene-made, polyethylene-made, or nylon-made filter is preferable. The filter which has been washed with an organic solvent in advance may also be used. In the step of filtration using a filter, a plurality of kinds of filters which are connected in series or in parallel may be used. In a case of using a plurality of kinds of filters, a combination of filters having different pore diameters and/or materials may be used. Incidentally, various materials may be filtered in plural times, and the step of filtration in plural times may be a circulatory filtration step. In addition, filtration may be carried out with pressurization, and the pressure for the pressurization is preferably from 0.05 MPa to 0.3 MPa.

In addition to the filtration using a filter, removal of impurities may be carried out using an adsorbing material. Further, a combination of filtration using a filter and removal of impurities using an adsorbing material may be carried out. As the adsorbing material, known adsorbing materials may be used, and for example, inorganic adsorbing materials such as silica gel and zeolite, and organic adsorbing materials such as activated carbon can be used.

<Use of Photosensitive Resin Composition>

The photosensitive resin composition of the present invention can be cured and used as a cured film. The photosensitive resin composition of the present invention is capable of forming a cured film having excellent heat resistance and insulating properties, and therefore, can be preferably used for an insulating film of semiconductor devices, an interlayer insulating film for a re-wiring layer, or the like. In particular, the photosensitive resin composition of the present invention can be preferably used for an interlayer insulating film for a re-wiring layer, or the like in three-dimensional mounting devices.

Moreover, the photosensitive resin composition of the present invention can also be used in photoresists for electronics (a galvanic (electrolysis) resist (galvanic resist), an etching resist, or a solder top resist), or the like.

In addition, the photosensitive resin composition can also be used in manufacture of printing plates such as offset printing plates and screen printing plates, for use in etching of molded parts, in electronics, and particularly for production of protective lacquers and dielectric layers in microelectronics.

<Method for Producing Cured Film>

Next, a method for producing a cured film of the present invention will be described. The method is not particularly determined as long as the precursor composition of the present invention or the photosensitive resin composition of the present invention is used to form the cured film of the present invention. The method for producing a cured film of the present invention preferably has a step of applying the precursor composition of the present invention or the photosensitive resin composition of the present invention onto a substrate, and a step of curing the precursor composition or the photosensitive resin composition applied onto the substrate. Hereinafter, description will be made by way of an example of a case of using the photosensitive resin composition.

<<Step of Applying Photosensitive Resin Composition onto Substrate>>

Examples of the method for applying a photosensitive resin composition onto a substrate include spinning, immersing, doctor-blade coating, suspended casting, coating, spraying, electrostatic spraying, and reverse-roll coating, with spinning, electrostatic spraying, and reverse-roll coating being preferable due to uniform application onto a substrate. It is also possible to introduce a photosensitive layer onto a temporary and flexible carrier, and then to coat a final substrate, for example, a copper-covered printed circuit board obtained by layer transfer via lamination.

Examples of the substrate include an inorganic substrate, a resin, and a resin composite material.

Examples of the inorganic substrate include a glass substrate, a quartz substrate, a silicon substrate, silicon nitride substrate, and a composite substrate in which molybdenum, titanium, aluminum, copper, or the like is vapor-deposited onto such a substrate.

Examples of the resin substrate include substrates made of synthetic resins such as polybutylene terephthalate, polyethylene terephthalate, polyethylene naphthalate, polybutylene naphthalate, polystyrene, polycarbonate, polysulfone, polyethersulfone, polyarylate, allyl diglycol carbonate, polyamide, polyimide, polyamideimide, polyetherimide, polybenzazole, polyphenylene sulfide, polycycloolefin, a norbornene resin, a fluororesin, for example polychlorotrifluoroethylene, a liquid crystal polymer, an acrylic resin, an epoxy resin, a silicone resin, an ionomer resin, a cyanate resin, a crosslinked fumaric acid diester, a cyclic polyolefin, an aromatic ether, a maleimide-olefin, a cellulose, and an episulfide compound. A case where these substrates are used in the above-mentioned form as they are is uncommon, and usually depending on the form of a final product, a multi-layer laminate structure such as a thin film transistor (TFT) element is formed thereon.

The amount (thickness of layer) of the photosensitive resin composition to be applied and the type (carrier of a layer) of the substrate are dependent on the field of applications which are desired. It is particularly advantageous that the photosensitive resin composition can be used in a widely variable layer thickness. The range of the layer thickness is preferably 0.5 to 100 µm.

After applying the photosensitive resin composition onto the substrate, it is preferable to carry out drying. The drying is preferably carried out, for example, at 60° C. to 150° C. for 10 seconds to 2 minutes.

<<Step of Heating>>

By heating the photosensitive resin composition applied onto the substrate, the cyclization reaction of the heterocycle-containing polymer precursor proceeds, whereby it is possible to form a cured film having excellent heat resistance.

The heating temperature is preferably 50° C. to 300° C., and more preferably 100° C. to 250° C.

According to the present invention, since many isomers having higher cyclization rates are included, it is also possible to carry out the cyclization reaction of the heterocycle-containing polymer precursor at a lower temperature.

It is preferable to adjust at least one selected from the heating rate, the heating time, and the cooling rate from the viewpoint of internal stress reduction and warping suppression of a cured film.

The heating rate is preferably 3° C./min to 5° C./min at a heating initiation temperature set to 20° C. to 150° C.

In a case where the heating temperature is 200° C. to 240° C., the heating time is preferably 180 minutes or more. The upper limit is, for example, preferably 240 minutes or less. In a case where the heating temperature is 240° C. to 300° C., the heating time is preferably 90 minutes or more. The upper limit is, for example, preferably 180 minutes or less. In a case where the heating temperature is 300° C. to 380° C., the heating time is preferably 60 minutes or more. The upper limit is, for example, preferably 120 minutes or less.

The cooling rate is preferably 1° C./min to 5° C./min.

The heating may be carried out stepwise. An example of heating includes a step in which the temperature is increased at 5° C./min from 20° C. to 150° C., allowed to stand at 150° C. for 30 minutes, increased at 5° C./min from 150° C. to 230° C., and then allowed to stand at 230° C. for 180 minutes.

The step of heating is preferably carried out in an atmosphere of low oxygen concentration, by flowing of an inert gas such as nitrogen, helium or argon or the like, from the viewpoint of preventing decomposition of a heterocycle-containing polymer precursor such as a polyimide. The oxygen concentration is preferably 50 ppm by volume or less, and more preferably 20 ppm by volume or less.

In the present invention, a patterning step may be carried out between the step of applying a photosensitive resin composition onto a substrate and the step of heating. The patterning step may be carried out, for example, by a photolithography method. For example, there is a method which is carried out through a step of exposing and a step of carrying out a development treatment.

In a case of a negative tone, it is preferable that patterning by a photolithography method is carried out by using a photosensitive resin composition including the above-mentioned heterocycle-containing polymer precursor, a compound having an ethylenically unsaturated bond as the above-mentioned curable compound, and a photoradical polymerization initiator. Further, in a case of a positive tone, it is preferable that the patterning is carried out by using a photosensitive resin composition including the above-mentioned heterocycle-containing polymer precursor and a photoacid generator. In addition, in a case of the negative tone, the heterocycle-containing polymer precursor preferably has an ethylenically unsaturated bond.

Hereinafter, the case of patterning by a photolithography method will be described.

<<Step of Exposing>>

In the step of exposing, the photosensitive resin composition applied onto a substrate is irradiated with actinic rays or radiation in a predetermined pattern.

The wavelength of actinic rays or radiation varies depending on the composition of the photosensitive resin composition, and is preferably 200 to 600 nm and more preferably 300 to 450 nm.

As a light source, a low-pressure mercury lamp, a high-pressure mercury lamp, an ultra high-pressure mercury lamp, a chemical lamp, an LED light source, an excimer laser generator, or the like may be used, and actinic rays having a wavelength ranging from 300 nm to 450 nm such as am i-line (365 nm), an h-line (405 nm), and a g-line (436 nm) may be preferably used. The irradiating light may be adjusted as desired, by way of a spectral filter such as a long-wavelength cut-off filter, a short-wavelength cut-off filter, and a band-pass filter. The exposure dose is preferably 1 to 1,000 mJ/cm$^2$, and more preferably 200 to 800 mJ/cm$^2$. In a view that development can be performed with high development within such the wide ranges, the value of the present is high.

As an exposure device, various types of exposure machines such as a mirror projection aligner, a stepper, a scanner, proximity, contact, a microlens array, a lens scanner, and laser exposure may be used.

Incidentally, in a case of using (meth)acrylates and similar olefin unsaturated compounds, the photopolymerization thereof, particularly in a thin layer, is prevented by oxygen in the air, as is well-known. This effect may be alleviated by, for example, temporary introduction of the coating layer of a polyvinyl alcohol, or a method known in the related art, such as pre-exposure or pre-conditioning in an inert gas.

<<Step of Carrying Out Development Treatment>>

In the step of carrying out a development treatment, an unexposed portion of the photosensitive resin composition is developed using a developer. An aqueous alkaline developer, an organic solvent or the like may be used as the developer.

Examples of an alkali compound used in the aqueous alkaline developer include sodium hydroxide, potassium hydroxide, sodium carbonate, potassium carbonate, sodium hydrogen carbonate, potassium hydrogen carbonate, sodium silicate, potassium silicate, sodium metasilicate, potassium metasilicate, ammonia, and amine. Examples of the amines include ethylamine, n-propylamine, diethylamine, di-n-propylamine, triethylamine, methyldiethylamine, alkanolamine, dimethylethanolamine, triethanolamine, quaternary ammonium hydroxides, tetramethylammonium hydroxide (TMAH), and tetraethylammonium hydroxide. Among those, preferred is a metal-free alkali compound. A suitable aqueous alkaline developer is generally up to 0.5 N in terms of an alkali, but may be appropriately diluted before use. For example, about 0.15 to 0.4 N, and preferably 0.20 to 0.35 N of an aqueous alkaline developer is also suitable. The alkali compound may be of one kind or of two or more kinds thereof. In a case where there are two or more kinds of the alkali compounds, a total amount thereof is preferably within the above range.

As the organic solvents, the same organic solvents as the solvents which can be used in the photosensitive resin composition described above can be used. Suitable examples thereof include n-butyl acetate, γ-butyrolactone, cyclopentanone, and a mixture thereof.

In addition, it is also preferable that a step of heating the developed photosensitive resin composition at a temperature of 50° C. to 500° C. after the step of carrying out the development treatment. Through such a step, there is a merit that the pattern strength is enhanced, and thus, durability is improved.

In a field to which the method for producing a cured film of the present invention is applicable, the method can be preferably used in an insulating film of a semiconductor device, an interlayer insulating film for a re-wiring layer, or the like. In particular, since the resolution is good, the method for producing a cured film according to the present invention can be preferably used for an interlayer insulating film for a re-wiring layer, or the like in three-dimensional mounting devices.

Furthermore, the method for producing a cured film can also be used in photoresists for electronics, (a galvanic (electrolysis) resist galvanic resin, an etching resist, or a solder top resist), or the like.

In addition, the method for producing a cured film can also be used in manufacture of printing plates such as offset printing plates and screen printing plates, etching of molded parts, in electronics, and particularly production of protective lacquers and dielectric layers in microelectronics.

<Semiconductor Device>

Next, description will be made on one embodiment of a semiconductor device in which a photosensitive resin composition is used for an interlayer insulating film for a re-wiring layer.

A semiconductor device 100 shown in the FIGURE is a so-called three-dimensional mounting device, in which a laminate 101 having a plurality of semiconductor elements (semiconductor chips) 101a to 101d laminated thereon is disposed on a wiring board 120.

Furthermore, in this embodiment, although the description focuses on a case where the number of laminated semiconductor elements (semiconductor chips) is 4 layers, the number of laminated semiconductor elements (semiconductor chips) is not particularly limited and may be, for example, 2 layers, 8 layers, 16 layers, and 32 layers. Further, it may be a single layer.

A plurality of semiconductor elements 101a to 101 d are all formed of a semiconductor wafer such as a silicon substrate.

An uppermost semiconductor element 101a does not have a through-electrode, and an electrode pad (not shown) is formed on one surface thereof.

Semiconductor elements 101b to 101d have through-electrodes 102b to 102d, and both surfaces of the respective semiconductor elements are provided with connection pads (not shown) provided integrally with the through-electrodes.

A laminate 101 has a structure in which the semiconductor element 101a having no through-electrode and the semiconductor elements 101b to 101d having the through-electrodes 102b to 102d are flip-chip connected.

In other words, the electrode pad of the semiconductor element 101a having no through-electrode is connected to the connection pad of the semiconductor element 101a side of the semiconductor element 101b having the through-electrode 102b adjacent thereto by a metal bump 103a such as a solder bump; and the connection pad of the other side of the semiconductor element 101b having the through-electrode 102b is connected to the connection pad of the semiconductor element 101b side of the semiconductor element 101c having a through-electrode 102c adjacent thereto by a metal bump 103b such as solder bump. Similarly, the connection pad of the other side of the semiconductor element 101c having the through-electrode 102c is connected to the connection pad of a semiconductor element 101c side of the semiconductor element 101d having a through-electrode 102d adjacent thereto by a metal bump 103c such as solder hump.

Underfill layers 110 are formed in gaps of the respective semiconductor elements 101a to 101d, and the respective semiconductor elements 101a to 101d are laminated through underfill layers 110.

The laminate 101 is laminated on the wiring board 120.

As the wiring board 120, for example, a multilayer wiring board using an insulating substrate such as a resin substrate, a ceramic substrate or a glass substrate as a base material is used. Examples of the wiring board 120 onto which the resin substrate is applied include a multilayer copper-clad laminate (multilayer printed wiring board).

On one surface of the wiring board 120 is provided a surface electrode 120a.

An insulating layer 115 on which the re-wiring layer 105 is formed is disposed between the wiring board 120 and the laminate 101, and the wiring board 120 and the laminate 101 are electrically connected via a re-wiring layer 105. The insulating layer 115 is formed of the photosensitive resin composition of the present invention.

That is, one end of the re-wiring layer 105 is connected to the electrode pad formed on the surface of the re-wiring layer 105 side of the semiconductor element 101d via a metal bump 103d such as solder hump. The other end of the re-wiring layer 105 is connected to the surface electrode 120a of the wiring board via a metal bump 103e such as solder bump.

Incidentally, an underfill layer 110a is formed between the insulating layer 115 and the laminate 101. Further, an underfill layer 110b is formed between the insulating layer 115 and the wiring board 120.

EXAMPLES

Hereinafter, the present invention will be further specifically described with reference to the following Examples, but the present invention is not limited thereto as long as those Examples do not depart from the spirit and scope of the present invention. Further, unless otherwise specified, "%" and "parts" are by mass. NMR is the abbreviation for nuclear magnetic resonance.

<Mass-Average Molecular Weight (Mw)·Number-Average Molecular Weight (Mn) of Heterocycle-Containing Polymer Precursor>

Mw and Mn of the heterocycle-containing polymer precursor are values in terms of polystyrene by gel permeation chromatography (GPC) measurement, and were measured by the following method.

HLC-8220 (manufactured by Tosoh Corporation) was used as a measurement device, and Guard Column HZ-L, TSKgel Super HZM-M, TSKgel Super HZ4000, TSKgel Super HZ3000, and TSKgel Super HZ2000 were used as a column. Further, using tetrahydrofuran (THF) as an eluent, measurement was carried out at 40° C. and a rate of 0.35 mL/min as a flow rate. For detection, a detector with ultraviolet rays (UV) at 254 nm was used. In addition, a sample of a heterocycle-containing polymer precursor which had been adjusted to be diluted to 0.1% by mass with THF was used as a measurement sample.

The dispersity of the heterocycle-containing polymer precursor was calculated from Mw and Mn. Further, in a case where two kinds of polymer precursors were included, Mw and Mn were measured using a sample obtained by mixing both the polymers at a desired blend ratio and then adjusting the mixture to be diluted to 0.1% by mass with THF.

diglyme (diethylene glycol dimethyl ether) were mixed, and the mixture was stirred at a temperature of 60° C. for 2 hours to produce a diester of 4,4'-oxydiphthalic acid with 2-hydroxyethyl methacrylate. Then, the reaction mixture was cooled to −10° C., and 17.1 g of $SOCl_2$ was added thereto for 60 minutes while keeping the temperature at −10±4° C. After dilution with 50 ml of N-methylpyrrolidone, a solution in which 11.7 g of 4,4'-diaminodiphenyl ether had been dissolved in 100 ml of N-methylpyrrolidone was added dropwise to the reaction mixture at −10±4° C. for 60 minutes, and the mixture was stirred for 2 hours. Then, the mixture was put into 6 liters of water to precipitate a polyimide precursor, and a water-polyimide precursor mixture was stirred at a speed of 5,000 rpm for 15 minutes. The polyimide precursor was collected by filtration and put into 4 liters of water again, and the mixture was further stirred for 30 minutes and filtered again. Then, the obtained polyimide precursor was dried at 45° C. for 3 days under reduced pressure.

This polyimide precursor had a weight-average molecular weight of 16,000, a number-average molecular weight of 7,620, and a dispersity of 2.1.

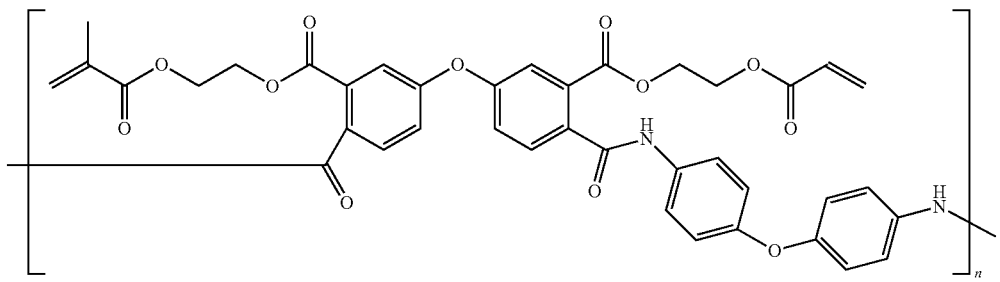

The dispersity of the heterocycle-containing polymer precursor was calculated from Mw and Mn.

Synthesis Example 1

Synthesis of Polyimide Precursor (A-1: Polyimide Precursor Having Radically Polymerizable Unsaturated Group) from 4,4'-Oxydiphthalic Anhydride, 2-Hydroxyethyl Methacrylate, and 4,4'-Diaminodiphenyl Ether 21.2 g of 4,4'-oxydiphthalic anhydride (dried at 140° C. for 12 hours), 18.1 g of 2-hydroxyethyl methacrylate, 0.05 g of hydroquinone, 23.9 g of pyridine, and 150 ml of Synthesis Example 2

Synthesis of Polyimide Precursor (A-2: Polyimide Precursor Having Radically Polymerizable Unsaturated Group) from 4,4'-Oxydiphthalic Anhydride, 2-Hydroxyethyl Methacrylate, and 4,4'-Diaminodiphenyl Ether In the same manner as in Synthesis Example 1 except that the addition amount of 4,4'-diaminodiphenyl ether was changed to 12.9 g, a polyimide precursor was synthesized. This polyimide precursor had a weight-average molecular weight of 38,500, a number-average molecular weight of 16,740, and a dispersity of 2.3.

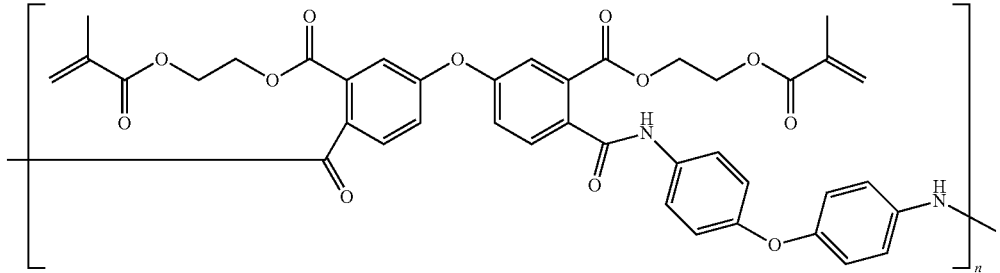

Synthesis Example 3

Synthesis of Polyimide Precursor (A-3: Polyimide Precursor Having Radically Polymerizable Unsaturated Group) from 4,4'-Oxydiphthalic Anhydride, 2-Hydroxyethyl Methacrylate, and 4,4'-Isopropylidene Bisaniline 21.2 g of 4,4'-oxydiphthalic anhydride (dried at 140° C. for 12 hours), 18.1 g of 2-hydroxyethyl methacrylate, 0.05 g of hydroquinone, 23.9 g of pyridine, and 150 ml of diglyme were mixed, and the mixture was stirred at a temperature of 60° C. for 2 hours to produce a diester of 4,4'-oxydiphthalic acid with 2-hydroxyethyl methacrylate.

Synthesis Example 4

Synthesis of Polyimide Precursor (A-4: Polyimide Precursor Having Radically Polymerizable Unsaturated Group) from 4,4'-Oxydiphthalic Anhydride, 2-Hydroxyethyl Methacrylate, and 4,4'-Isopropylidene Bisaniline In the same manner as in Synthesis Example 3 except that the temperature and the time for dropwise addition of a solution in which 4,4'-isopropylidene bisaniline had been dissolved to the reaction mixture were changed to 5±4° C. and 20 minutes, respectively, a polyimide precursor was synthesized. This polyimide precursor had a weight-average molecular weight of 22,000, a number-average molecular weight of 7,100, and a dispersity of 3.1.

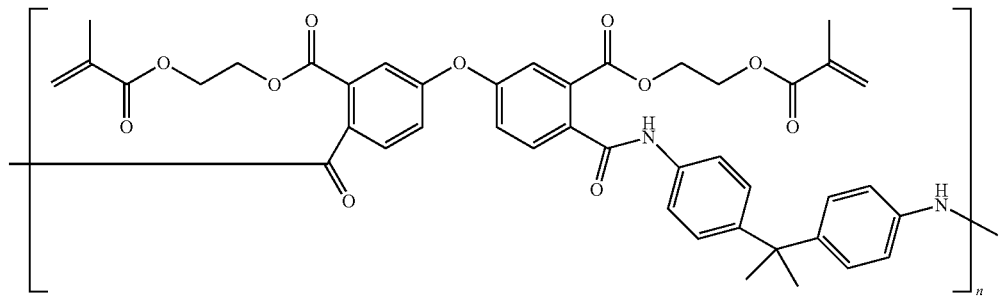

Then, the reaction mixture was cooled to −10° C., and 17.1 g of SOCl$_2$ was added thereto for 60 minutes while keeping the temperature at −10±4° C. After dilution with 50 ml of N-methylpyrrolidone, a solution in which 14.3 g of 4,4'-isopropylidene bisaniline had been dissolved in 100 ml of N-methylpyrrolidone was added dropwise to the reaction mixture at −10±4° C. for 60 minutes, and the mixture was stirred for 2 hours. Then, the mixture was put into 6 liters of water to precipitate a polyimide precursor, and a water-polyimide precursor mixture was stirred at a speed of 5,000 rpm for 15 minutes. The polyimide precursor was collected by filtration and put into 4 liters of water again, and the mixture was further stirred for 30 minutes and filtered again. Then, the obtained polyimide precursor was dried at 45° C. for 3 days under reduced pressure.

This polyimide precursor had a weight-average molecular weight of 30,000, a number-average molecular weight of 13,640, and a dispersity of 2.2.

Synthesis Example 5

Synthesis of Polyimide Precursor (A-5: Polyimide Precursor Having Radically Polymerizable Unsaturated Group) from 4,4'-Oxydiphthalic Anhydride, 2-Hydroxyethyl Methacrylate, and 1,4-Phenylenediamine 21.2 g of 4,4'-oxydiphthalic anhydride (dried at 140° C. for 12 hours), 18.1 g of 2-hydroxyethyl methacrylate, 0.05 g of hydroquinone, 23.9 g of pyridine, and 150 ml of diglyme were mixed, and the mixture was stirred at a temperature of 60° C. for 2 hours to produce a diester of 4,4'-oxydiphthalic acid with 2-hydroxyethyl methacrylate. Then, the reaction mixture was cooled to −10° C., and 17.1 g of SOCl$_2$ was added thereto for 60 minutes while keeping the temperature at −10±4° C. After dilution with 50 ml of N-methylpyrrolidone, a solution in which 6.7 g of 1,4-phenylenediamine had been dissolved in 100 ml of N-methylpyrrolidone was added dropwise to the reaction mixture at 5±4° C. for 20 minutes, and the mixture was stirred for 2

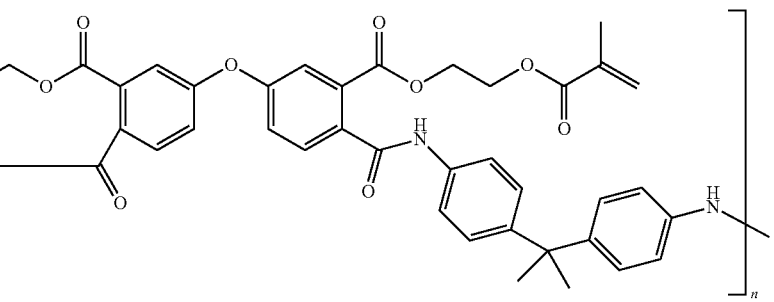

hours. Then, the mixture was put into 6 liters of water to precipitate a polyimide precursor, and a water-polyimide precursor mixture was stirred at a speed of 5,000 rpm for 15 minutes. The polyimide precursor was collected by filtration and put into 4 liters of water again, and the mixture was further stirred for 30 minutes and filtered again. Then, the obtained polyimide precursor was dried at 45° C. for 3 days under reduced pressure.

This polyimide precursor had a weight-average molecular weight of 23,000, a number-average molecular weight of 7,670, and a dispersity of 3.0.

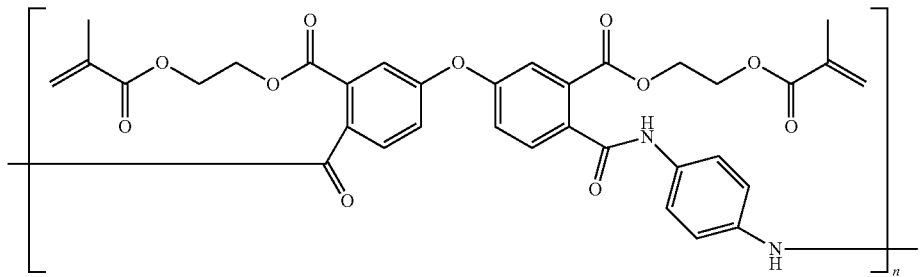

Synthesis Example 6

Synthesis of Polybenzoxazole Precursor (A-6: Polybenzoxazole Precursor) from 4,4'-Oxydiphthalic Acid and 2,2'-Bis(3-amino-4-hydroxyphenyl) hexafluoropropane 44.32 g of a dicarboxylic acid derivative (4,4'-oxydiphthalic acid) obtained by reacting 23.24 g of diphenyl ether-4,4'-dicarboxylic acid with 12.16 g of 1-hydroxy-1,2,3-benzotriazole, and 28.25 g of 2,2'-bis(3-amino-4-hydroxyphenyl)hexafluoropropane were mixed with and dissolved in 275 g of N-methylpyrrolidone. Then, the mixture was stirred at a temperature of 75° C. for 16 hours. Thereafter, 3.5 g of 4-ethynylphthalic anhydride which had been dissolved in 10 g of N-methylpyrrolidone was added thereto, and the mixture was stirred for 3 hours. Then, the reaction mixture was put into a mixed solvent of 4 liters of water and 2 liters of methanol to precipitate a polybenzoxazole precursor, and a water-polybenzoxazole precursor mixture was stirred at a speed of 5,000 rpm for 15 minutes. The polybenzoxazole precursor was collected by filtration and sufficiently washed with water, and then the obtained precursor was dried at 45° C. for 3 days under reduced pressure.

This polybenzoxazole precursor had a weight-average molecular weight of 17,000, a number-average molecular weight of 7,730, and a dispersity of 2.2.

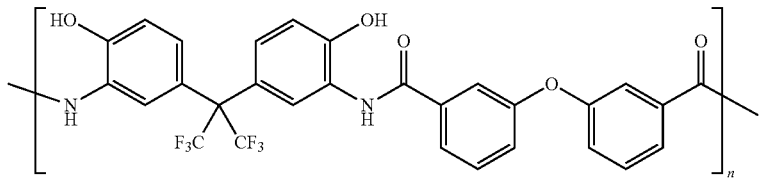

Synthesis Example 7

Synthesis of Polybenzoxazole Precursor (A-7: Polybenzoxazole Precursor) from 4,4'-Oxydiphthalic Acid and 2,2'-Bis(3-amino-4-hydroxyphenyl)hexafluoropropane In the same manner as in Synthesis Example 6 except that the addition amount of 2,2'-bis(3-amino-4-hydroxyphenyl)hexafluoropropane was changed to 31.32 g, a polybenzoxazole precursor was synthesized. This polybenzoxazole precursor had a weight-average molecular weight of 40,000, a number-average molecular weight of 18,180, and a dispersity of 2.2.

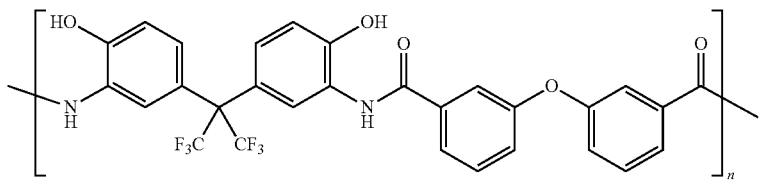

Examples 1 to 20 and Comparative Examples 1 to 4

<Composition of Photosensitive Resin Composition>

The following constitutive components were mixed to prepare a coating liquid of a photosensitive resin composition as a uniform solution.

(A) Heterocycle-containing polymer precursor: % by mass described in Table 6
(B) Polymerization initiator: % by mass described in Table 6
(C) Polymerizable compound: % by mass described in Table 6
(D) Additive: % by mass described in Table 6
(E) Solvent: % by mass described in Table 6

TABLE 6

|  | (A) Heterocycle-containing polymer precursor | | (B) | (C) | (D) | (E) |
|---|---|---|---|---|---|---|
|  | Precursor | Mw Dispersity | Polymerization initiator | Polymerizable compound | Additive | Solvent |
| Example 1 | A-1/A-2 20.0/20.0 | 25,000 2.9 | B-1 1 | C-1 5 | D-1 0.2 | E-1/E-2 43.8/10.0 |
| Example 2 | A-4 38 | 22,000 3.1 | B-2 2 | C-2 5 | D-2 0.3 | E-1 54.7 |
| Example 3 | A-1/A-3 20.0/20.0 | 23,500 2.5 | B-1 1 | C-3 5.5 | D-3 3 | E-1 50.5 |
| Example 4 | A-5 39 | 23,000 3 | B-1/B-3 1.0/1.0 | C-1 5 | D-6 0.2 | E-1/E-2 43.8/10.0 |
| Example 5 | A-6/A-7 16.0/16.0 | 28,000 3.1 | — | — | D-7 5 | E-3 63 |
| Example 6 | A-1/A-2 20.0/20.0 | 25,000 2.9 | B-1 1 | C-1 5 | D-4 0.2 | E-1/E-2 43.8/10.0 |
| Example 7 | A-4 38 | 22,000 3.1 | B-2 2 | C-2 5 | D-5 0.3 | E-1 54.7 |
| Example 8 | A-1/A-2 20.0/20.0 | 25,000 2.9 | B-2 1 | C-1 5 | D-1 0.2 | E-1/E-2 43.8/10.0 |
| Example 9 | A-1/A-2 20.0/20.0 | 25,000 2.9 | B-1 1 | C-3 5 | D-4 0.2 | E-1/E-2 43.8/10.0 |
| Example 10 | A-1/A-3 20.0/20.0 | 23,500 2.5 | B-3 1 | C-3 5.5 | D-3 3 | E-1 50.5 |
| Example 11 | A-1/A-3 20.0/20.0 | 23,500 2.5 | B-1 1 | C-3 5.5 | D-3 3 | E-1 50.5 |
| Example 12 | A-8/A-9 15.0/25.0 | 24,500 3 | B-1 1 | C-2 5.5 | D-4 2 | E-1/E-2 43.8/7.7 |
| Example 13 | A-10 38 | 21,000 2.8 | B-1 1 | C-2 5.5 | D-5 2 | E-1/E-2 43.8/9.7 |
| Example 14 | A-11/A-12 20.0/20.0 | 25,000 2.8 | B-4 1 | C-3 5 | D-3 3 | E-3 53 |
| Example 15 | A-13/A-14 20.0/20.0 | 22,000 2.8 | B-2 1 | C-1 6 | D-3 3 | E-1 50 |
| Example 16 | A-15 38 | 24,000 2.7 | B-2 1 | C-3 5.5 | D-3 1 | E-1 54.5 |

TABLE 6-continued

| | (A) Heterocycle-containing polymer precursor | | (B) | (C) | | |
|---|---|---|---|---|---|---|
| | Precursor | Mw Dispersity | Polymerization initiator | Polymerizable compound | (D) Additive | (E) Solvent |
| Example 17 | A-16/A-17 20.0/20.0 | 25,000 2.9 | B-1 1 | C-3 5.5 | D-3 3 | E-1 50.5 |
| Example 18 | A-18/A-19 20.0/20.0 | 28,000 3.1 | B-1 1 | C-2 5.5 | D-4 2 | E-1/E-2 43.8/7.7 |
| Example 19 | A-20 38 | 24,000 2.8 | B-1 1 | C-2 5.5 | D-5 2 | E-1/E-2 43.8/9.7 |
| Example 20 | A-21/A-22 20.0/20.0 | 25,000 3 | B-1 1 | C-2 5.5 | D-4 1 | E-1/E-2 43.8/10.7 |
| Comparative Example 1 | A-1 38 | 16,000 2.1 | B-1 1 | C-1 5 | D-1 0.2 | E-1/E-2 45.8/10.0 |
| Comparative Example 2 | A-2 38 | 38,500 2.3 | B-1 1 | C-1 5 | D-1 0.2 | E-1/E-2 45.8/10.0 |
| Comparative Example 3 | A-3 40 | 30,000 2.2 | B-2 1 | C-3 5 | D-3 3 | E-1 51 |
| Comparative Example 4 | A-7 32 | 40,000 2.2 | — | — | D-7 5 | E-3 63 |

In the above table, in the section of "Precursor" under (A) Heterocycle-containing polymer precursor, the type and the blend amount (% by mass) of the compound of the precursor are shown in the upper part and the lower part, respectively. For example, with regard to Example 1, it is shown that 20% by mass of A-1 and 20% by mass of A-2 are included as the heterocycle-containing polymer precursors. In the sections of "Mw" and "Dispersity" under (A) Heterocycle-containing polymer precursor, Mw of the heterocycle-containing polymer precursor and the dispersity of the heterocycle-containing polymer precursor are shown in the upper part and the lower part, respectively (in an example where precursors are mixed, the dispersity and Mw of the mixed precursor composition are shown. For example, with regard to Example 1, the dispersity and Mw of the precursor composition in which A-1 and A-2 are mixed at the amount ratio described in the table are shown).

In the sections of (B) Polymerization initiator, (C) Polymerizable compound, (D) Additive, and (E) Solvent, the type and the blend amount (% by mass) of the compound used are shown in the upper part and the lower part, respectively. The compounds of (B) Polymerization initiator, (C) Polymerizable compound, (D) Additive, and (E) Solvent are as follows.

(A) Heterocycle-Containing Polymer Precursor

A-1 to A-7: A-1 to A-7 produced in Synthesis Examples 1 to 7

A-8 to A-10: Heterocycle-containing polymer precursors (polyimide precursors) with the following structures

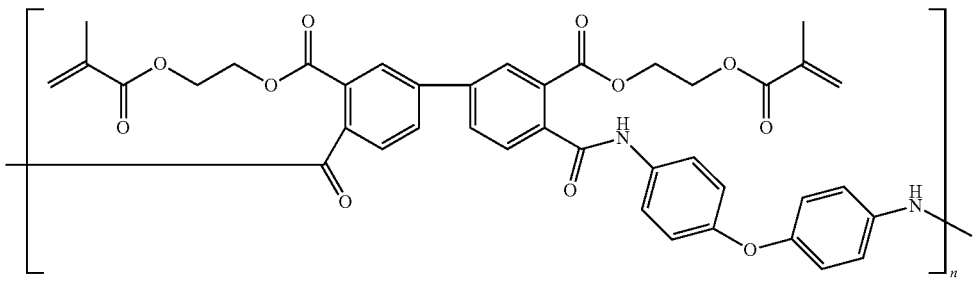

A-8
Mw: 15000
Dispersity: 2.0
A-9
Mw: 40000
Dispersity: 2.1
A-10
Mw: 21000
Dispersity: 2.8

A-11 and A-12: Heterocycle-containing polymer precursors (polyimide precursors) with the following structures

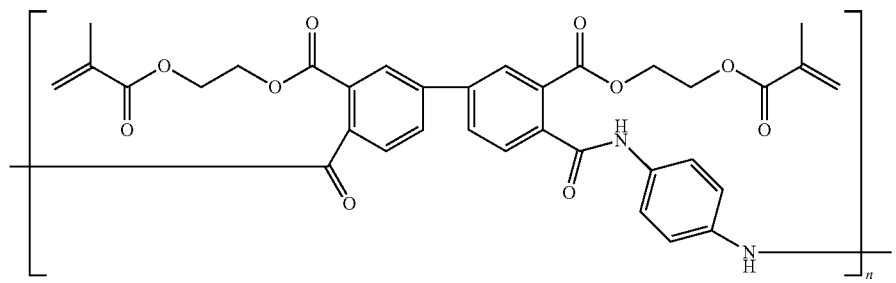

A-11
Mw: 15000
Dispersity: 2.2
A-12
Mw: 35000
Dispersity: 2.1

A-13 and A-14: Heterocycle-containing polymer precursors (polyimide precursors) with the following structures

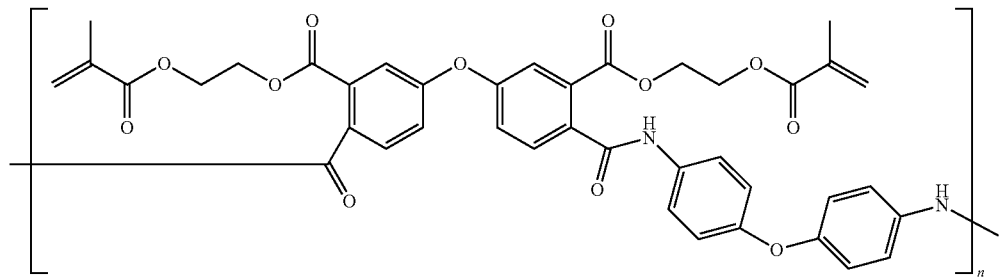

A-13
Mw: 17000
Dispersity: 2.0
A-14
Mw: 28000
Dispersity: 2.1

A-15: Heterocycle-containing polymer precursor (polyimide precursor) with the following structure

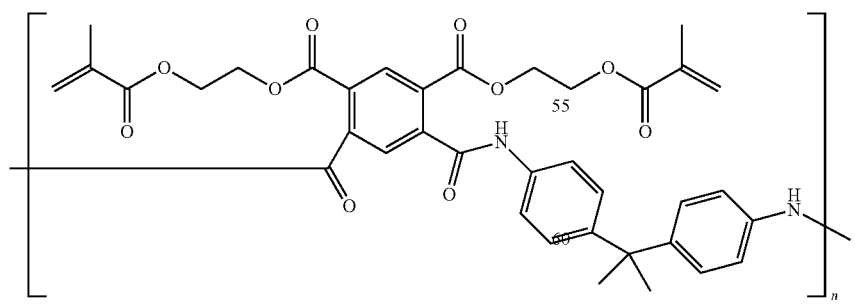

A-15
Mw: 24000
Dispersity: 2.6

A-16 and A-17: Heterocycle-containing polymer precursors (polyimide precursors) with the following structures

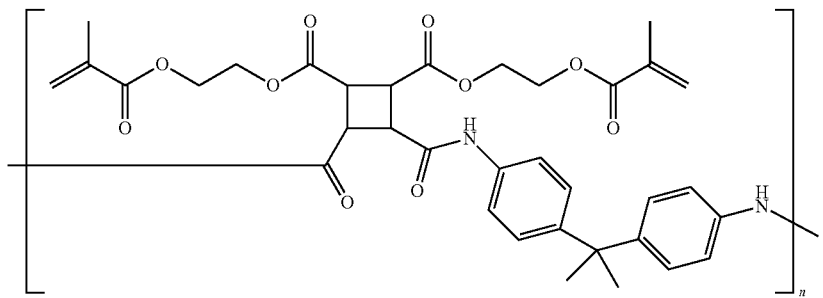

A-16
Mw: 20000
Dispersity: 2.0
A-17
Mw: 30000
Dispersity: 2.2

A-18, A-19, and A-20: Heterocycle-containing polymer precursors (polyimide precursors) with the following structures

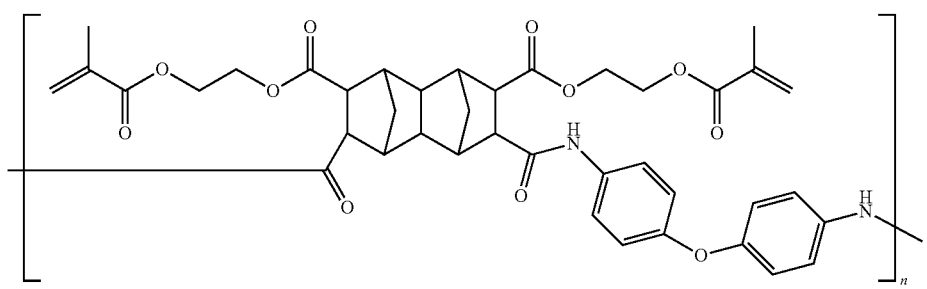

A-18
Mw: 17000
Dispersity: 2.1
A-19
Mw: 30000
Dispersity: 2.2
A-20
Mw: 24000
Dispersity: 2.8

A-21 and A-22: Heterocycle-containing polymer precursors (polyimide precursors) with the following structures

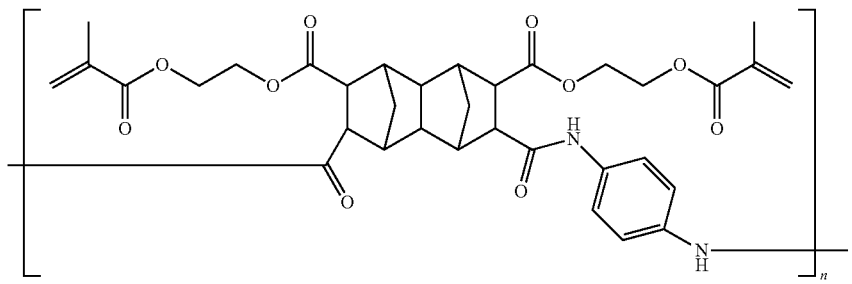

A-21
Mw: 19000
Dispersity: 2.2
A-22
Mw: 30000
Dispersity: 2.2

(B) Polymerization Initiator

B-1: IRGACURE-OXE01 (manufactured by BASF Corp.)

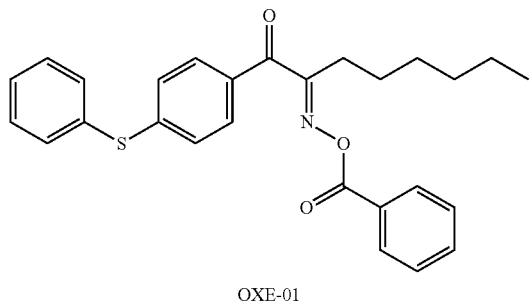 [SMILES: CCCCCC/C(=N\OC(=O)c1ccccc1)C(=O)c1ccc(Sc2ccccc2)cc1]

OXE-01

B-2: Compound 24 described in paragraph No. 0345 of JP2014-500852A

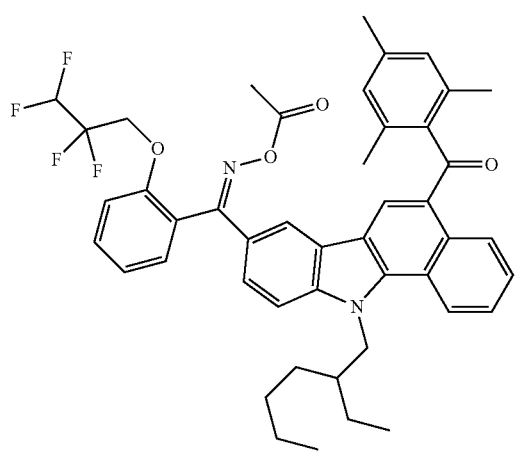

24

B-3: PERBUTYL Z (manufactured by Nippon Oil & Fats Co., Ltd., tert-butylperoxybenzoate, decomposition temperature (10 hour half-life period temperature=104° C.))

B-4: IRGACURE-784 (manufactured by BASF, metallocene compound)

(C) Polymerizable Compound

C-1: NK Ester M-40G (manufactured by Shin-Nakamura Chemical Co., Ltd., monofunctional methacrylate, the following structure)

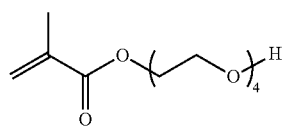

C-2: NK Ester 4G (manufactured by Shin-Nakamura Chemical Co., Ltd., bifunctional methacrylate, the following structure)

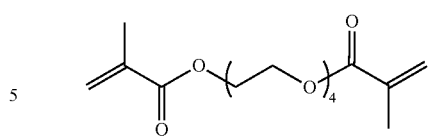

C-3: NK Ester A-9300 (manufactured by Shin-Nakamura Chemical Co., Ltd., trifunctional acrylate, the following structure)

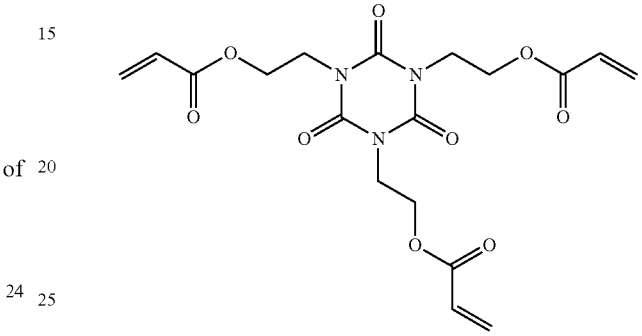

(D) Additive

D-1: Corrosion inhibitor, 1H-tetrazole

D-2: Corrosion inhibitor, 1,2,4-triazole

D-3: Thermal base generator, the following compound, base generation temperature 150° C., anion pKa 4.2

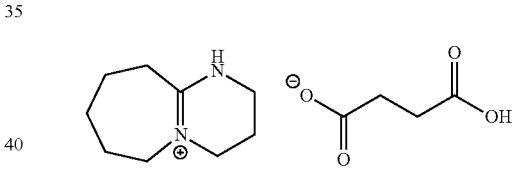

D-4: Thermal base generator, the following compound, base generation temperature 150° C., anion pKa 1.9

(A-40)

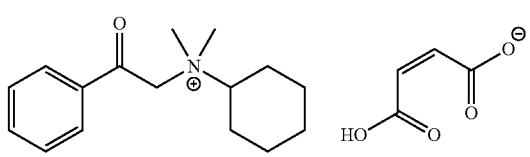

D-5: Thermal base generator, the following compound, base generation temperature 150° C., anion pKa 1.9

(A-39)

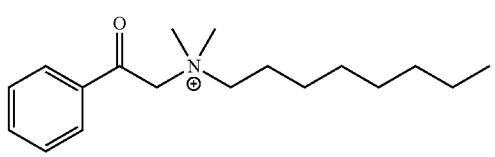

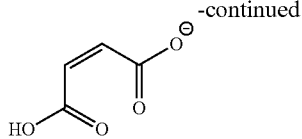

D-6: Polymerization inhibitor, 1,4-benzoquinone
D-7: Photoacid generator, the following compound

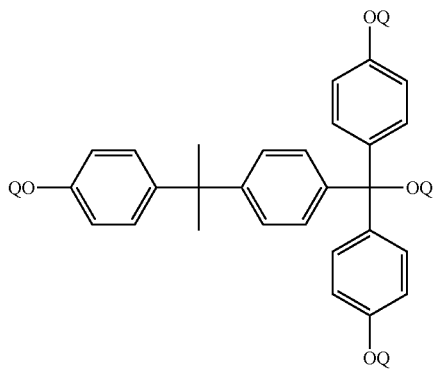

Q is a hydrogen atom or

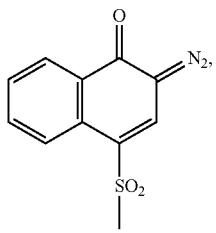

and hydrogen atoms account for 5% of all the Q's.

(E) Solvent
E-1: γ-Butyrolactone
E-2: Dimethyl sulfoxide
E-3: N-Methyl-2-pyrrolidone <Formation of Photosensitive Resin Composition Layer>

Each of the photosensitive resin compositions was pressurization-filtered through a filter having a width of a pore of 0.8 μm, and then applied onto a silicon wafer by spinning (3,500 rpm, 30 seconds). The silicon wafer having the photosensitive resin composition applied thereonto was dried on a hot plate at 100° C. for 5 minutes to form a uniform photosensitive resin composition layer having a thickness of 16 μm on the silicon wafer.

<Evaluation>
[Exposure]

The photosensitive resin composition layer on the silicon wafer was exposed using a stepper (Nikon NSR 2005 i9C). Exposure was carried out with an i-line, and the exposure was carried out using a line-and-space photomask with a 1-μm unit, ranging 5 μm to 25 μm, with each exposure energy of 200, 300, 400, 500, 600, 700, or 800 mJ/cm$^2$ at a wavelength of 365 nm.

Exposure Latitude (Negative Tone Development)
(Examples 1 to 4, and 6 to 20, and Comparative Examples 1 to 3)

The exposed photosensitive resin composition layer was developed with cyclopentanone for 60 seconds. The line width of the photosensitive resin composition layer which could have good sharpness of an edge was evaluated in accordance with the following standard. A smaller line width indicates an increased difference in the solubility of areas irradiated with light vs. areas not irradiated with light in a developer, leading to preferable results. In addition, a smaller change in the line width with respect to a change in the exposure energy indicates a wide range of proper exposure doses, that is, a wide exposure latitude, leading to preferable results. The results are shown in Table 7.
A: More than 5 μm and 8 μm or less
B: More than 8 μm and 10 μm or less
C: More than 10 μm and 15 μm or less
D: More than 15 μm and 20 μm or less
E: More than 20 μm.

Exposure Latitude (Positive Tone Development)
(Example 5 and Comparative Example 4)

The exposed photosensitive resin composition layer was developed with a 0.262 N aqueous tetramethylammonium hydroxide (TMAH) solution for 75 seconds. The line width of the photosensitive resin composition layer which could have good sharpness of an edge was evaluated in accordance with the following standard. A smaller line width indicates an increased difference in the solubility of areas irradiated with light vs. areas not irradiated with light in a developer, leading to preferable results. In addition, a smaller change in the line width with respect to a change in the exposure energy indicates a wide range of proper exposure doses, that is, a wide exposure latitude, leading to preferable results. The results are shown in Table 7.
A: More than 5 μm and 8 μm or less
B: More than 8 μm and 10 μm or less
C: More than 10 μm and 15 μm or less
D: More than 15 μm and 20 μm or less
E: More than 20 μm.

TABLE 7

| | Development mode | Exposure latitude | | | | | | |
|---|---|---|---|---|---|---|---|---|
| | | 200 | 300 | 400 | 500 | 600 | 700 | 800 |
| Example 1 | Negative tone | A | A | A | A | A | A | A |
| Example 2 | Negative tone | A | A | A | A | B | B | B |
| Example 3 | Negative tone | A | A | A | A | A | B | B |
| Example 4 | Negative tone | A | A | A | B | B | B | B |
| Example 5 | Positive tone | B | B | B | B | A | A | A |
| Example 6 | Negative tone | A | A | A | A | A | A | A |
| Example 7 | Negative tone | A | A | A | A | B | B | B |

TABLE 7-continued

| | Development mode | Exposure latitude | | | | | | |
|---|---|---|---|---|---|---|---|---|
| | | 200 | 300 | 400 | 500 | 600 | 700 | 800 |
| Example 8 | Negative tone | A | A | A | A | A | A | A |
| Example 9 | Negative tone | A | A | A | A | A | A | A |
| Example 10 | Negative tone | A | A | A | A | A | B | B |
| Example 11 | Negative tone | A | A | A | A | A | B | B |
| Example 12 | Negative tone | A | A | A | A | A | A | A |
| Example 13 | Negative tone | A | A | A | A | B | B | B |
| Example 14 | Negative tone | A | A | A | A | A | B | B |
| Example 15 | Negative tone | A | A | A | A | A | A | B |
| Example 16 | Negative tone | A | A | A | B | B | B | B |
| Example 17 | Negative tone | A | A | A | A | A | A | B |
| Example 18 | Negative tone | A | A | A | A | A | A | B |
| Example 19 | Negative tone | A | A | A | A | B | B | B |
| Example 20 | Negative tone | A | A | A | A | A | B | B |
| Comparative Example 1 | Negative tone | Image flow | Image flow | A | A | A | A | B |
| Comparative Example 2 | Negative tone | B | B | C | D | E | Poor development | Poor development |
| Comparative Example 3 | Negative tone | A | A | A | B | C | D | Poor development |
| Comparative Example 4 | Positive tone | Poor development | Poor development | D | D | C | B | B |

The numerical values of 200, 300, 400, 500, 600, 700, and 800 in the table are each exposure energy used for the exposure in a unit of mJ/cm².

From the results, the photosensitive resin compositions using the precursor compositions of Examples had wide exposure latitudes. Meanwhile, the photosensitive resin compositions using the precursor compositions of Comparative Examples 1 to 4 had narrow exposure latitudes.

Example 100

The photosensitive resin composition of Example 1 was pressurization-filtered through a filter having a width of a pore of 0.8 μm, and then applied onto a resin substrate having a copper thin film formed thereon by spinning (3,500 rpm, 30 seconds). The photosensitive resin composition applied onto the resin substrate was dried at 100° C. for 5 minutes and then exposed using an aligner (Karl-Suss MA150). Exposure was carried out with a high-pressure mercury lamp and the exposure energy at a wavelength 365 nm was measured. After exposure, the image was developed with cyclopentanone for 75 seconds.

Then, heating was carried out at 180° C. for 20 minutes. In this manner, an interlayer insulating film for a re-wiring layer was formed.

This interlayer insulating film for a re-wiring layer had excellent insulating properties.

Furthermore, a semiconductor device was produced using the interlayer insulating film for a re-wiring layer, and it was thus found that the semiconductor device was operated without problems.

REFERENCE SIGNS LIST

100: semiconductor device
101a to 101d: semiconductor elements
101: laminate
102b to 102d: through-electrodes
103a to 103e: metal bumps
105: re-wiring layer
110, 110a, 110b: underfill layers
115: insulating layer
120: wiring board
120a: surface electrode

What is claimed is:

1. A photosensitive resin composition comprising:
at least one kind of heterocycle-containing polymer precursor, and
a photoradical polymerization initiator,
wherein the heterocycle-containing polymer precursor is selected from a polyimide precursor and a polybenzoxazole precursor, and
the dispersity, which is a weight-average molecular weight/a number-average molecular weight of the heterocycle-containing polymer precursor, is from 2.5 to 3.1, wherein the heterocycle-containing polymer precursor has a polymerizable unsaturated group.

2. The photosensitive resin composition according to claim 1,
wherein the dispersity is from 2.8 to 3.1.

3. The photosensitive resin composition according to claim 1,
wherein two or more kinds of heterocycle-containing polymer precursors having a difference in at least one of the weight-average molecular weight or a constituting repeating unit are included as the heterocycle-containing polymer precursor.

4. The photosensitive resin composition according to claim 1,
wherein the at least one kind of heterocycle-containing polymer precursor is a precursor having a repeating unit represented by General Formula (1-1),

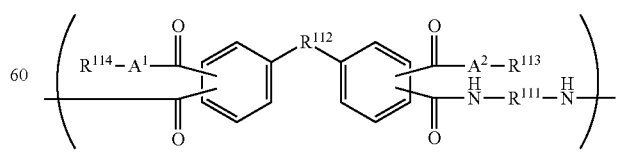

in General Formula (1-1), $A^1$ and $A^2$ each independently represent an oxygen atom or NH, $R^{111}$ represents a divalent organic group, $R^{112}$ represents a single bond or a divalent group, and $R^{113}$ and $R^{114}$ each independently represent a hydrogen atom or a monovalent organic group.

5. The photosensitive resin composition according to claim 4, wherein at least one of $A^1$ or $A^2$ is an oxygen atom.

6. The photosensitive resin composition according to claim 4, wherein $R^{112}$ is a single bond, or a group selected from a hydrocarbon group having 1 to 10 carbon atoms, which may be substituted with a fluorine atom, —O—, —C(=O)—, —S—, —SO$_2$—, —NHCO—, and a combination thereof.

7. The photosensitive resin composition:

according to claim 1, further comprising a photoacid generator.

8. The photosensitive resin composition according to claim 1, further comprising:

a curable compound.

9. The photosensitive resin composition according to claim 8, wherein the curable compound includes a compound having an ethylenically unsaturated bond.

10. The photosensitive resin composition according to claim 8, wherein the curable compound is a compound having two or more ethylenically unsaturated groups.

11. The photosensitive resin composition according to claim 1, which is used for forming an interlayer insulating film for a re-wiring layer.

12. A method for producing the precursor composition according to claim 1, comprising:

using two or more kinds of heterocycle-containing polymer precursors having different weight-average molecular weights as the heterocycle-containing polymer precursor, wherein the heterocycle-containing polymer precursor is selected from a polyimide precursor and a polybenzoxazole precursor.

13. A cured film formed by curing the precursor composition according to claim 1.

14. The cured film according to claim 13, which is an interlayer insulating film for a re-wiring layer.

15. A method for producing a cured film, comprising:

using the precursor composition according to claim 1.

16. The method for producing a cured film according to claim 15, comprising:

applying the precursor composition or the photosensitive resin composition onto a substrate; and curing the precursor composition or the photosensitive resin composition applied onto the substrate.

17. A semiconductor device comprising:

the cured film according to claim 13.

* * * * *